(12) United States Patent
Atature et al.

(10) Patent No.: US 10,700,238 B2
(45) Date of Patent: Jun. 30, 2020

(54) SCALABLE QUANTUM-CONFINED DEVICE

(71) Applicant: Cambridge Enterprise Limited, Cambridge, Cambridgeshire (GB)

(72) Inventors: Mete Atature, Cambridge (GB); Dhiren Kara, Cambridge (GB); Carmen Palacios Berraquero, Cambridge (GB)

(73) Assignee: Cambridge Enterprise Limited, Cambridge (GB)

(*) Notice: Subject to any disclaimer, the term of this patent is extended or adjusted under 35 U.S.C. 154(b) by 0 days.

(21) Appl. No.: 16/318,269

(22) PCT Filed: Jul. 18, 2017

(86) PCT No.: PCT/GB2017/052110
§ 371 (c)(1),
(2) Date: Jan. 16, 2019

(87) PCT Pub. No.: WO2018/015738
PCT Pub. Date: Jan. 25, 2018

(65) Prior Publication Data
US 2019/0288160 A1    Sep. 19, 2019

(30) Foreign Application Priority Data

Jul. 18, 2017 (GB) ..................... 1612419

(51) Int. Cl.
*H01L 33/06* (2010.01)
*H01L 27/15* (2006.01)
(Continued)

(52) U.S. Cl.
CPC ............ *H01L 33/06* (2013.01); *H01L 27/156* (2013.01); *H01L 33/0075* (2013.01);
(Continued)

(58) Field of Classification Search
None
See application file for complete search history.

(56) References Cited

U.S. PATENT DOCUMENTS 5,844,930 A    12/1998  Gershoni et al.
7,618,905 B1   11/2009  Eyink et al.
(Continued)

FOREIGN PATENT DOCUMENTS

GB         2 386 470 A      9/2003

OTHER PUBLICATIONS

Jun. 24, 2010—Bonaccorso, F. Sun, Z. Hasan, T. & Ferrari, A C. Graphene photonic and optoelectronics. Nat. Photonics 4, 611-622.
(Continued)

*Primary Examiner* — Steven B Gauthier
(74) *Attorney, Agent, or Firm* — Banner & Witcoff, Ltd.

(57) ABSTRACT

A quantum-confined device (100) and method for manufacture thereof. The device (100) comprises a substrate (10) having at least one protrusion (12) and a layer of a two-dimensional material (14) arranged thereupon. The layer of the two-dimensional material (14) is arranged on the substrate (10) and the at least one protrusion (12), the at least one protrusion (12) causing localised strain in the layer of the two-dimensional material (14) to form a quantum dot or a quantum wire at the region of localised strain.

20 Claims, 24 Drawing Sheets

(51) Int. Cl.
*H01L 33/00* (2010.01)
*H01L 33/24* (2010.01)
*H01L 33/32* (2010.01)
*C04B 35/583* (2006.01)

(52) U.S. Cl.
CPC .............. *H01L 33/24* (2013.01); *H01L 33/32* (2013.01); *C04B 35/583* (2013.01)

(56) References Cited

U.S. PATENT DOCUMENTS

| | | | |
|---|---|---|---|
| 2009/0321781 | A1 | 12/2009 | Broadley et al. |
| 2013/0214251 | A1* | 8/2013 | Balkenende ........ H01L 21/0237 257/13 |
| 2015/0118143 | A1 | 4/2015 | Jeon et al. |
| 2015/0364545 | A1 | 12/2015 | Heo et al. |

OTHER PUBLICATIONS

Oct. 2014—Koppens F. H. L. et al. Photodetector based on graphene other two-dimensional materials and hybrid systems. Nat. Nanotechnol. 9, 780-793.
Sep. 22, 2014—Ferrari, AC. Science and technology roadmap for graphene, related two-dimensional crystal5, and hybrid system5. Nanoscale 4598-4810.
2014—Xia, F., Wang, H., Xiao, D., Dubey M. & Ramasubramaniam, A. Two-dimensional material nanophotonics. Nat. Photonics 8, 899-907.
Mar. 10, 2015—Tonndorf, P. et al. Single-photon emission from localized excitons in an atomically thin semiconductor. Optica 2, 347.
2015—Srivastava A et al. Optically active quantum dots in monolayer WSe2. Nat. Nanotechnol. 10, 491-496.
2015—He, Y.M. et al. Single quantum emitters in monolayer semiconductors. Nat. Nanotechnol. 10, 497-502.
2015—Koperski, M. et al. Single photon emitters in exfoliated WSe2 structures. Nat. Nanotechnol. 10, 503-506.
Apr. 24, 2015—Tran. T. T. Bray K Ford, M J Toth, M. & Aharonovich, I. Quantum emission from hexagonal boron nitride monolayers. Nat. Nanotechnol. 11 37-41.
Apr. 24, 2015—Majumdar A et al. Hybrid D Material Nanophotonics: A Scalable Platform for Low-Power Nonlinear and Quantum Optic . ACS Photonics. 2, 116-1166.
Jun. 6, 2012—Cao T. et al. Valley-selective circular dichroism of monolayer molybdenum disulphide. Nat. Commun. 3, 887.
2012—Zeng H. Dai J. Yao, W., Xiao D. & Cui, X. Valley polarization in MoS2 monolayers by optical pumping. Nat. Nanotechnol. 490-493.
2012—Mak, K. F. He, K. Shan J. & Heinz T. F. Control of valley polarization in monolayer MoS2 by optical helicity. Nat. Nanotechnol. 7, 494-498.
Mar. 11, 2014—Kormanyos, A. Zolyomi V. Drummond, N. D. & Burkard, G. Spin-orbit coupling quannun dots, and qubits in monolayer transition metal dichalcogenides. Phys. Rev. X 4, 1-16.
Oct. 19, 2015—Kumar S., Kaczmarczyk, A & Gerardot B. D. Strain-Induced Spatial and Spectral Isolation of Quantum Emitters in Mono- and Bilayer WSe2. Nano Lett. 15, 7567-7573.
2016—Branny, A et al. Discrete quantum dot like emitters in monolayer MoSe2: Spatial mapping, magneto-optics, and charge tuning. Appl. Phys. Lett. 108 142101.
Sep. 26, 2016—Palacio-Berraquero, C. et al. Atomically thin quantum light-emitting diodes. Nat. Commun. 7, 12978 doi: 10.1038/ncomms I 978 (2016).

Jul. 26, 2005—Novoselov, K. S. et al. Two-dimensional atomic crystals. Proc. Natl. Acad. Sci. U.S.A. 102, 10451-3 (2005).
2012—Bonaccorso F. et al. Production and processing of graphene and 2d crystals. Mater. Today. 15 564-589.
May 18, 2007—Casiraghi, C. et al. Rayleigh imaging of graphene and graphene layer. Nano Lett. 7, 2711-2717.
2014—Castellano-Gomez A et al. Deterministic transfer of two-dimensional materials by all dry viscoelastic stamping. 2D Mater. 1, 011002.
Feb. 27, 2014—Terrones, H. et al. New first order Raman-active modes in few layered transition metal dichalcogenides. Sci. Rep. 4, 4215.
2013—Zhao W. et al. Lattice dynamic in mono- and few-layer sheets of WS2 and WSe2. Nanoscale 5, 9677-83.
2013—Zhou B. et al. Evolution of electronic structure in Atomically Thin Sheets of WS2 and WSe2. ACS Nano 7, 791-797.
Aug. 3, 2016—Kumar, S. et al. Resonant layer spectroscopy of localized excitons in monolayer WSe2. Optica 3, 882.
Feb. 24, 2014—Wang, G. et al. Valley dynamic probed through charged and neutral exciton emission in monolayer WSe2. Phys. Rev. B 90.
Apr. 30, 2015—Kang K. et al. High-mobility three-atom-thick semiconducting films with wafer-scale homogeneity. Nature 520, 656-660.
2016—Ling. X et al. Parallel Stitching of 2D Materials. Adv. Mater. 28, 23-2329.
Jul. 1, 2009—Grigorescu A. E. et al. Resists for sub-20-nm electron beam lithography with a focus on HSQ: state of the art. Nanotechnology 20, 292001 (2009).
Dec. 5, 2013—Zhao W. etal. Lattice dynamic in mono- and few-layer sheets of WS2 and WSe2. Nanoscale 5, 9677-83.
2013—Zhou B. et al. Evolution of electronic structure in Atomically Thin Sheets of WS2 and We2. ACS Nano 7, 791-797.
2013—Jones, A. M. et al. Optical generation of excitonic valley coherence in monolayer WSe2. Nat. Nanotechnol. 8, 634-638.
2013—Zhang, X. et al. Raman spectroscopy of shear and layer breathing modes in multilayer MoS 2. Phys. Rev. B 87, 115413.
2015—Wu, J.-B. et al. Interface Coupling in Twisted Multilayer Graphene by Resonant Raman Spectroscopy of Layer Breathing Modes. ACS Nano 9>,7440-7449.
Sep. 26, 2016—Palacios-Berraquero, C. et al. Atomically thin quantum light-emitting diodes. Nat. Commun. 7, 12978 doi: 10.1038/ncomms12978.
Oct. 17, 2017—PCT/GB2017/052110—ISR & WO.
Nov. 30, 2016—GB1612419.0—Search Report.
Apr. 17, 2007—"Optical properties of a wrinkled nanomembrane with embedded quantum well" Y Mei et al, Nano Letters, vol. 7, No. 6, pp. 1676-1679.
Apr. 4, 2016—"Discrete quantum dot like emitters in monolayer MoSe2: spatial mapping, magneto-optics, and charge tuning" A Branny et al, APL, 108, 142101.
May 4, 2015. Chakraborty, C. et al. Voltage-controlled quantum light from an atomically thin semiconductor. Nature Nanotechnology. vol. 10, 507-512.
2016. Kern, J. et al. Nanoscale Positioning of Single-Photon Emitters in Atomically Thin WSe2. Advanced Materials. vol. 28, 7101-7105.
Dec. 11, 2007. Holzwarth, C. W. et al. Optimization of hydrogen silsesquioxane for photonic applications. Journal of Vacuum Science & Technology B: Microelectronics and Nanometer Structures Processing, Measurement, and Phenomena. vol. 25, 2658-2661.
Aug. 14, 1989. Kash, K. et al. "Strain-induced confinement of carriers to quantum wires and dots within an InGaAs—InP quantum well", Applied Physics Letters, AIP Publishing LLC, vol. 55, No. 7, 681-683.

* cited by examiner

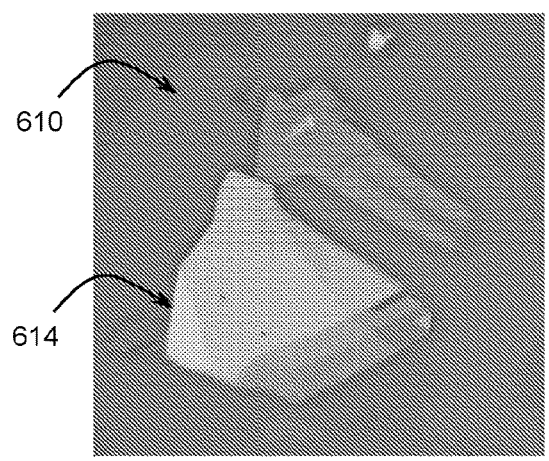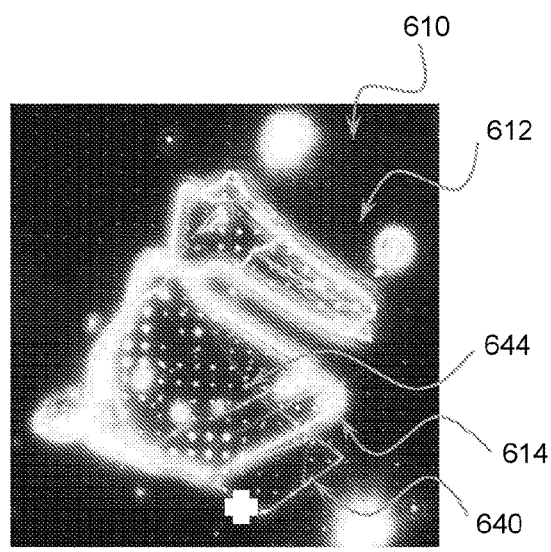
FIG. 6A  FIG. 6B
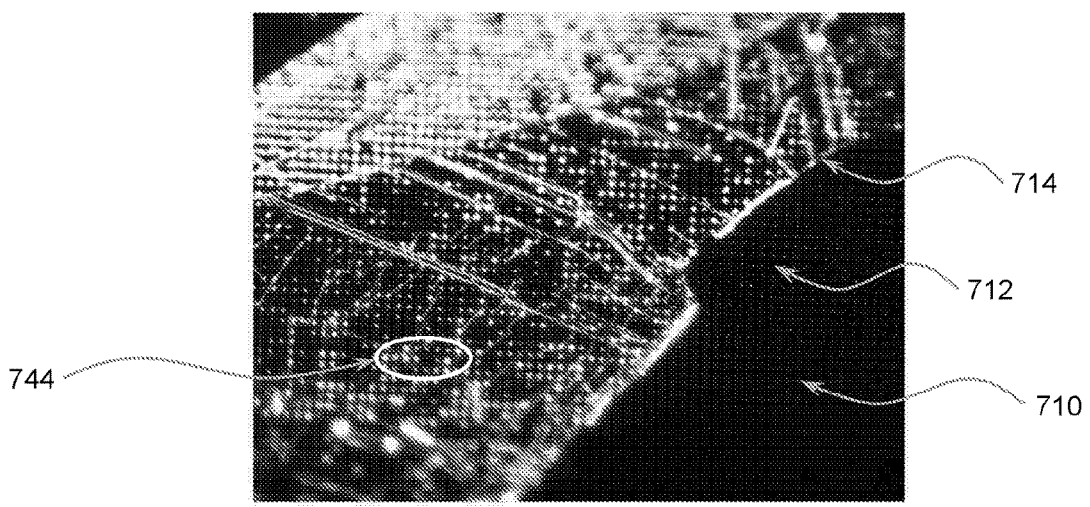
FIG. 7

KEY (FIG. 20d)
◌ = Blue circle
◠ = Pink circle
⌐ ⌐ = Green box

KEY (FIG. 21b and 21c)

/ = Pink line / Pink rectangle
/ = Green line / Green rectangle
/ = Blue line / Blue rectangle

SCALABLE QUANTUM-CONFINED DEVICE

STATEMENT REGARDING FEDERALLY SPONSORED RESEARCH OR DEVELOPMENT

The project leading to this application has received funding from the European Union Seventh Framework Programme under grant agreement 617985.

FIELD OF THE INVENTION

The invention relates to a quantum confined device and its method of manufacture. In particular, the device is a quantum dot device or a quantum wire device. The described quantum dot device may act as an emitter or single photon source. The position of the quantum dot or quantum wire in the device can be precisely determined and can be reliably fabricated within large scale arrays.

BACKGROUND TO THE INVENTION

Quantum confined or low-dimensional devices such as quantum dots and quantum wires are becoming increasingly important for use in potential applications in various fields. Whereas quantum dots provide quantum confinement of electrons and/or holes in all three spatial dimensions, quantum wires provide quantum confinement of electrons and/or holes in two spatial dimensions but allow electron transport in the third dimension. The unusual quantum properties exhibited by quantum dots and quantum wires make them useful candidates for incorporation into many future technologies. For instance, quantum dots may be used for many applications including light emitters and especially single photon sources. Single photon sources are expected to form an integral part of a plethora of future applications including quantum cryptography and quantum computing technologies. Quantum wires have been conjectured for use in numerous applications including transistors, integrated circuitry and charge sensing as well as quantum computing.

A number of mechanisms have been shown to produce optically active quantum dots with properties similar to natural atoms or trapped ions. Examples include self-assembled quantum dots formed by growth of epitaxial layers having a mismatched lattice constant, or atomistic defects in silicon carbide or diamond. Similarly, different techniques exist for forming quantum wires including use of naturally occurring crystals such as zinc oxide. However, each of these mechanisms face similar challenges when looking to incorporate quantum dots or quantum wires into devices for specific applications.

First, scalability remains a problem for large-scale manufacture of devices. In particular, the low yield for formation of quantum dots and quantum wires using many known techniques means that manufacturing devices on a large-scale, especially using diamond, is not yet practical. Furthermore, the position of a quantum dot or quantum wire on a substrate cannot be easily pre-determined or designed using most established methods of formation. Such a requirement will be necessary for feasible large-scale manufacturing of integrated circuits including quantum dots and quantum wires. In view of this, there is a need for quantum-confined devices such as quantum dot or quantum wire devices that can be produced on a large scale whilst offering deterministic positioning of the quantum dots or quantum wires on a substrate of choice. Moreover, for use of quantum dots devices as a single photon source, the quantum dots produced must also offer competitive spectral characteristics such as good uniformity and brightness.

The unique crystalline structure of layered two-dimensional (or two-dimensional layered) materials such as graphene and tungsten diselenide ($WSe_2$) offer exciting new opportunities for quantum technologies. Two-dimensional materials exhibit a number of unusual properties compared to traditional three-dimensional semiconductor materials such as silicon (Si) or Gallium Arsenide (GaAs). In a two-dimensional material, atoms form in monolayers that are chemically bonded within the plane of the monolayer or sheet, but in which the layers are held together only through van der Waals forces. Each monolayer is naturally passivated without any dangling chemical bonds, and so no chemical bonds are formed between monolayers. Importantly, electrons, holes and many-body complexes are confined within the plane of each single monolayer and so provide an inherently two-dimensionally confined system. Quantum confinement of electrons in the two-dimensional plane leads to novel and unusual electronic and optical properties that are distinctively different from three-dimensional materials. Techniques for separation of one or a few monolayers of two-dimensional materials have been developed in recent years, thereby allowing researchers to study and develop devices in the two-dimensionally confined systems offered by layered materials. Further discussion of two-dimensional materials for nanophotonics technologies can be found in "Two-dimensional material nanophotonics" by Xia et al., Nature Photonics, 2014, vol. 8, pg. 899-907.

Naturally occurring quantum dots have been observed in layered materials such as tungsten diselenide ($WSe_2$). Such quantum dots have been recorded particularly at the edge portions of the monolayers. Some reports have attributed quantum dot formation to crystal imperfections at the edge regions, while others claim they might be generated by atomic defects. Nevertheless, these naturally occurring quantum dots have not been reliably generated, or predictably positioned, which means than incorporating such dots into devices on a larger scale would be unworkable.

Therefore, there is a requirement for a quantum-confined device (such as a quantum dot device or quantum wire device) and its method of manufacture that is feasible on a large scale, robust and that offers deterministic placement of the quantum dots or quantum wires on a substrate. Furthermore, the generated quantum dots must have high quality optical and electrical properties.

SUMMARY OF THE INVENTION

In a first aspect, there is a quantum-confined device comprising a substrate having at least one protrusion arranged thereupon, and a layer of a two-dimensional material. The layer of the two-dimensional material is arranged on the substrate and the at least one protrusion, wherein the at least one protrusion causes localised strain in the layer of the two-dimensional material to form a quantum wire or a quantum dot. More specifically, the localised strain causes a local modification of the bandstructure of the two-dimensional material which results in quantum confinement of electrons and/or holes.

Providing sufficient strain is generated, the shape of the protrusion and consequently the shape of the region of localised strain determine whether a quantum dot or a quantum wire is formed. In particular, where the protrusion is a nanoscale pillar, pyramid or cone, the localised strain causes a quantum dot. Where the at least one protrusion is a nanoscale ridge, the localised region of strain extends along the ridge and forms a quantum wire. In general, the protrusions are nanoscale.

A quantum-confined device is a device having a band-structure in which electrons and/or holes are confined in at least one dimension. In a particular example, electrons and/or holes are defined in all three spatial dimensions, forming a quantum dot. In a further example, electrons and/or holes are confined in two of the three spatial dimensions, forming a quantum wire. Confinement of electrons and/or holes results in quantum behaviour being observed in the quantum-confined devices.

In a particular example, there is a quantum dot device comprising a substrate having at least one protrusion arranged thereupon. A layer of a two-dimensional material is arranged on the substrate and on the at least one protrusion such that the at least one protrusion causes localised strain in the layer of the two-dimensional material. The regions of localised strain in the region of the at least one protrusion form a quantum dot.

In a different example, there is a quantum wire device comprising a substrate having at least one protrusion arranged thereupon. The protrusion may be at least one ridge or corrugation. In this example, a layer of a two-dimensional material is arranged on the substrate and on the at least one protrusion or ridge, such that the at least one protrusion or ridge causes localised strain in the layer of the two-dimensional material in the region of the at least one protrusion or ridge. The regions of localised strain extending locally around the at least one protrusion or ridge may form a quantum wire.

The substrate of the quantum-confined device of either example may be formed of any material, thereby providing high flexibility for manufacturing. However, advantageously materials commonly used in semiconductor processing such as silicon or gallium arsenide may allow the use of well-known semiconductor fabrication and processing techniques during manufacture of the device.

The at least one protrusion may be at least one projection, protuberance or prominence arranged on or formed in the surface of the substrate. Ideally, the protrusion is arranged upon and surrounded by a relatively smooth, flat surface.

As discussed above, two-dimensional materials (otherwise known as two-dimensional topological materials, or layered materials, or two-dimensional layered materials) are a class of materials wherein atoms are strongly bonded within the same plane or atomic sheet, but atomic sheets are only weakly attached above and below by van der Waals forces. The bulk form of a two-dimensional material is composed of a number of monolayers or atomic sheets, wherein the atomic structure of each layer or sheet is naturally passivated without any dangling chemical bonds formed between layers. As a result of the weak interlayer interaction, two-dimensional materials can be prepared having only a few atomic layers or a single monolayer of the material. Moreover, electrons in the two-dimensional material experience quantum confinement in the two-dimensional plane of each atomic layer. In the described quantum dot device, the layer of the two-dimensional material may be a single monolayer of the two-dimensional material or could describe a layer comprising two or more monolayers of the two-dimensional material. Alternatively, the layer of two-dimensional material may be a heterostructure comprising one or a few monolayers of two or more layered materials. Two-dimensional materials are distinct from quasi two-dimensional systems such as a two-dimensional electron gas, 2DEG, formed using thin layers of material having an inherently three-dimensional crystal lattice structure (for instance, within a heterostructure).

Any type of two-dimensional material can be used within the described quantum dot or quantum wire device. Graphene is perhaps the best known two-dimensional material. Other examples of two-dimensional semiconductor materials include molybdenum disulphide ($MoS_2$), tungsten diselenide ($WSe_2$) and tungsten disulphide ($WS_2$). The direct band-gap offered by these two materials results in promising light-emitting properties. Other examples of two-dimensional material include graphyne, borophene, germanene, silicene, stanene, phosphorene, molybdenite, palladium, rhodium, graphene, boron nitride, germanane, a transitional metal di-chalcogenide (such as molybdenum disulphide) or an MXenes (a layered transition metal carbide or carbonitride with general formula $M_{n+1}X_nT_x$).

Use of two-dimensional materials may offer a number of advantages over use of thin layers of a material having a three-dimensional crystal lattice structure (for example, traditional three-dimensional semiconductor materials such as silicon or gallium arsenide which may be used to form a 2DEG within a heterostructure). Not only do two-dimensional materials offer clean, well confined two-dimensional systems, the provision of a layer of inherently two-dimensional material means that electrons and holes within the layer are more accessible and more efficient to extract. This allows easier photonic and electrical integration for devices using two-dimensional material. In comparison, thin layers of three-dimensional material are generally embedded deep in a semiconductor heterostructure to ensure stability of the thin layer. This makes photon extraction from the three-dimensional material inefficient and electrically more difficult to control than compared to the described devices using two-dimensional material.

Arrangement of the layer of two-dimensional material on the substrate and at least one protrusion results in bending or deformation in the crystal lattice of the layer of two-dimensional material. In particular, as the layer is one or only a few monolayers thick, the layer covers and 'drapes' over the protrusions forming hills and valleys in the layer. The presence of such bending or warping in the layer of two-dimensional material causes strain in the crystal lattice at the regions of curvature around the protrusions. Strain modulates the band structure of the two-dimensional material, causing further quantum confinement of the electrons or holes already confined within the plane.

With appropriate selection of the shape of protrusions (for example, as columns, pyramids or cones), strain can be induced in the layer of two-dimensional material so that electrons (and holes) can be considered to be confined in all three spatial dimensions, thereby resulting in formation of quantum dots. The spacing of energy levels within the dot may be increased as greater quantum confinement of the electron wavefunction is achieved. In this way, strain dictates the band modulation, and so the exact emission wavelength for the dot.

Alternatively, selection of the protrusion to be a ridge or raised contour (that is, a protrusion much longer in one dimension than the other two spatial dimensions) can cause modification of the bandstructure of the two dimensional material to result in confinement of the electrons and holes in only two dimensions. As such, a quantum wire is formed exhibiting quantum properties such as quantised conductance. As in the quantum dot device, the amount of strain controls the band modulation and so the energy level spacing within the quantum wire. If coupled to an optical cavity, this device can be an exciton-polariton circuit determined by the ridge protrusion.

Key to the present invention is the deliberate introduction of strain gradients in the layer of two-dimensional material. This results in spontaneous formation of quantum dots or quantum wires within the localised region of the induced strain. An appropriate selection of the size and shape of the protrusions arranged on the substrate generates sufficient strain to form the quantum dot or the quantum wire. The required dimensions of the protrusion will vary according to the material used, the required characteristics of the quantum dots or quantum wires, and the number of monolayers within the layer of two-dimensional material.

Advantageously, the placement of the protrusion on the substrate or base layer, as well as the shape and dimensions of the protrusion, may be readily selected and controlled using well-known semiconductor device fabrication techniques. As a result, the position of the quantum dot or quantum wire on the substrate is highly deterministic and can be specifically preselected during manufacture of the device. Furthermore, the number of dots or wires generated on the substrate can be increased without substantive changes to the device or the method of manufacture. Accordingly, the device and method of manufacture are highly scalable.

A further benefit of the described quantum dot device is that the optical and electrical characteristics of the dots can be selected with predictable and reproducible results. Use of multiple high-quality two-dimensional material layers means that a wide range of emitter spectra can be obtained on the same device, as well as strong optical coupling to photonic structures on the substrate.

Preferably, the two-dimensional material is a semiconductor, an insulator or a semimetal. Whereas a semiconductor has a band gap separating the electron-filled valance band and the largely unoccupied conduction band, a semimetal has a very small overlap between the bottom of the conduction band and the top of the valence band. A semimetal has no band gap and a negligible density of states at the Fermi level. In some cases, a semimetal such as graphene can also be considered a zero band-gap semiconductor. An example of a two-dimensional semimetal material is graphene, with tungsten selenide ($WSe_2$) being an example of a two-dimensional semiconductor material. Hexagonal boron nitride (hBN) is an example of a two-dimensional insulator material in which quantum emission has been observed. Any two-dimensional semiconductor, two-dimensional insulator or two-dimensional semimetal could be used to form electron (and/or hole) confinement as described above. In particular, any transition-metal dichalcogende could be used.

Optionally, the layer of two-dimensional material is an exfoliated flake of the two-dimensional material. Atomic layers of two-dimensional layered materials may be separated to provide samples or flakes by using mechanical exfoliation techniques or chemical exfoliation techniques. Exfoliation provides a relatively straightforward method of obtaining a sample of two-dimensional material comprising one or just a few monolayers of the two-dimensional material. More information on methods for all-dry exfoliation can be found in "Deterministic transfer of two-dimensional materials by all-dry viscoelastic stamping", Andres Castellanos-Gomez et al. 2014. *2D Materials*, vol. 1, 011002.

Alternatively, the layer of the two-dimensional material is a deposited thin film. For example, a single monolayer or a few monolayers of the two-dimensional material may be grown on the substrate and protrusions. Depositing the layer of two-dimensional material in this way can by especially beneficial. In particular, the use of chemical vapour deposition (CVD) to form the layer of two-dimensional material is highly controllable, and allows for scalability in manufacture of devices. In particular, use of CVD growth of the layer of two-dimensional material can allow fabrication of large arrays of devices on a substrate. Use of CVD may be particularly advantageous to deposit certain materials, for example graphene.

Techniques such as Metalorganic Chemical Vapor Deposition (MOCVD) may be used to form the thin film layer. An example of such MOCVD is described in "High-mobility three-atom-thick semiconducting films with wafer-scale homogeneity", Kang et al, 2015, *Nature*, vol. 520, pg. 656-660. Such techniques form a thin film at a surface one complete monolayer at a time. Growth of the layer of two-dimensional material in this way provides a layer having predictable and purely monolayer two-dimensional layered materials on wafer-size substrates. Furthermore, a large area of a device may be coated predictably and in a controlled manner. Other thin film growth techniques may also be used.

The heterostructure layer of two-dimensional material may comprise 10 monolayers or fewer, and preferably 5 monolayers or fewer. Ideally, a single monolayer of the two-dimensional material is sufficient to provide a system having clean two-dimensional confinement. Nevertheless, quantum dots or quantum wires can also be formed in regions of the layer of two-dimensional material having more than one monolayer, allowing for extra functionality of the devices such as voltage control and current injection. When a region of the two-dimensional material having more than one monolayer is used for a quantum dot device, quantum dots are formed in each separate monolayer in the region of the protrusion. Such quantum dots are likely to interact though a weakly hybridized bilayer formation. The different sizes and levels of strain in each layer provide quantum dots with differing characteristics and electron number. Therefore, where quantum dot devices formed in more than one monolayer are used to provide an emitter, the optical characteristics of the emitter may be more tuneable by electric and magnetic fields.

The at least one protrusion has a first dimension (a length) and a second dimension (a width) both in a plane parallel to the substrate, the second dimension (the width) being perpendicular to the first dimension (the length). Preferably, the ratio of the first dimension (the length) to the second dimension (the width) is less than two, and the region of localised strain forms a quantum dot. More preferably, the ratio of the first dimension (the length) to the second dimension (the width) is around one. In particular examples, the width and length will both be nanoscale (i.e. less than 1 µm). For instance, the length and width will both be below 500 nm.

Optionally, the at least one protrusion comprises at least one column or pillar. Ideally, to form a quantum dot the protrusion is a column, pillar or island projection from the surface of the substrate. In other words, the protrusion to form a quantum dot will have similar length scales in all three dimensions: the length:height:width ratio may be small or close to 1. However, the protrusions may have any shape or configuration that induces sufficient localised strain in the layer of two-dimensional material to form a quantum dot. The protrusion extends outwards from the surface of the substrate, perpendicular to the plane of the surface of the substrate.

Protrusions may be formed by lithographic patterning and etching techniques on the surface of the substrate or epitaxial layer. Other known semiconductor manufacturing techniques may also be used. The columns may have a cross-sectional shape selected from the following group: circular, rectangular, square, hexagonal, polygonal. For instance, the cross-section is in the plane parallel to the surface of the substrate, and is a "cut-through" the column. The protrusion may be pyramidal or cone shaped, and may have a curved or flat peak. Different shapes or configurations of the protrusion may affect the electrical and optical properties of the quantum dot that is formed.

Optionally, the at least one protrusion is a ridge or corrugation. Ideally, to form a quantum wire the protrusion is a ridge or thin area of elevation extending upwards (or perpendicular) from the surface of the substrate to form a raised line or crest. Preferably, the ridge extends in one direction on and in a direction parallel to the surface of the substrate.

The at least one ridge has a first dimension (a length) and a second dimension (a width) both in a plane parallel to the substrate. The second dimension (the width) is perpendicular to the first dimension (the length). Preferably, the length and the width of the ridge have a ratio of more than two. More preferably, the length and the width of the ridge have a ratio of more than five. In other words, the protrusion or ridge used to form a quantum wire should have a length that is much longer than its width. The width and height of the protrusion above the substrate may be of a similar scale, however. For example the height:width aspect ratio of the protrusion would be small or close to 1, but the height:length or width:length aspect ratio would be larger (for instance, in the scale of 3-10 or more). In particular examples, the width and the height will both be nanoscale (i.e. less than 1 μm) but the length may be microscale (i.e. more than 1 μm to 100 μm). For instance, the width may be below 500 nm but the length may be between 1 μm and 10 μm.

Beneficially, protrusions as described here may be formed in the surface of the substrate or epitaxial layer using standard semiconductor manufacturing techniques (lithographic patterning and etching), or may use any other suitable technique for nanofabication.

Preferably, the height of the at least one protrusion is between 2 nm and 200 nm. More preferably, the height of the protrusions is at least 50 nm. In particular, the height will be nanoscale (i.e. less than 1 μm). The height of the protrusion is considered to be the dimension extending outwards and perpendicular to the substrate surface. The protrusion must be of adequate height to induce sufficient localised strain in the layer of two-dimensional material to form a quantum dot or quantum wire. The required height may depend on the crystal lattice properties of the two-dimensional material, so for each two-dimensional material there will be a specific range for the protrusion height and the width. The required height may also depend on the number of monolayers of the two-dimensional material. Regions of the two-dimensional material having fewer monolayers may require a protrusion of lesser height to induce a quantum dot or a quantum wire.

In particular examples, quantum emission has been observed from quantum dots realised in tungsten diselenide ($WSe_2$) using pillars having heights 120-140 nm, or in quantum dots formed in tungsten disulphide ($WS_2$) using pillars having heights of around 250 nm. The pillars in these examples were observed to have a conical shape with a rounded tip, and a full-width half-maximum of around 250 nm.

Preferably, the localised strain is between 0.05% and 1%. However, the strain could be as low as 0.01% in some examples. The strain in the crystal lattice dictates the energy band modulation in the two-dimensional material. Therefore, the amount of strain effects the quantum confinement of the electron wavefunction in the material, and so the properties of the quantum dot or quantum wire. For each two-dimensional material layer, a minimum amount of strain is required to induce a quantum dot or quantum wire.

Optionally, the at least one protrusion arranged on the substrate comprises an arrangement of at least one nanocrystal or nanodiamond on the surface of the substrate. For forming quantum dots, the nanocrystals may have a length scale of 10-200 nm. When the layer of two-dimensional material is arranged on top of the substrate and nanocrystals, the nanocrystals create small bulges within the layer resulting in localised areas of strain in the crystal lattice nearby the nanocrystal. Where the nanocrystals have similar length scales in every dimension (for example, such as a nanodiamond), a quantum dot can be formed. If the nanocrystal is a nanotube or nanoscale rod (in other words, a nanostructure having a diameter in the order of nanometres, but a large length-to width ratio) then a quantum wire may be formed in the layer of two-dimensional material. Beneficially, the use of nanocrystals on the surface of the substrate to form quantum dots or quantum wires provides a fairly straightforward and lost cost mechanism of forming protrusions capable of generating a quantum dot or quantum wire, as arrangement of the nanocrystals does not require complex processing steps.

Preferably, the device comprises an epitaxial layer formed on the substrate, wherein the at least one protrusion comprises an arrangement of at least one nanocrystal on the surface of the epitaxial layer. One or more epitaxial layers may be grown on the surface of the substrate. Beneficially, this could provide structures for further device processing after formation of the quantum dot or quantum wire (for example, formation of epitaxially grown heterostructures on the substrate, or integrated circuits). Growth of an epitaxial layer can also provide a high-quality, flat surface on which the protrusions and layer of two-dimensional material can be arranged. Nevertheless, the mechanism by which quantum dots or quantum wires are formed in the layer of two-dimensional material is not affected by the formation of epitaxial layers on the substrate. Generation of quantum dots and quantum wires relies solely on generation of sufficient strain gradient in the layer of two-dimensional material to modify the bandstructure and cause quantum-confinement.

Optionally, the at least one protrusion arranged on the substrate comprises at least one projection or protrusion formed by patterning on a surface of the substrate. In particular, the at least one protrusion can be formed in the surface of the substrate so as to form protrusions or formations at the uppermost surface of the substrate. For example, protrusions or projections may be formed by well-known semiconductor processing techniques (e.g. coating of a photoresist to the surface of the substrate, patterning of the photoresist by optical or e-beam lithography, and subsequent wet or dry etching to remove portions of the surface of the substrate). An advantage of forming the protrusions by patterning and etching the substrate is that the placement of the protrusions can be selected and designed at the time of fabrication. This provides a high level of control of the location of the resulting quantum dots or quantum wires on the substrate. This would be crucial for incorporation of the quantum dots or quantum wires into integrated circuit devices.

The device may comprise an epitaxial layer formed on the substrate, the at least one protrusion arranged on the epitaxial layer. Preferably, the at least one protrusion arranged on the substrate comprises protrusions patterned in the epitaxial layer. The protrusions may be formed within one or more epitaxial layers grown on the surface of the substrate. The protrusions can be formed in the epitaxial layer using patterning, lithography and etching techniques. Beneficially, use of an epitaxial layer provides a high quality surface upon which the protrusions can be formed. Furthermore, the epitaxial layer may allow more sophisticated device structures to be formed surrounding the quantum dot or quantum wire.

Optionally, the at least one protrusion comprises a plurality of protrusions forming a plurality of quantum dots, a plurality of quantum wires or at least one quantum dot and at least one quantum wire. In other words, a device may be formed including a number of quantum dots and/or a number of quantum wires on the same substrate according to the described embodiments.

Preferably, the at least one protrusion comprises an array of protrusions forming an array of quantum dots and/or quantum wires. Optionally, more than one protrusion may be formed on the substrate. For example, a plurality of protrusions may be formed so as to form a plurality of quantum dots or quantum wires once the layer of two-dimensional material is arranged on the substrate. As the placement and location of dots or wires can be carefully selected during patterning of protrusions on a substrate, an array or arrangement of a large number of quantum dots or quantum wires on the surface of the substrate can be achieved. In a particular example, the protrusions can be regularly spaced on the substrate forming an array of quantum dots or quantum wires that are regularly spaced.

Preferably, the device comprises a layer on the layer of two-dimensional material. The layer on the layer of two-dimensional material may act as an encapsulating layer or a barrier layer. For the purpose of identification, the layer on the layer of two-dimensional material is denoted as an encapsulating layer herein. However, this label should not be construed as limiting. The terms further layer or barrier layer could also describe the layer on the layer of two-dimensional material construed as limiting. The terms further layer or barrier layer could also describe the layer on the layer of two-dimensional material.

In particular, the layer of two-dimensional material is encapsulated, enclosed or covered by the further layer (the encapsulating layer). In some examples the further or encapsulating layer is directly on top of the layer of two-dimensional material. However, in other examples the further or encapsulating layer may form part of a stack of layers on the layer of two-dimensional material. The further or encapsulating layer may cover only the functional portion of the device (in other words over the quantum device formed in the layer of two-dimensional material). Alternatively, the further or encapsulating layer may cover the entire surface area of the device.

Advantageously, the further layer (or encapsulating layer) improves the stability of the layer of two-dimensional material in which the quantum dot or quantum wire are formed, and so improves the long-term performance and robustness of the device. The further or encapsulating layer may prevent degradation of the layer of two-dimensional material due to the environment.

Beneficially, the layer on the layer of two-dimensional material may also act to form a tunnel barrier to a quantum dot or quantum wire in the layer of two-dimensional material. In particular, a tunnel barrier will be formed when the further or encapsulating layer is directly on top of the layer of two-dimensional material. In this way, the further or encapsulating layer acts as a barrier layer. The further or encapsulating layer could be considered a barrier layer in both a mechanical sense (providing protection to the layer of two-dimensional material from degradation) and in terms of the band structure (in which the further or encapsulating layer forms a tunnel barrier).

Preferably, the layer on the layer of two-dimensional material is a layer of a semiconductor material, an insulator, or a conductor. For instance, a layer of semiconductor material can be formed on top of the layer of two-dimensional material in which the quantum dot or quantum wire are formed, so that the layer of two-dimensional material is embedded in a heterostructure. This configuration is particularly useful to allow for electrical interfacing or electrical connection with the device. Therefore, particular types of device (such as quantum emitters) formed according to the claims can be better controlled when in operation.

Optionally, the layer on the layer of two-dimensional material comprises a layer of a two-dimensional material. In other words, the layer of two-dimensional material arranged on the substrate and the at least one protrusion is a first layer of two-dimensional material, and the further or encapsulating layer comprises a second layer of two-dimensional material over or on top of the first layer of two-dimensional material. In particular, the first layer of two-dimensional material will be a different type of material (having a different band gap) than the second layer of two-dimensional material. In this way, the first layer of two-dimensional material forms part of a heterostructure comprising different types of two-dimensional material and the substrate (and in some cases also an epitaxial layer). Ideally, the bandgap of the further layer or encapsulating layer is larger than the band gap of the two-dimensional layer in which the quantum dot or quantum wire is formed.

In some cases, the further layer (or encapsulating layer) is an exfoliated flake of a two-dimensional material. In an alternative, the further or encapsulating layer is a deposited thin film of two-dimensional material.

In one example, the layer on the layer of two-dimensional material is a layer of hexagonal boron nitride. As noted above, hexagonal boron nitride is itself a two-dimensional material. One or more monolayers of hexagonal boron nitride can be used as a further layer or encapsulating layer by arrangement on top of the layer of two-dimensional material in which the quantum dot or quantum wire are formed. In one instance, the further layer or encapsulating layer is formed of one or more monolayers of hexagonal boron nitride (hBN), and the layer of two-dimensional material, which is arranged on the substrate and the at least one protrusion, is formed of one or more monolayers of tungsten disulfide ($WS_2$).

In specific applications, use of a further layer (or encapsulating layer) can demonstrate particular benefits. For instance, in an emitter formed by a quantum dot within the layer of two-dimensional material, the use of an encapsulating layer has been found to improve optical quality, brightness and also to decrease the spectral line width of the emitted luminescence.

Preferably, the device comprises an electrode layer on the further or encapsulating layer. The electrode layer may itself be a layer of two-dimensional material, for instance a single layer of graphene. The electrode layer acts as a surface gate electrode, so as to apply a homogenous bias over the whole of the device, and thereby make the whole surface area of the device functional. Use of a single layer of graphene as an electrode has particular benefits, as the layer is both transparent and flexible. The transparency of the single layer of graphene means that this material is particularly useful as an electrode layer of a quantum emitter, because light emitted from the quantum dot can exit the device through the electrode layer. A further metallic contact may be applied to the electrode layer, for electrical connection.

The device may also comprise another, additional layer on the epitaxial layer, the additional layer having the protrusion arranged directly thereupon. Accordingly, an additional layer may be arranged between the epitaxial layer and the layer of two-dimensional material in which a quantum dot or a quantum wire is formed. Optionally, the additional layer may itself be a layer of two-dimensional material. The additional layer may comprise many monolayers of the two-dimensional material, having a total thickness of 50-100 nm. Advantageously, the additional layer may act both to provide a 'clean' layer (with few charge traps), and also a smoother, flatter layer (thereby avoiding additional, inadvertent sources of strain in the layer of two-dimensional material in which the quantum dot or quantum wire is formed). The additional layer and encapsulating layer may act together to completely encapsulate the layer of two-dimensional material in which the quantum dot is formed. Furthermore, by choice of material having an appropriate band gap, the additional layer may act to block flow of current through the device.

Use of the additional layer is not essential, but may be beneficial. In an example, the additional layer is formed form a thick layer of hexagonal boron nitride (50-100 nm), and the further or encapsulating layer is formed from a thin layer of hexagonal boron nitride (4-5 monolayers). The layer of two-dimensional material in which the quantum dot is formed is tungsten diselenide. Thus, the tungsten diselenide layer is completely encapsulated by hexagonal boron nitride layers, on all sides. Furthermore, as hexagonal boron nitride is an atomically flat material, the additional layer of hexagonal boron nitride provides a very flat surface upon which to arrange the protrusion for forming the quantum dot or quantum wire. Thus, use of the hexagonal boron nitride additional layer improves non-radiative recombination, and also protects the tungsten diselenide layer in which the quantum dot or quantum wire is formed from contact with the epitaxial layer (for instance formed of silicon dioxide, which may contain charge traps that create electrical noise in the device).

As will be understood by the person skilled in the art, the above described layers (the additional layer, the layer of two-dimensional material in which the quantum dot or quantum wire is formed, the encapsulating layer, and the electrode layer) may each themselves by comprised of one or more layers of different two-dimensional materials. Thus, a functional heterostructure is formed by such a stack of layers of two-dimensional materials. Nevertheless, this type of heterostructure is still different from a quasi-two-dimensional region (such as a 2DEG) formed in a heterostructure of materials having an inherently three-dimensional crystal structure. This is because the two-dimensional materials exhibit quantum confinement to two-dimensions in each monolayer of the material itself, rather than within a very thin layer of a material having a three-dimensional crystal lattice. In other words, the two-dimensional quantum confinement in the presently described device is a result of an inherent property of the layered two-dimensional materials, and not simply a result of the band structure of the heterostructure (as would be the case to form a two-dimensional electron gas in a heterostructure of three-dimensional materials).

Optionally, the device is a quantum dot device forming a quantum dot based light emitter or quantum emitter. In other words, optical or electrical excitation of the quantum dot can cause electrons confined within the dot to be excited to higher quantised energy states. Relaxation of an electron to a lower ground state results in a transfer of energy, for example by emission of a photon. As such, light is emitted. Advantageously, quantum dot emitters offer very well resolved spectral characteristics, having a narrow spectral peak at a particular frequency determined by the energy level spacing within the dot.

In a quantum dot, the number of photons emitted depends on the size of the quantum dot and its electron number (i.e. the number of electrons confined within the dot). Where the electron number is large, a plurality of electrons can be excited and allowed to relax, thereby releasing a plurality of photons. However, where the electron number is small, only a single electron may be excited and then allowed to relax. In this case, only a single photon is released. In this way, the quantum dot device provides a single photon source. The present device offers a controllable, reliable and scalable method of providing single photon emitters, and therefore realises a long sought goal of feasible scalability for quantum device technologies. Advantageous examples for a charge tuneable quantum emitter device are described below.

Optionally, the light emitter is optically driven or electrically driven. In other words, energy can be supplied to the quantum dot to cause electrons to be excited into higher energy states either by photoexcitation or electrical excitation. Photoexcitation takes place by providing photons to the quantum dot having a particular frequency or energy greater than the energy level spacing. Electrical excitation provides a current to the quantum dot between a source and drain contact, thereby providing energy greater than the energy level spacing to the electrons confined within the dot. Advantageously, optically driven quantum dots can be used to form emitters without complex processing techniques. However electrically driven quantum dots can be combined more easily into larger and more complex electrical circuits.

A number of other applications are possible for the described quantum dot devices. In one example, the sensitivity of the quantum dot spectra to parameters such as magnetic field, electric field and temperature allows the quantum dots to be used as sensors or sensor arrays. For example, such sensors could have important applications for imaging electromagnetic fields in disciplines as diverse as magnetic resonance imaging (MRI) or field mapping for mining and oil exploration. In another example, charged quantum dots generated as a result of charge control of the quantum dot devices opens the possibility of use of the quantum dots as qubits for quantum computing. In a still further example, improved absorbance characteristics for the described quantum dots compared to bulk excitons could allow the quantum dot devices to be used in solar cell or light harvesting applications. For these and other applications, multiple layers of two-dimensional material arranged above a protrusion could be used to form a quantum dot "stack" (for instance, a concentration of a plurality of quantum dots in the region over the protrusion). This could be especially useful for quantum-dot absorption or quantum-dot laser applications using the two-dimensional materials.

Optionally, the device maybe a quantum wire device for exciton propagation along a specified path. In this way, the quantum wire device can be used to write an excitonic circuit on a substrate or chip. Beneficially, the quantum wire device can be used within an exciton-polariton circuit device. In particular, the excitons in the two-dimensional layer may be optically coupled to a cavity mode in the strong coupling regime, and the formed quantum wires may allow for polariton propagation routes. Such devices would be highly scalable and allow deterministic positioning of the polariton propagation routes on a substrate or as part of a circuit on a chip.

The quantum-confined device may comprise at least one quantum wire and at least one quantum dot formed according to the devices described above. In other words, a mixture of quantum dots and quantum wires may be formed on the same substrate and within the same layer of two-dimensional material by appropriate selection and arrangement of protrusions on the substrate. For example, a column or pillar may be formed on the substrate to generate a quantum dot in the two-dimensional material, and a ridge may be formed on the substrate to generate a quantum wire. The one or more quantum wires and quantum dots may be coupled (electrically, capacitively or optically). For example, an adjoining quantum dot and quantum wire may be coupled, or two adjoining quantum dots may be coupled. In this way, more complex circuits and devices may be fabricated comprising a combination of the quantum-confined devices and using the manufacturing techniques described.

In a second aspect there is provided a method of manufacturing a quantum-confined device comprising providing a substrate, forming at least one protrusion on the substrate and arranging on the substrate and the at least one protrusion a layer of a two-dimensional material. The at least one protrusion causes localised strain in the layer of the two-dimensional material to form a quantum dot or a quantum wire at the region of localised strain.

Whether a quantum dot or a quantum wire is formed depends on the shape and dimensions of the protrusions and so the regions of localised strain formed in the layer of two-dimensional material. In each case, the protrusions beneath the layer of two-dimensional material cause bending resulting strain in the crystal lattice. The strain modifies the local band structure of the two-dimensional material, causing quantum-confinement. Where the quantum confinement is present in all three dimensions, a quantum dot is formed. However, where the quantum confinement is present in only two dimensions, a quantum wire is formed.

As in the first aspect described above, the substrate can comprise any material suitable for formation of a semiconductor device. The protrusions comprise a feature, prominence or projection on the substrate.

The layer may be formed of any two-dimensional material. Two-dimensional materials have a crystalline structure in which each monolayer forms a separate sheet or layer, and wherein no chemical bonds are formed between the monolayers. The separate monolayers are held together in the bulk material only though van de Waals forces. As such, the monolayers can be separated or 'peeled apart' leaving stable layers of the two-dimensional material without dangling or unpassivated chemical bonds. Ideally, the layer of the two-dimensional material comprises 5 monolayers or fewer, and preferably 3 monolayers or fewer.

Preferably, the two-dimensional material is a semiconductor, an insulator or semimetal. The two-dimensional material may be a zero band-gap semiconductor. In a particular example, the two-dimensional material may be a semimetal such as graphene or a semiconductor such as tungsten diselenide ($WSe_2$). In particular, any transition-metal dichalcogenide could be used as the two-dimensional material.

The method may comprise exfoliating a flake of the two-dimensional semiconductor material, wherein arranging the layer of the two-dimensional semiconductor material comprises arranging the exfoliated flake on the substrate and the at least one protrusion. Exfoliation of a flake of the two-dimensional material means separating one or a few monolayers from a bulk sample of the two-dimensional material. Exfoliation can be achieved either mechanically (by simply pulling the monolayers apart, for example by attachment to an adhesive tape) or by chemical exfoliation. Exfoliation techniques do not change the chemical structure of the two-dimensional material, but simply overcome the van der Waals forces between each monolayer to separate atomic sheets of the two-dimensional material. Advantageously, exfoliation provides a straightforward mechanism for obtaining a layer of two-dimensional material comprising one or a few monolayers.

Arranging the layer of the two-dimensional semiconductor material may comprise depositing a thin film of the two-dimensional material. For example, at least one monolayer of the two-dimensional material may be grown on the substrate by chemical vapour deposition (CVD). For some materials, deposition by Metalorganic Chemical Vapour Deposition (MOCVD) may be used. The fundamental crystal lattice structure of the two-dimensional material is not affected by the method by which the layer of two-dimensional material is provided. The crystal lattice structure is inherent to the material itself. Beneficially, grown thin film layers of the two-dimensional material produce monolayers that are clean, ordered and having an easily controllable thickness.

Preferably, forming the at least one protrusion comprises forming at least one protrusion having a length and a width in the plane parallel to the substrate, wherein the length and the width have a ratio of less than two, and the region of localised strain forms a quantum dot. More preferably, the length and width of the at least one protrusion have a ratio of about 1. In other words, the length and width of the protrusion are equal or almost equal.

Optionally, forming the etched pattern comprises forming at least one column. For example, lithography and etching techniques can be used to pattern the surface to form columns or pillars in the surface of the substrate or epitaxial layer, the pillars extending from the surface of the substrate. The columns or pillars may have any cross-sectional shape in the plane parallel to the substrate including one of the following group: circular, rectangular, square, hexagonal, polygonal. Dependent on the type of etching (wet or dry) or type of etchant used, different edge profiles can be achieved at the columns or pillars. In a particular example, the cross-sectional width at the base of the column may be greater than the cross-sectional width at the top or peak of the column. The particular shape, size and cross-sectional profile of the protrusions may affect the characteristics of the resulting quantum dots.

Alternatively, forming the at least one protrusion comprises forming at least one ridge, and the region of localised strain forms a quantum wire. In other words, the protrusion may be an elevated ridge or crest on the surface of the substrate. The at least one ridge may have a length and a width in the plane parallel to the substrate, and the length of the ridge may be greater or much greater than the width. Preferably, the length and the width have a ratio of more than two, and more preferably of more than 5.

Optionally, the at least one protrusion is formed having a height between 2 nm and 200 nm. In particular, the height will be nanoscale (i.e. less than 1 μm). The height of the protrusion is considered to be the dimension extending outwards and perpendicular to the substrate surface. The protrusion must be of adequate height to induce sufficient localised strain in the layer of two-dimensional material to form a quantum dot or quantum wire. The required height may depend on the crystal lattice properties of the two-dimensional material, so for each two-dimensional material there will be a specific range for the protrusion height and the width. The required height may also depend on the number of monolayers of the two-dimensional material. Regions of the two-dimensional material having fewer monolayers may require a protrusion of lesser height to induce a quantum dot or a quantum wire.

Preferably, the localised strain is between 0.01% and 1%. The strain in the crystal lattice dictates the energy band modulation in the two-dimensional material. Therefore, the amount of strain effects the quantum confinement of the electron wavefunction in the material, and so the properties of the quantum dot or quantum wire. For each two-dimensional material layer, a minimum amount of strain is required to induce a quantum dot or quantum wire.

Preferably, forming the at least one protrusion comprises arranging at least one nanocrystal on the surface of the substrate. For example, nanocrystals (such as nanodiamonds or nanorods) may be 'scattered' across the surface of the substrate. Alternatively, the nanocrystals may be mixed in a liquid and applied to the substrate so that the nanocrystals remain on the surface of the substrate once the excess liquid has evaporated or been rinsed away. Use of nanocrystals provide a straightforward mechanism for creation of the at least one protrusion. Nevertheless, in some cases it may be difficult to obtain a plurality of nanocrystals of regular size, and furthermore may be difficult to pre-determine the placement of the nanocrystals (and so resulting quantum dot or quantum wire) on the surface of the substrate. Alternatively, an extra processing step to pattern-coat the substrate with a resist, such as PDDS for example, will also allow for controlled nanocrystal arrays on a substrate.

Preferably, forming the at least one protrusion comprises forming an etched pattern in the surface at the substrate. The etched pattern may be obtained using known semiconductor processing techniques. For example, a photoresist may be applied or spun on to the surface of the substrate. A pattern may then be applied to the photoresist layer using optical or e-beam lithography. As a result, regions of the photoresist that were exposed to the light or e-beam are hardened. The resist may then be developed such that the hardened regions of resist are left at the surface of the substrate but with the remaining portions of the resist removed. The substrate may subsequently be etched using either wet or dry etching. The etching process removes exposed regions of the surface of the substrate, but does not affect areas covered by photoresist. After etching, the hardened areas of photoresist may be removed resulting in the areas previously covered by photoresist forming protrusions from the etched surface.

Beneficially, use of etching and patterning in this way allows an arrangement of the protrusions (and so quantum dots or quantum wires) on the surface of the substrate that is entirely dependent on the pattern applied during optical or e-beam lithography. As such, the positioning of the quantum dots is entirely deterministic, and the number of dots can be easily scaled. Furthermore, the size and shape of the protrusions can be selected by appropriate design of the lithographic pattern, thereby allowing some control over the electrical and optical characteristics of the resulting quantum dots.

The method may further comprise growing one or more epitaxial layers on the surface of the substrate. The protrusions may then be formed in or on the one or more epitaxial layer. Advantageously, addition of an epitaxial layer may allow manufacture of more complex devices surrounding and incorporating the quantum dot.

Preferably, forming the at least one protrusion comprises arranging at least one nanocrystal on the surface of the epitaxial layer. For example, nanocrystals (such as nanodiamonds or nanorods) may be arranged so as to provide a protrusion from the uppermost surface of the epitaxial layer.

Alternatively, forming the at least one protrusion comprises forming an etched pattern at the surface of the epitaxial layer. In the same manner as described above, the protrusions may be formed by lithographic and etching techniques in the epitaxial layer. This allows a high level of determinism in the placement, shape and characteristics of the quantum dots.

In a further alternative, the protrusions may be formed directly in the surface of the substrate or an epitaxial layer formed thereon, and then a further epitaxial layer may be formed over the top of the protrusions. For example, the further epitaxial layer could be formed by regrowth. This may allow certain more complex device structures to be formed incorporating the quantum dot or quantum wire. Furthermore, it may allow the shape of the protrusions to be changed or adapted, for example to provide a more gentle elevation of the protrusion from the surface.

Forming the at least one protrusion may comprise forming an array of protrusions on the substrate. This results in formation of an array of quantum dots and/or an array of quantum wires, depending on the shape and size of the protrusions.

Preferably, a layer is formed on the layer of two-dimensional material. This further layer may be formed to cover or encapsulate the layer of two-dimensional material. The further layer may reduce degradation of the two-dimensional material, and so help to improve stability of the device in the long term. Importantly, the further layer may also act to form a tunnel barrier to quantum devices (dots or wires) in the layer of two-dimensional material. Thus, the further layer could be considered a barrier layer, having both mechanical barrier properties (for protection of the two-dimensional layer) and electrostatic barrier properties (providing a tunnel barrier). The further layer is labelled herein as an encapsulating layer for ease of identification, but this term should not be considered limiting. The terms barrier layer or further layer would also be appropriate.

Forming the further layer or encapsulating layer may comprise forming a layer of a semiconductor material, an insulator, or a conductor. In an example, a semiconductor layer may be formed on top of the layer of two-dimensional material, to provide the further layer or encapsulating layer. Thus, the layer of two-dimensional material is configured within a heterostructure, with the further layer or encapsulating layer thereupon.

Optionally, forming the layer on the layer of two-dimensional material comprises forming a layer of a two-dimensional material. The further layer or encapsulating layer may itself comprise one or more monolayers of a two-dimensional material. In other words, the layer of two-dimensional material arranged on the substrate and the at least one protrusion is a first layer of two-dimensional material and the further or encapsulating layer is formed as a second layer of two-dimensional material, formed over or on top of the first layer of two-dimensional material. The first layer of two-dimensional material will be a first type of two-dimensional material (such as tungsten disulfide, $WS_2$), and the second layer of two-dimensional material will be a second type of two-dimensional material (such as hexagonal boron nitride, hBN), the first and second type of two-dimensional material having a different band gap.

The layer on the layer of two-dimensional material may be formed by depositing a thin film. In an alternative example, this further or encapsulating layer may be formed by exfoliating a flake of one or more monolayers of two-dimensional material and arranging the exfoliated flake on the layer of the two-dimensional material arranged on the substrate and the at least one protrusion. In this way, the layers of the first and second two-dimensional material form a heterostructure.

In a particular example, the layer on the layer of two-dimensional material is a layer of hexagonal boron nitride. In other words, one or more monolayers of hexagonal boron nitride can be formed as a further or encapsulating layer.

Preferably, the device comprises an electrode layer on the further or encapsulating layer. The electrode layer may itself be a layer of two-dimensional material, for instance a single layer of graphene. Beneficially, the electrode layer can be used to apply a homogeneous bias across the whole of the device.

Beneficially, the device may comprise an another, additional layer on the epitaxial layer, the protrusion arranged thereupon. The additional layer may itself be a layer of two-dimensional semiconductor material, for instance a layer of hexagonal boron nitride. The additional layer may be provided to give an atomically flat surface for the protrusion and the layer of two-dimensional material comprising the quantum dot or quantum wire. The additional layer may also be 'clean', for example with very few trapped charges, thereby reducing electrical noise in the device. The additional layer may be formed of an insulator or material having a large band gap, in order to block current flow through the device.

An emitter may be formed comprising the quantum dot device. In other words, the quantum dot may provide a quantum emitter and more preferably a single photon source. The emitter emits electromagnetic radiation. Realising a quantum emitter that can be reliably manufactured with a good yield has been a long anticipated goal within semiconductor device research. A charge tuneable quantum emitter can be formed by incorporation of the described quantum dot devices into heterostructures to form tunnel-coupled quantum devices.

Preferably, an array of emitters maybe formed using an array of the described quantum dot devices. The method of manufacture of the quantum dot devices can provide quantum dots in locations according a specified, predetermined design with a high yield. Moreover, the method can be used to produce a scalable array of a plurality of quantum dots according to application requirements. In particular examples, an array of regularly spaced emitters can be formed, for example by forming a grid of quantum dots.

In a third aspect, there is provided a method for generation of a single photon, comprising optically exciting a quantum dot device as described above. In a fourth aspect there is provided a method for generation of a single photon, comprising electrically exciting a quantum dot device as described above.

In the first, second or third aspect described above, the layer of two-dimensional material comprises at least one monolayer of a two-dimensional layered material. Each monolayer of the two-dimensional material has an inherently two-dimensional crystalline structure. The two-dimensional material may be defined as a material in which each monolayer has a two-dimensional crystalline structure such that atoms are chemically bonded only within the plane of each monolayer or sheet. Further, the two-dimensional material may be defined as a material in which each monolayer has a two-dimensional crystalline structure such that atoms are chemically bonded only within the plane of each monolayer or sheet and no chemical bonds are formed between monolayers.

BRIEF DESCRIPTION OF THE DRAWINGS

A quantum-confined device and its method of manufacture in accordance with aspects of the present disclosure is described, by way of example only, with reference to the following drawings, in which:

FIGS. 6A and 6B are bright and dark (respectively) field microscopy images of an exfoliated flake arranged on pillars on a silicon dioxide substrate;

FIG. 7 is a further dark field microscopy image of an array of quantum dot devices;

FIGS. 10A, 10B, 100 and 10D are schematic diagrams depicting the steps for manufacture of the quantum dot device of FIG. 1A.

Where appropriate, like reference numerals denote like elements in the figures. The figures are not to scale.

DETAILED DESCRIPTION OF SPECIFIC EMBODIMENTS OF THE INVENTION

Figure 1A:
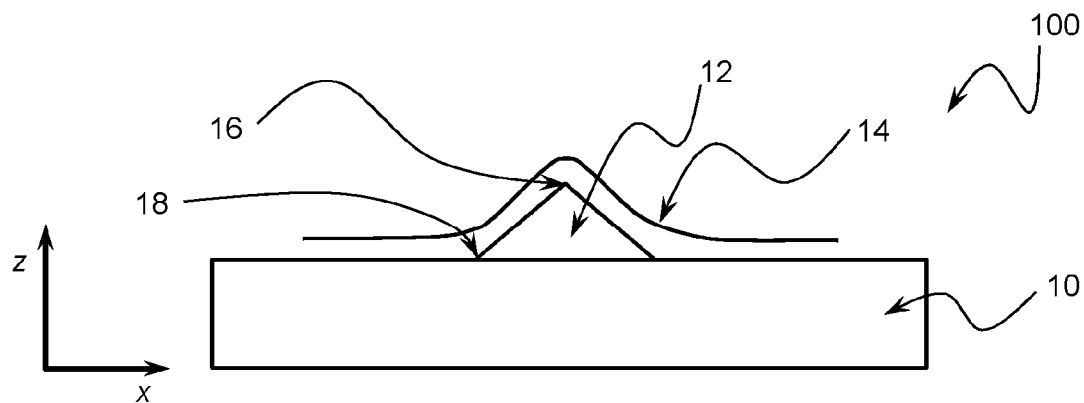
FIG. 1A is cross-sectional view of a quantum dot device.
Figure 1B:
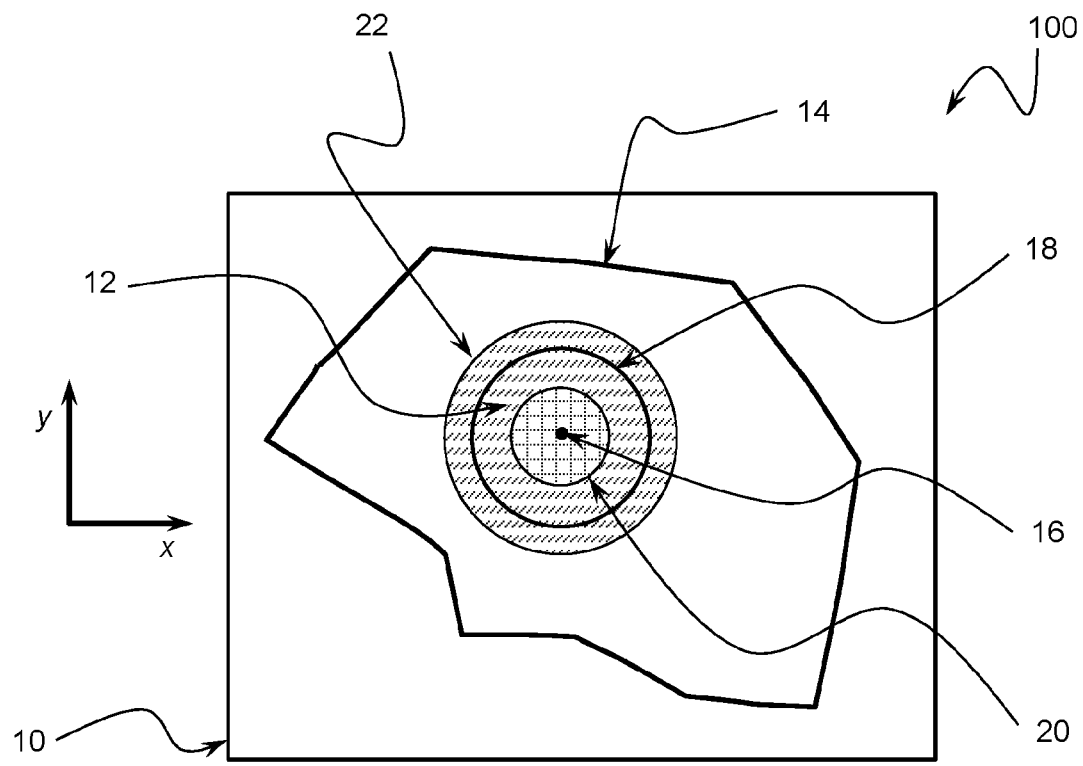
FIG. 1B is plan view of the quantum dot device of FIG. 1A.

FIG. 1A illustrates a cross-sectional view of a quantum dot device 100. The device comprises a substrate 10, a protrusion 12 arranged on the substrate, and a layer of two-dimensional material 14. FIG. 1B shows a plan view of the device 100 illustrated in FIG. 1A. The inherent characteristics of the crystal lattice of the two-dimensional material 14 cause electrons within the material to be confined in the atomic plane. According to the coordinates shown in FIGS. 1A and 1B, before the layer of two-dimensional material is arranged on the protrusion and substrate, electrons may move freely in the x- and y-axis but their movement is restricted in the z-axis.

The protrusion 12 is arranged to form a projection on the surface of the substrate 10. In this example, the protrusion 12 is formed as a conical pyramid having base 18 that is much wider than its peak 16.

In the embodiment of FIGS. 1A and 1B the layer of two-dimensional material 14 comprises a single monolayer. The monolayer in the region of the protrusion 12 bends and relaxes to somewhat conform to the shape of the protrusion. As a result of the bending in the layer of two-dimensional material, a region of strain 22 is formed in the two-dimensional material. Where the strain is sufficiently large, a quantum dot 20 is formed. In this example, the quantum dot 20 is formed around the uppermost point or peak 16 of the protrusion, as this is where the strain is greatest.

The quantum dot devices may be used within various applications. In this example, the quantum dot 20 is optically excited to cause emission of single photons with high yield. The emitter formed by the quantum dot device emits light having a well-defined and stable spectral peak. Other applications can utilize high oscillator strength of quantum dots for increased absorbance such as in solar cells and light-harvesting devices.

Although the device of FIGS. 1A and 1B show a layer of two-dimensional material 14 comprising a single monolayer, other embodiments can comprise more than one monolayer. Furthermore, although a conical protrusion 12 is shown in FIGS. 1A and 1B, any shape of protrusion may be used to generate strain in the layer of two-dimensional material. Providing sufficient strain is produced within a localised area, a quantum dot will form. The amount of strain required will depend on the type of two-dimensional material and its thickness.

Figure 2A:
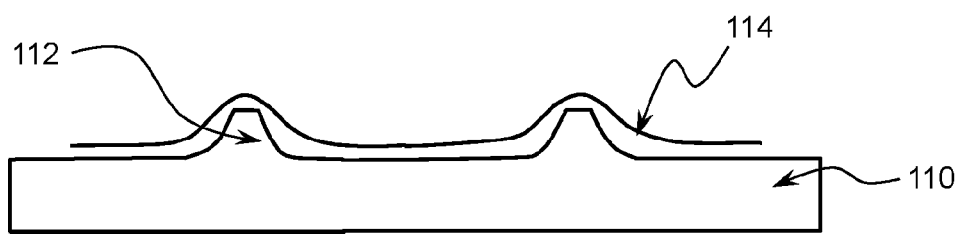
FIG. 2A is a cross-sectional view showing an example of a quantum dot device using an exfoliated flake of two-dimensional material and protrusions etched into the surface of the substrate.
Figure 2B:
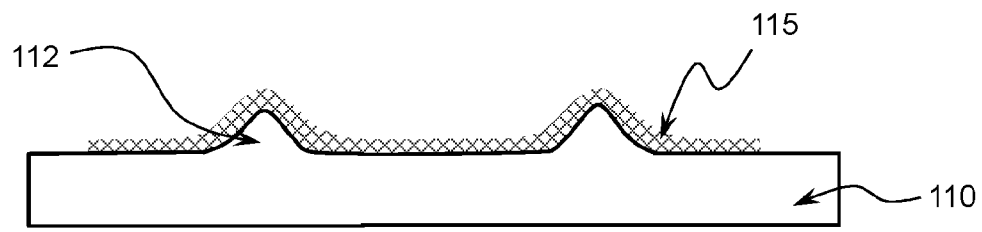
FIG. 2B is a cross-sectional view showing an example of a quantum dot device using an MOCVD grown layer of two-dimensional material and protrusions etched into the surface of the substrate.
Figure 2C:
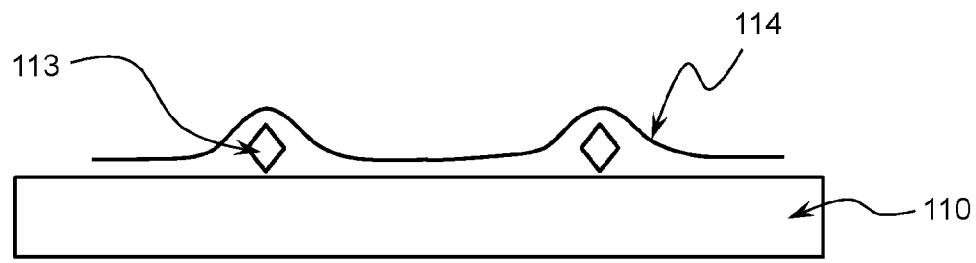
FIG. 2C is a cross-sectional view showing an example of a quantum dot device using an exfoliated flake of two-dimensional material and protrusions formed using nanocrystals arranged at the surface of the substrate.

FIGS. 2A, 2B and 2C each show specific embodiments of the device in FIGS. 1A and 1B. FIG. 2A shows a device in which the protrusions 112 are formed directly in the uppermost surface of the substrate 110. For example, the protrusions 112 may be formed by lithographically patterning and etching of the surface of the substrate 110. In the example of FIG. 2A, the resulting protrusions 112 are pillars or columns having a flat region at their peak and having a wider cross-section at their base than at their peak.

In FIG. 2A, the layer of two-dimensional material 114 is formed using an exfoliated flake of the two-dimensional material. The exfoliated flake 114 is obtained by separating one or a small number of atomic monolayers from a bulk sample of the two-dimensional material. In the example of FIG. 2A, the exfoliated flake 114 provides a single monolayer. However, in other examples the exfoliated flakes may comprise regions of two, three or more monolayers and still generate a quantum dot.

FIG. 2B shows a device in which protrusions 112 are formed directly in the surface of the substrate 110 in a similar manner to the device shown in FIG. 2A. However in FIG. 2B, the layer of two-dimensional material 115 is formed using MOCVD (although other types of chemical vapour deposition could be used). The MOCVD grown monolayer 115 conforms to the shape of each protrusion 112 during growth and subsequent cooling. As in other described examples, quantum dots are formed in the region of the protrusion 112 as a result of the strain induced in the grown monolayer.

FIG. 2C shows a further alternative example of a quantum dot device. This example has the same basic structure discussed in relation to FIGS. 1A and 1B. In this example, the layer of two-dimensional material 114 is provided by use of an exfoliated flake of the two-dimensional material as shown in the device of FIG. 2A. However, in the device of FIG. 2C the protrusions 113 are formed by a number of nanocrystals arranged or scattered on the surface of substrate 110. Arrangement of the exfoliated flake of two-dimensional material 114 on the substrate 110 and on the nanocrystals 113 causes bending or undulations in the layer of the two-dimensional material. In the regions local to the nanocrystal 113 formed protrusions, strain is induced in the crystal lattice of the two-dimensional layer 114 and a quantum dot is formed.

Figure 3A:
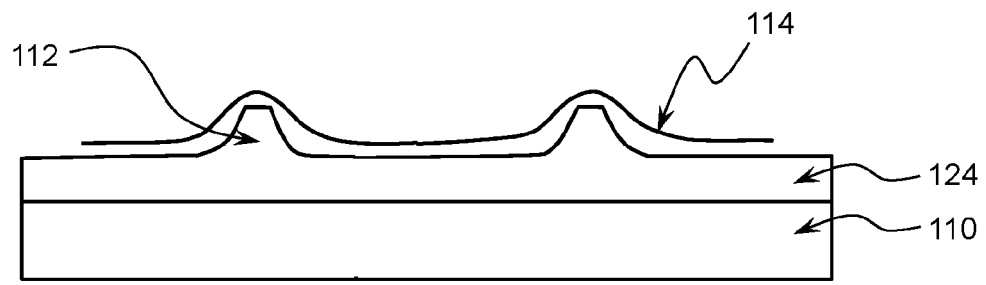
FIG. 3A is a cross-sectional view showing an example of a quantum dot device using an exfoliated flake of two-dimensional material and protrusions etched into an epitaxial layer on the substrate.
Figure 3B:
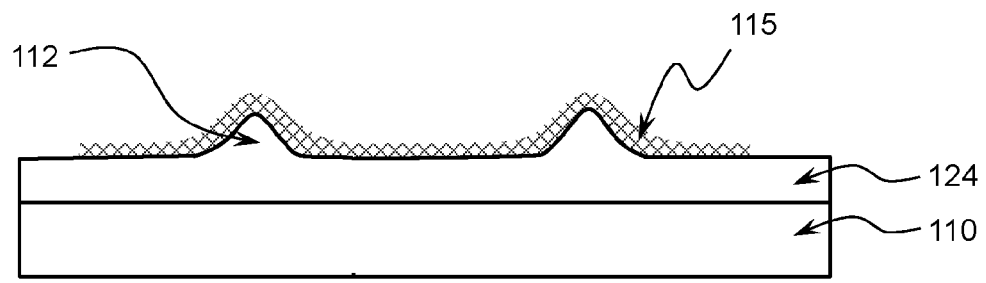
FIG. 3B is a cross-sectional view showing an example of a quantum dot device using an MOCVD grown layer of two-dimensional material and protrusions etched into an epitaxial layer on the substrate.
Figure 3C:
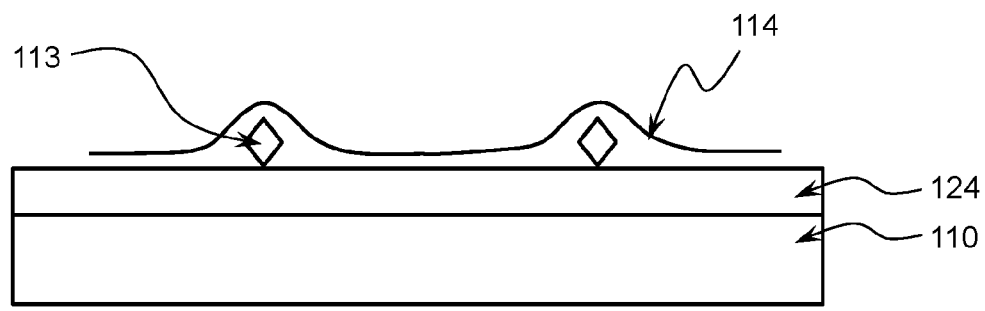
FIG. 3C is a cross-sectional view showing an example of a quantum dot device using an exfoliated flake of two-dimensional material and protrusions formed using nanocrystals arranged on an epitaxial layer on the substrate.

FIGS. 3A, 3B and 3C show examples of further quantum dot devices. The devices in FIGS. 3A, 3B and 3C are similar to the devices of FIGS. 2A, 2B and 2C but further comprise an intervening epitaxial layer 124 upon which the protrusions 112, 113 are formed. In this way, the protrusions 112, 113 are arranged on the epitaxial layer 124 as well as on the substrate 110.

In FIG. 3A, the protrusions 112 are formed in the epitaxial layer 124 using patterning and etching techniques. An exfoliated flake of the two-dimensional material 114 is arranged over the substrate 110, epitaxial layer 124 and protrusions 112. Each protrusion 112 results in a region of localised strain in the two-dimensional material 114, and so the formation of a quantum dot.

FIG. 3B shows a device in which the protrusions 112 are formed within the epitaxial layer 124 using patterning and etching techniques. In this example, the layer of two-dimensional material 115 is grown by MOCVD using appropriate growth parameters. Again, quantum dots are formed at regions of localised strain in the MOCVD layer 115 surrounding the protrusions 112 patterned in the epitaxial layer 124.

Finally, FIG. 3C shows a device in which protrusions are formed by arranging nanocrystals 113 on the epitaxial layer 124 and substrate 110. An exfoliated flake of a two-dimensional material 114 is arranged on top of the substrate 110, epitaxial layer 124 and nanocrystals 113. Strain is generated in the exfoliated flake 114 in the region of each nanocrystal 113, thereby causing formation of a quantum dot.

Although a single epitaxial layer is shown in FIGS. 3A, 3B and 3C, the skilled person will understand that more than one epitaxial layer or a heterostructure comprising a number of epitaxial layers could be used.

The characteristics of the quantum dots generated in each of the devices of FIG. 1A to 3C can be affected by the shape and size of the protrusions, the particular two-dimensional material used, and the number of monolayers of the two-dimensional material. In particular, forming a quantum dot requires sufficient strain to be induced in the layer of two-dimensional material. Nevertheless, the described quantum dot device can be formed using any type of two-dimensional material.

Figure 4A:
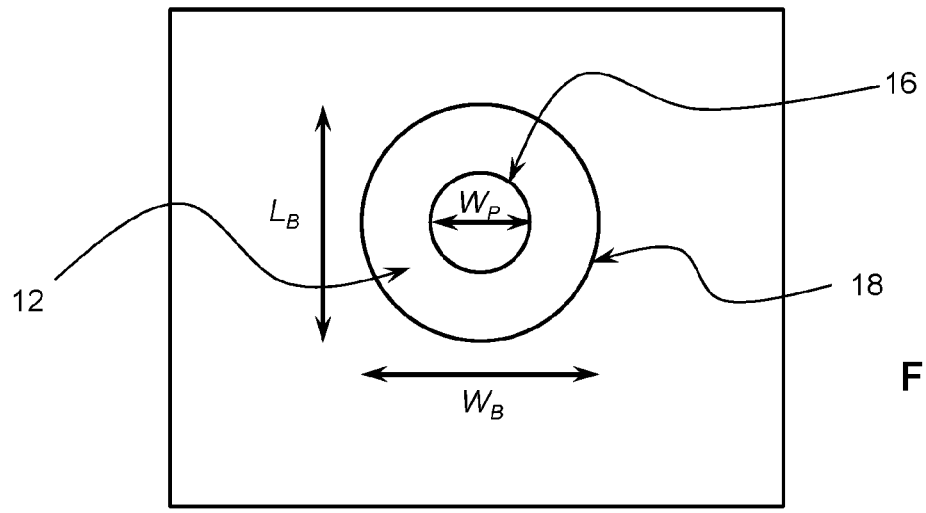
FIG. 4A is a plan view of a single protrusion on the substrate.
Figure 4B:
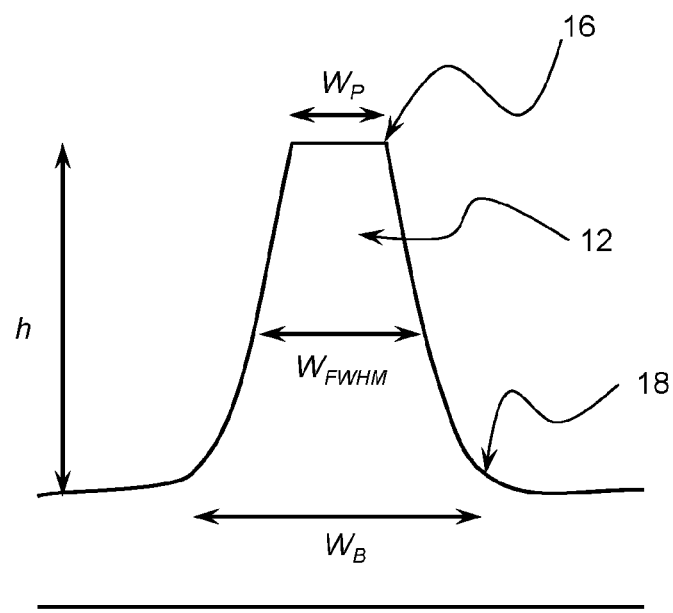
FIG. 4B is a cross-sectional view of the single protrusion on the substrate as illustrated in FIG. 4A.

The dimensions of the protrusion are significant for inducing sufficient strain for formation of a quantum dot. Where a quantum dot is formed, the dimensions of the protrusions can be adjusted to increase or decrease the confinement of the energy levels within the quantum dots, and therefore change the size of the dot and its electron number. FIG. 4A shows a plan view of a protrusion 12 of the type represented in FIG. 1. FIG. 4B shows a cross-sectional view of the same protrusion 12 and the surrounding area of the substrate 10. In particular, the height, h, the width at the base 18 of the protrusion $W_B$ and the width at the peak 16 of the protrusion $W_P$ can be adapted to modify the characteristics of the resulting quantum dot formed in a layer of two-dimensional material. In some cases, an appropriate measurement of the dot dimensions will be the width at full-width, half-maxima $W_{FWHM}$ of the protrusion. In this case, the width at the base of the protrusion $W_B$ and the length at the base of the protrusion $L_B$ are approximately the same.

The shape of protrusions may also be adapted to change the characteristics of the quantum dots. For example, the protrusions may be pyramidal in shape as shown in FIGS. 2B and 3B or may be a pillar or column having a circular, square or hexagonal cross-sectional shape. The pillar may be wider at the base of the pillar than at the peak or top of the pillar. The pillar or protrusion may be conical or pyramidal with a pointed or curved peak.

It is noted that when forming a quantum wire device, the cross-sectional shape of the protrusion or ridge may be the same or similar to the cross-section shown in FIG. 4B. However, for formation of a quantum wire the length $L_B$ will be greater or much greater than the width $W_B$. In other words, the protrusion or ridge will extend in one dimension across the surface of the substrate. In particular examples for quantum wire devices, the length $L_B$ will be three times, five times or many more multiples the length $W_B$.

Figure 5A:
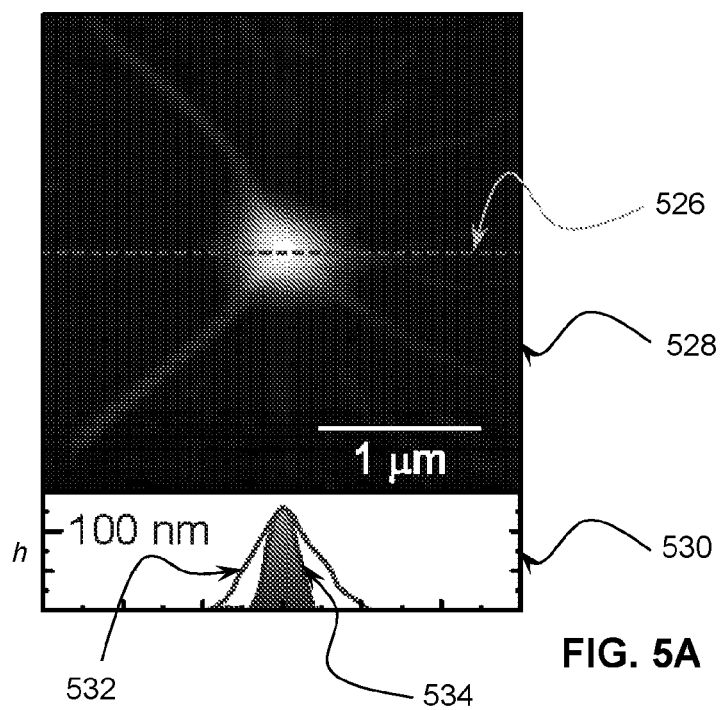
FIG. 5A is an AFM image of a quantum dot device formed by etched protrusions formed in the substrate, including AFM scans of a region of the AFM image.

FIG. 5A shows an AFM scan of a quantum dot device similar to the device of FIG. 2A. The device was formed using etched protrusions on the surface of the substrate and having an exfoliated flake of tungsten diselenide (WSe$_2$) arranged on the substrate and protrusions. The top portion 528 of FIG. 5A shows an AFM image of the quantum dot device. The traces 530 at the bottom of the FIG. 5A show AFM scans across a particular portion of the quantum dot device (marked by the dashed line 526 on the AFM image 528).

In the AFM scan 530, the filled, solid grey trace 534 shows the AFM measured outline of the protrusion at the substrate surface prior to application of the exfoliated flake. The solid line 532 shows an AFM measurement of the same region of the device once the exfoliated flake has been applied. It can be seen that the exfoliated flake appears to be 'draped' over the etched protrusion, which itself has a conical shape with a rounded tip. The bending of the exfoliated flake in the region of the protrusion causes strain in the two-dimensional material, and so the formation of a quantum dot.

In devices similar to those shown in FIG. 5A, quantum emission has been observed in the two-dimensional material tungsten selenide (WSe$_2$) using protrusions having a height of around 120-140 nm. In an alternative device making use of tungsten disulphide (WS$_2$) as the layer of two-dimensional material, quantum emission has been observed from dots formed using protrusions having a height of around 170 nm. The full-width, half-maximum $W_{FWHM}$ of these protrusions was found to be around 250 nm. Measurement of the strain generated in these particular devices is estimated to be around 0.1-0.5% using optical measurements.

Figure 5B:
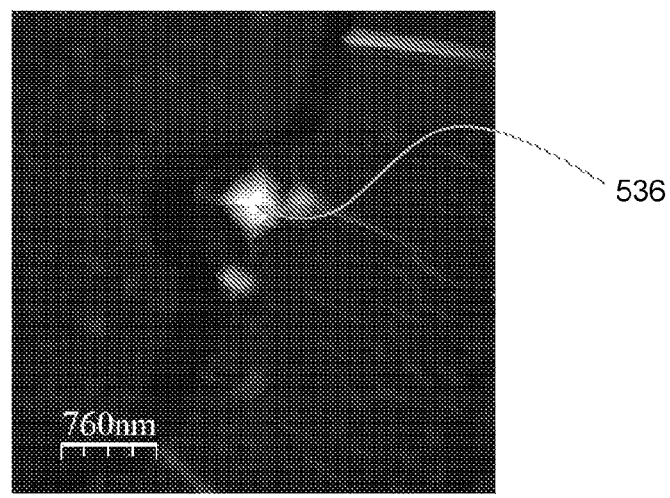
FIG. 5B is an AFM image of a quantum dot device formed by arrangement of nanocrystals on the substrate.

FIG. 5B shows an AFM image of a quantum dot device similar to the device of FIG. 2C. In this image, the quantum dot is formed in a layer of two-dimensional material comprising an exfoliated flake. The exfoliated flake is positioned on top of nanocrystals arranged at the surface of a substrate. The AFM image shows regions of increased height 536 in the exfoliated flake due to the presence of the nanocrystal underneath. A bright area in these regions indicates the presence of a quantum dot.

FIGS. 6A and 6B respectively show a bright and dark field microscope image of a WSe$_2$ exfoliated flake 614 arranged on pillars 610 patterned in a silicon substrate 612. The pillars are patterned having 3 micron separation and can be faintly seen across the whole surface of the substrate. In this image, the quantum dots are optically driven light emitters. The bright spots 644 observed in the dark field image of the exfoliated flake at FIG. 6B each represent a quantum dot emitter. It can be seen that a portion 640 of the exfoliated flake (marked with a cross, ✚, in white for contrast) comprises only a single monolayer of the two-dimensional material, whereas other portions of the flake comprise a second or a third monolayer. Quantum dots can be observed across the whole surface of the exfoliated flake.

In FIG. 6B, almost every pillar 612 patterned at the substrate surface 610 below the exfoliated flake 614 causes formation of a quantum dot. As such, a regularly spaced array of emitters is generated in the WSe$_2$ exfoliated flake and the positions of the quantum dots are very predictably located on the substrate. We note that the measured intensity correlation of the dots is around 0.2. This represents a good coherence for light emitted from the quantum dot emitters.

FIG. 7 shows a further dark-field microscopy image of a layer 714 of two-dimensional material (WSe$_2$) on a structured substrate 710 of silica-on-silicon. The protrusions or pillars 712 formed in the substrate are separated by 3 microns. Each of the bright spots shown in the image represents a quantum dot acting as an emitter (for instance, see region 744 in which each bright spot represents a separate quantum dot emitter). A clear grid or array of equally spaced quantum dot emitters can be observed. Initial measurements on devices such as those shown in FIGS. 6A, 6B and 7 reveal an approximately 50% rate of success for deterministic creation of quantum emitters.

The quantum dot devices described may be used with any two-dimensional material. In particular examples, a high yield of quantum dots have been observed in devices using tungsten selenide (WSe$_2$), molybdenum selenide (MoSe$_2$) and molybdenum disulphide (MoS$_2$). Furthermore, as the material properties of the substrate should not be altered by or effect the quantum dot generated in the described quantum dot device, many substrate materials could be used, either when forming the protrusions using patterned protrusions or when protrusions formed using nanocrystals. In particular, silicon, silicon dioxide or gallium arsenide could be used for the substrate.

Figure 8:
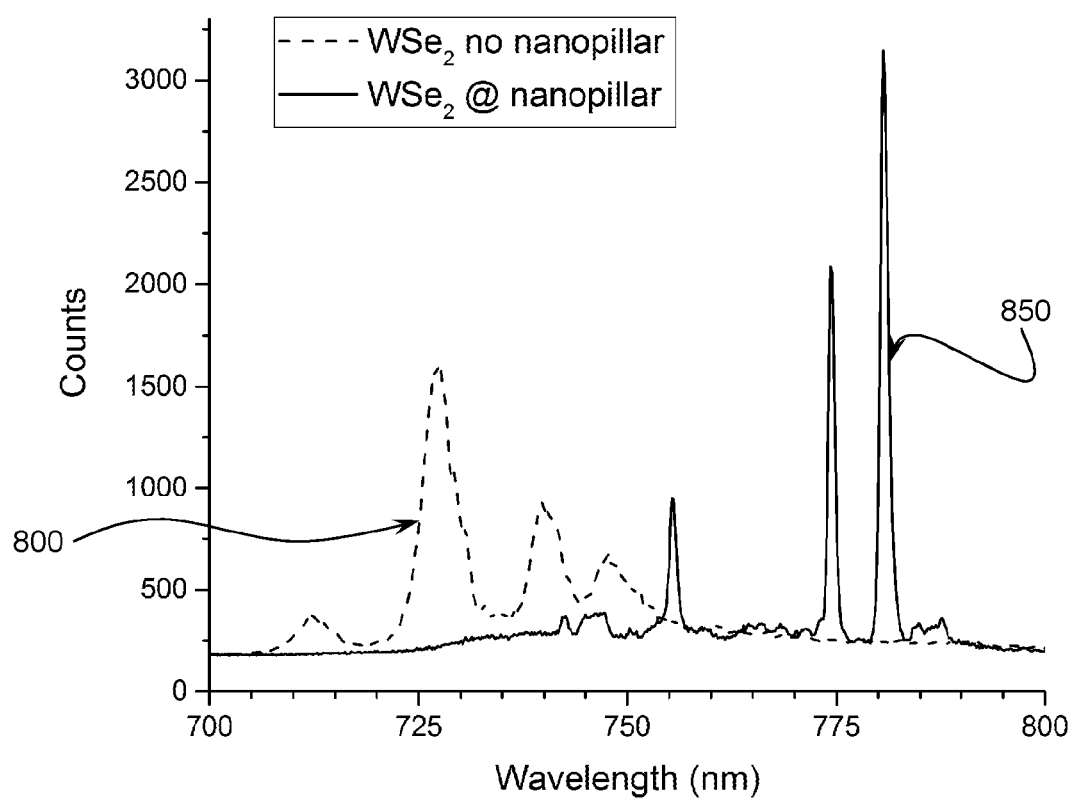
FIG. 8 is a plot of the photoemission spectra from an area of a two-dimensional layer in which strain is generated and a quantum dot is formed according to the present invention, and a plot of the photoemission spectra in an area of the two-dimensional layer in which no strain is present.

Further measurements of devices according to the claimed invention show spectral characteristics for the emitter including good wavelength homogeneity, brightness and lifetime for the quantum dot. FIG. 8 shows a photoemission spectra measured from a quantum dot device. The dashed line 800 shows a spectra measured in a region of the two-dimensional layer in which no protrusions are present on the substrate beneath. In other words, the dashed line 800 shows a spectra in a region of the two-dimensional material layer that is unstrained. It can be seen the spectra in this region does not show particularly sharp emission peaks. In comparison, the solid line trace 850 shows the spectra measured at a region of the layer of two-dimensional material arranged over a protrusion at the substrate. This region of the two-dimensional material exhibits localised strain forming a quantum dot. The measured spectra 850 in this region exhibits particularly sharp, well defined spectral peaks indicating the presence of a quantum dot.

Figure 9A:
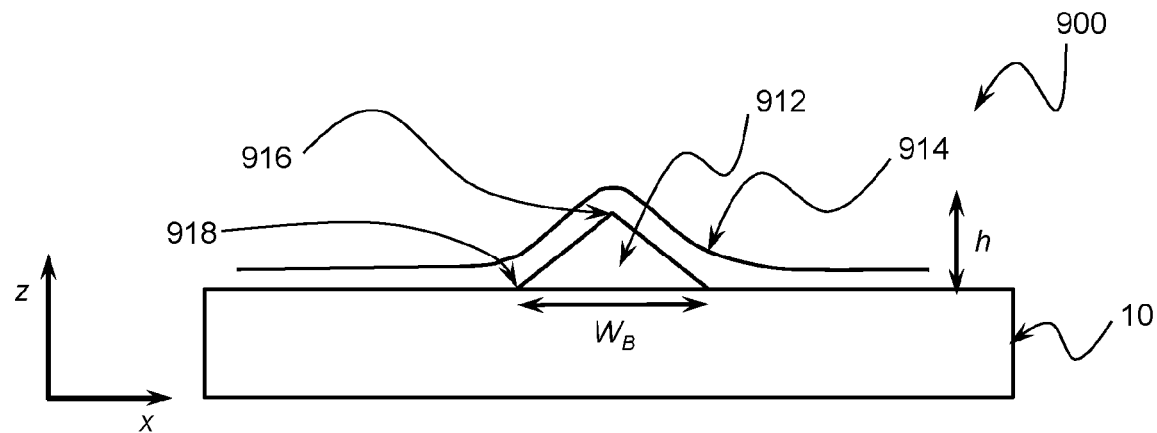
FIG. 9A is cross-sectional view of a quantum wire device.
Figure 9B:
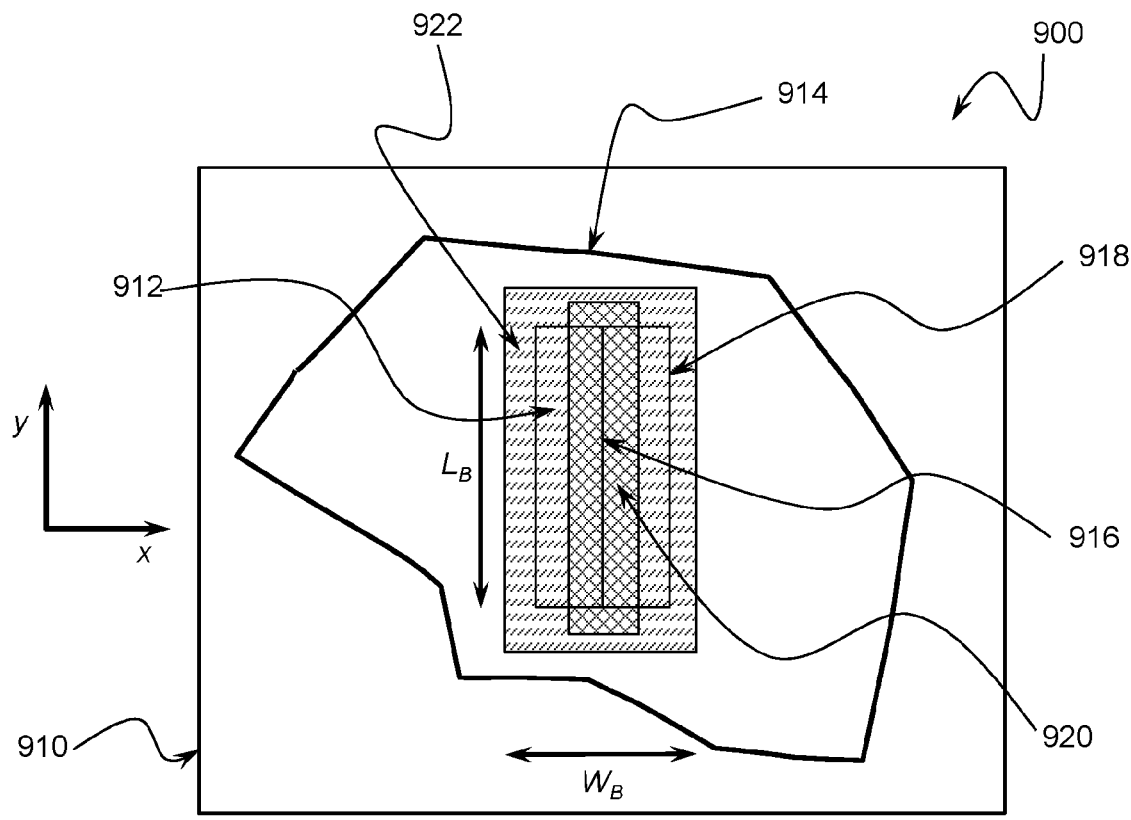
FIG. 9B is a plan view of the quantum wire device of FIG. 8A.

FIG. 9A shows a cross-sectional view of a quantum wire device 900. The device comprises a substrate 910, a protrusion 912 arranged on the substrate, and a layer of two-dimensional material 914. FIG. 9B shows a plan view of the device 900 illustrated in FIG. 9A.

As can be seen in FIGS. 9A and 9B, in this example the protrusion 912 is a ridge projecting from the surface of the substrate. The ridge 912 has a triangular cross-section, having wider base 918 than peak 916. The ridge has a length, $L_B$, that is much larger than either its width, $W_B$, or its height, h (in this case, $L_B$ and $W_B$ represent the length and width at the base of the protrusion or ridge). In the example shown, the width and length is measured in the plane of the substrate (the x- and y-axis respectively). The height of the ridge is measured perpendicular to the plane of the substrate (in the z-axis). The shape of the ridge forms a localised region of strain 922 in the layer of two-dimensional material that extends along the length of the ridge 912. Where the strain is sufficiently large, a quantum wire 920 is formed within the regions of strain 922 localised around the protrusion.

Although the device of FIGS. 9A and 9B show a layer of two-dimensional material 914 comprising a single monolayer, other embodiments can comprise more than one monolayer. Furthermore, although a ridge with a triangular cross-section is shown in FIGS. 9A and 9B, a ridge protrusion having any shape of cross-section may be used providing sufficient strain is generated in the layer of two-dimensional material. The amount of strain required will depend on the type of two-dimensional material and its thickness.

FIGS. 10A, 10B, 10C and 10D illustrate a process for manufacture of the quantum dot device 100 of the type illustrated in FIG. 2A. In a first step shown in FIG. 10A, a pattern can be formed in a photoresist layer 950 on the substrate 110 using e-beam or optical lithography.

Figure 10A:
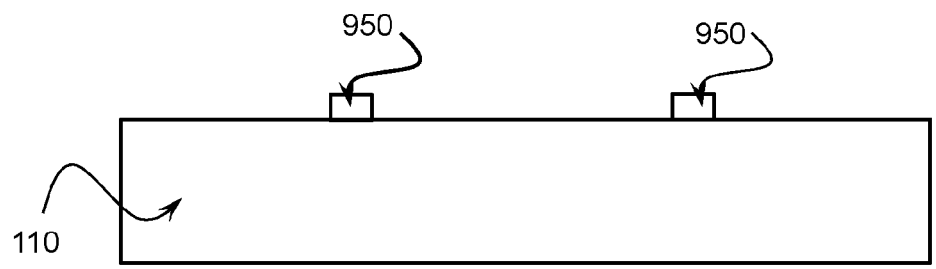
Figure 10B:
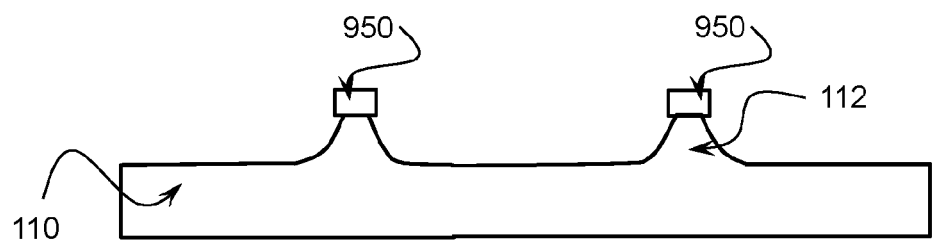

In FIG. 10B, the substrate 110 has been etched causing a portion of the exposed substrate surface to be removed. Regions of the substrate covered by the photoresist 950 are not etched, and so form protrusions 112 from the etched surface of the substrate 110. The sides of the protrusions or pillars 110 formed by etching may be relatively straight, sloped or curved dependent on the type of etching used. Etching may take place using wet or dry etching.

Figure 10C:
Figure 10D:
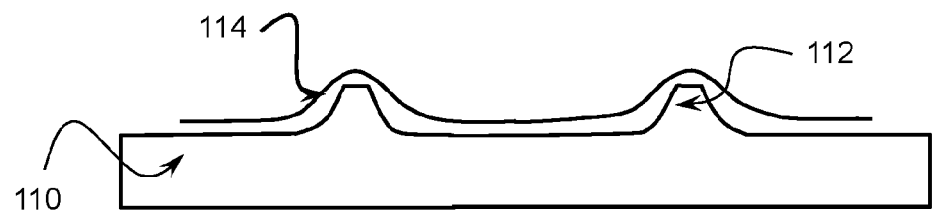

In a third step, the photoresist 950 can be removed from the etched substrate 110 as shown in FIG. 10C, thereby exposing the formed protrusions 112. Finally, as illustrated at FIG. 10D, an exfoliated flake of the two-dimensional material 114 may be arranged on the substrate 110 and protrusions 112. Quantum dots will occur in the regions of localised strain in the layer of two-dimensional material around the protrusions.

The skilled person will understand that a similar manufacture method described with reference to FIGS. 10A to 10D can be used to form protrusions in an epitaxial layer present on the substrate, in order to form the quantum dot device of FIGS. 3A and 3B. Furthermore, a similar manufacture method can be used to fabricate the quantum wire device shown in FIGS. 9A and 9B. To form a quantum wire, the photoresist is lithographically patterned to generate a ridge having a length greater than its width and height. Otherwise, the steps of manufacture will be the same as shown in FIGS. 10A to 10D.

Figure 11A:
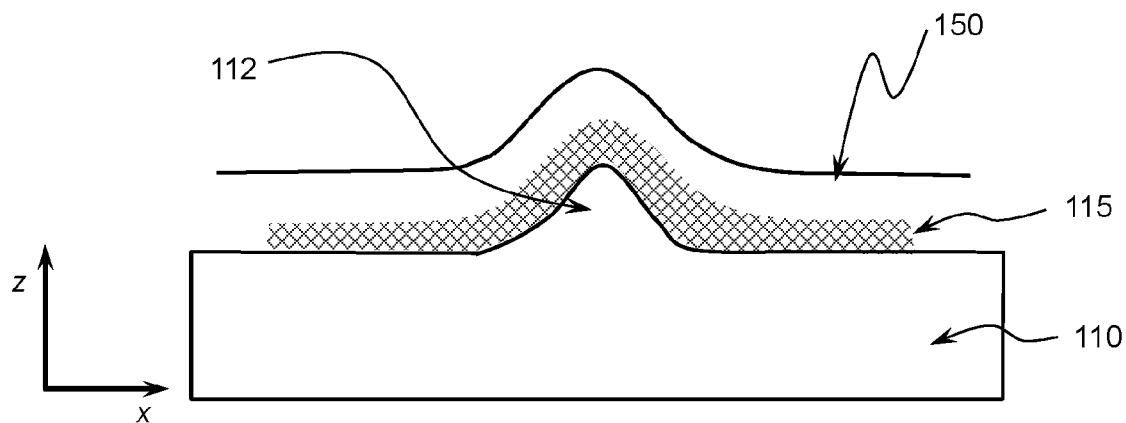
FIG. 11A is a cross-sectional view showing an example of a quantum dot device using a chemical vapour deposition (CVD) grown layer of two-dimensional material and protrusions etched into a substrate, as well as an encapsulating layer.
Figure 11B:
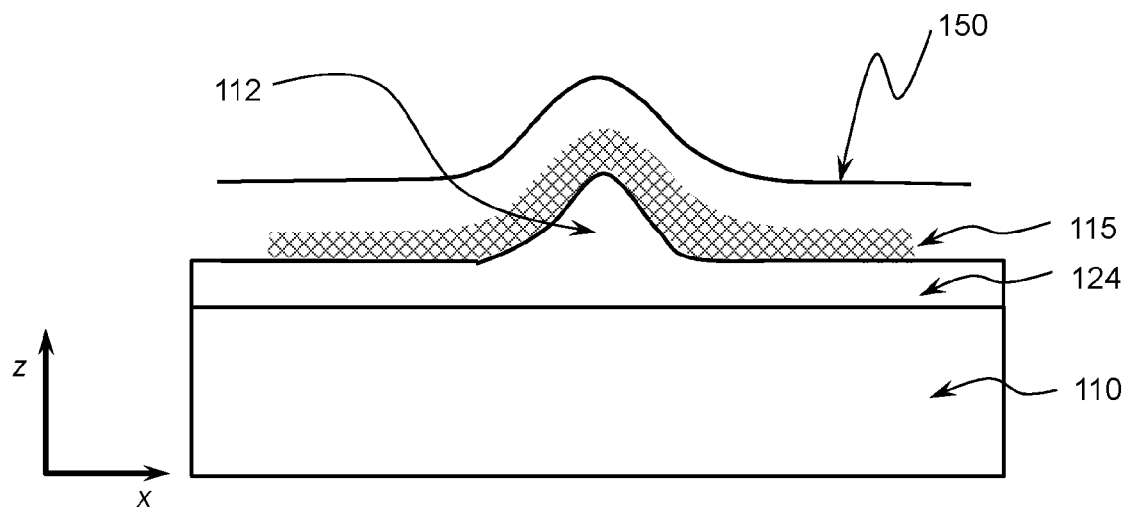
FIG. 11B is a cross-sectional view showing an example of a quantum dot device using a CVD grown layer of two-dimensional material and protrusions etched into an epitaxial layer on the substrate, as well as an encapsulating layer.

FIGS. 11A and 11B show cross-sectional views of further examples of a quantum dot device. The devices in FIGS.

11A and 11B are similar to the devices of FIGS. 3A, 3B and 3C, but further comprises a further layer, herein labelled an encapsulating layer 150.

As illustrated in FIG. 11A, a protrusion 112 is formed on a substrate 110, and a layer of two-dimensional material 115 is arranged on the protrusion and substrate. An encapsulating layer 150 is formed over the layer of two-dimensional material 115. The encapsulating layer 150 encapsulates and covers the layer of two-dimensional material 115, in order to provide a protective layer.

The example of FIG. 11B shows the protrusion 112 formed in the surface of an epitaxial layer 124. The epitaxial layer is formed on a substrate 110. A layer of two-dimensional material 115 is formed on the protrusion 112 and the epitaxial layer 124. An encapsulating layer 150 is formed on the layer of two-dimensional material 115.

As in previously described examples, arrangements of the layer of two-dimensional material on the protrusion results in a region of localised strain in the two-dimensional material, and so the formation of a quantum confined device (such as a quantum dot or quantum wire). Formation of an encapsulating layer on the layer of two-dimensional material gives various advantages including providing protection to the two-dimensional material and reducing degradation. Accordingly, use of the encapsulating layer results in a more stable and robust device. Use of an encapsulating layer also improves the optical properties of the device, as discussed further below. In addition, the encapsulating layer can act as a tunnel barrier to a quantum dot device in the layer of two-dimensional material, opening the possibility towards tunnel-coupled quantum devices (such as those described below).

In the examples of FIG. 11A and FIG. 11B, the layer of two-dimensional material 115 is formed by chemical vapour deposition (CVD), but could be formed by arrangement of an exfoliated flake of the two-dimensional material on the protrusion and substrate. Furthermore, the protrusion 112 is formed by etching the surface of the substrate or the epitaxial layer. However, alternatively the protrusion could be formed by the arrangement of a nanocrystal on the surface of the substrate or epitaxial layer.

In the examples of FIG. 11A and FIG. 11B, the encapsulating layer is shown as completely covering the layer of two-dimensional material. Although this may be preferable, in some cases the encapsulating layer may only cover the majority of the layer of two-dimensional material, or at least the portion of the two-dimensional material on the protrusion.

In a specific example, the devices of FIGS. 11A and 11B can be formed using a doped silicon substrate 110, a layer of two-dimensional material 115 formed by CVD deposited tungsten disulfide, and an encapsulating layer 150 of hexagonal boron nitride. In this example, the encapsulating layer of hexagonal boron nitride is therefore itself a layer of two-dimensional material.

In this way, the use of an encapsulating layer as demonstrated in FIGS. 11A and 11B forms a heterostructure comprising a stack of two-dimensional materials of different types. This type of structure is especially advantageous for use in applications and devices such as quantum emitters. In particular, the formation of a heterostructure where the layer of two-dimensional material comprising the quantum dot or quantum wire is embedded in layers of other types of materials allows for improved electrical interfacing and so better control of the quantum emitter.

Figure 12:
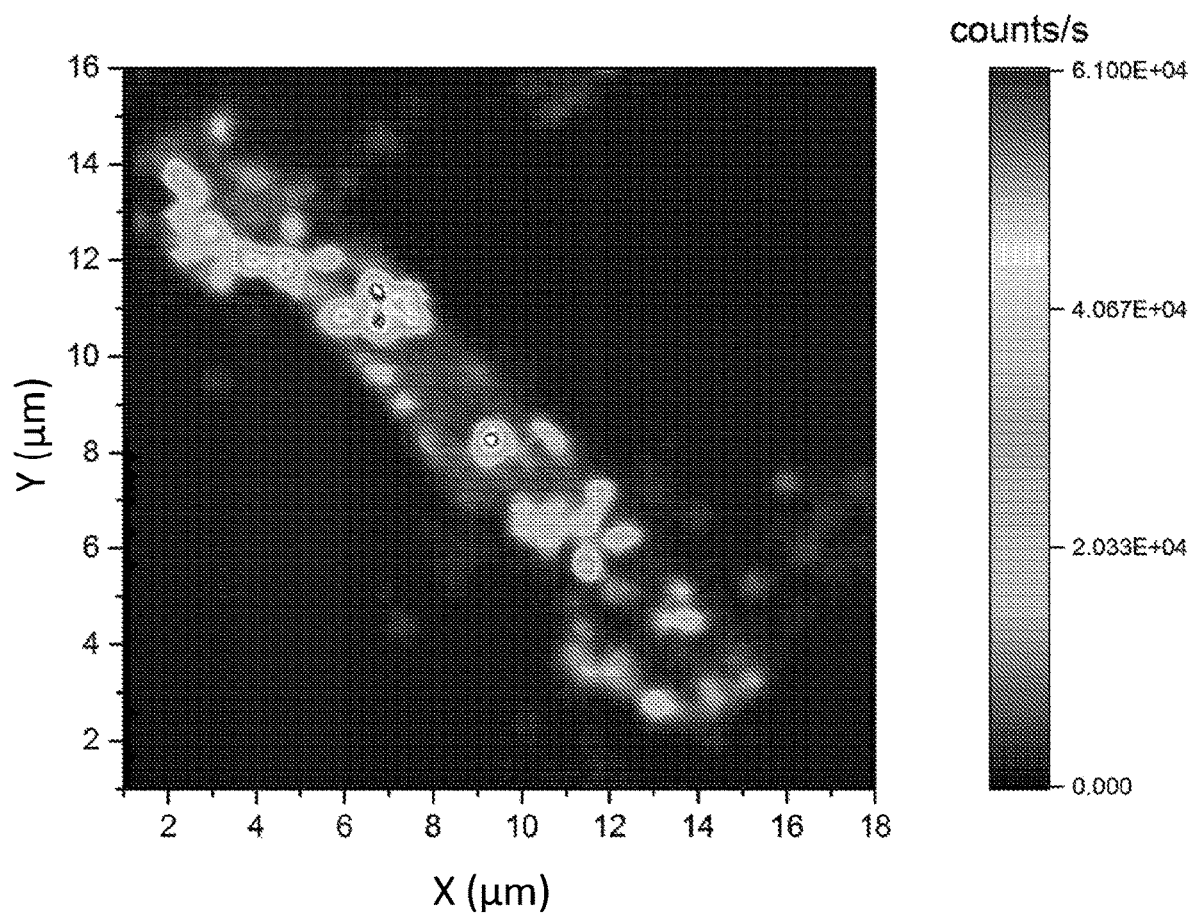
FIG. 12 shows a photoluminescence scan of a CVD grown monolayer of tungsten disulfide arranged on a pillar formed in the surface of an epitaxial layer, the monolayer of tungsten disulfide covered with an encapsulating layer of hexagonal boron nitride.
Figure 13:
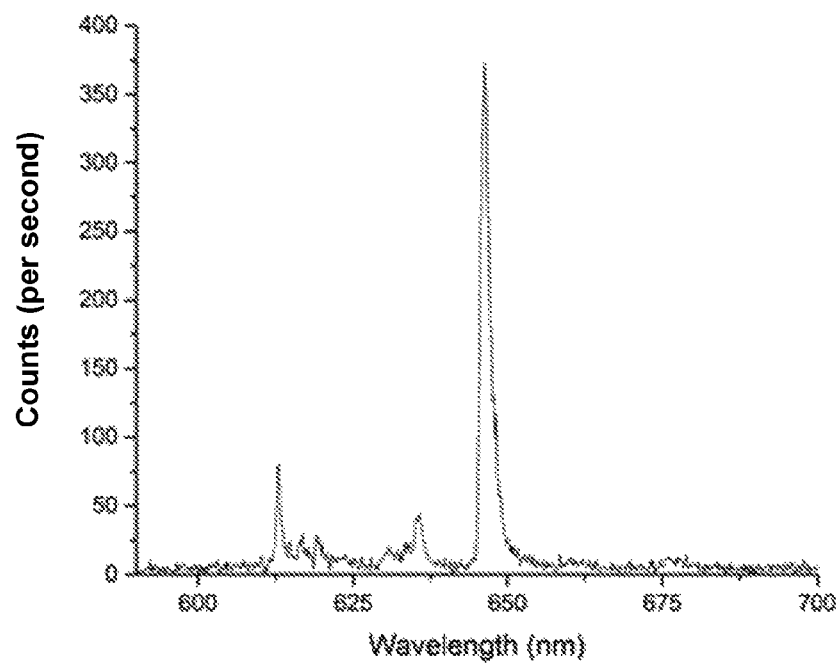
FIG. 13 shows a photoluminescence spectrum of a quantum emitter at the site of the pillar formed on the surface of the epitaxial layer in the device of FIG. 12.

FIG. 12 shows a photoluminescence scan of a quantum dot formed in a CVD deposited layer of the two-dimensional material tungsten disulfide, measured at 4 K. The quantum dot is formed at the site of a pillar etched into the substrate of the device, upon which the tungsten disulfide is arranged. The tungsten disulfide layer is encapsulated by a layer of hexagonal boron nitride. In this case, the quantum dot is acting as a quantum emitter. The quantum emitter of FIG. 12 demonstrates improved optical quality, brightness and a narrower spectral line width compared to a device in which the encapsulating layer is not present. Further improvements to the optical properties of device are evident in FIG. 13, which shows a spectra of the same quantum emitter at the site of the etched pillar (measured at 4 K). This spectra demonstrates a narrower spectral line width than compared to devices without an encapsulating layer.

Figure 14:
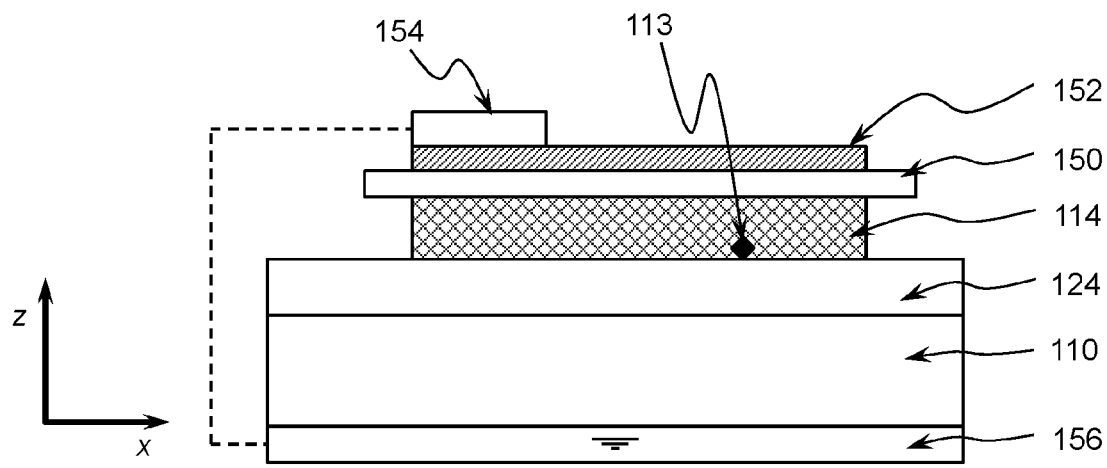
FIG. 14 is a cross-sectional view of a charge tunable quantum emitter device.
Figure 15:
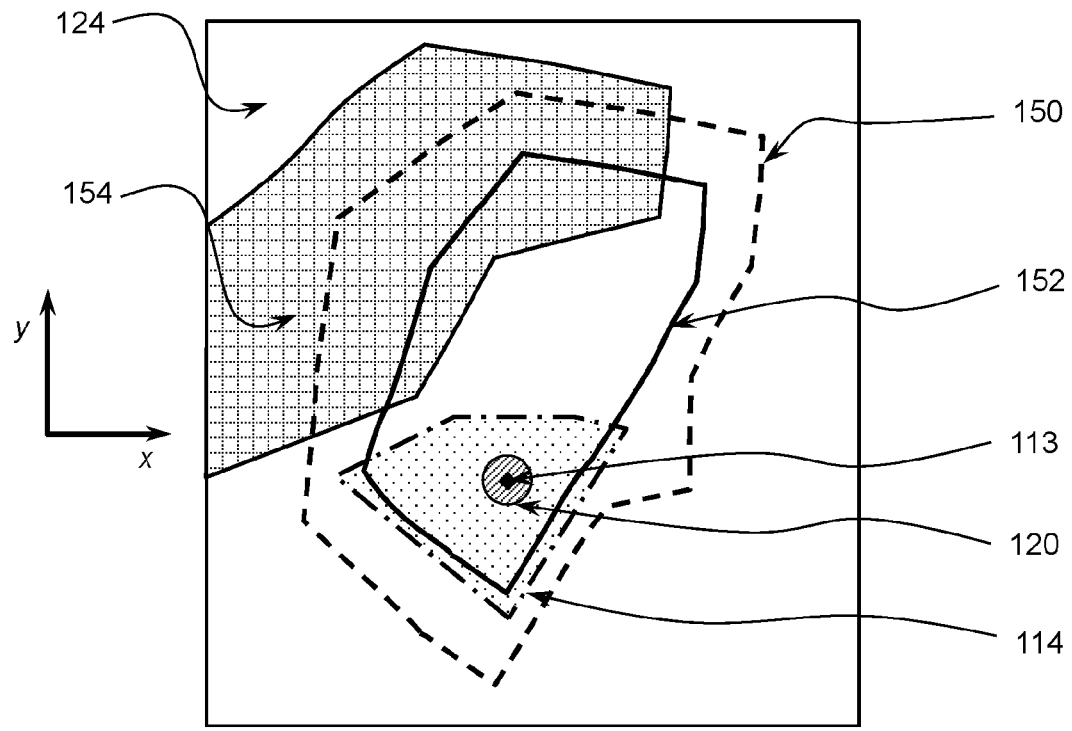
FIG. 15 is a plan view of the charge tunable quantum emitter device of FIG. 14.
Figure 16:
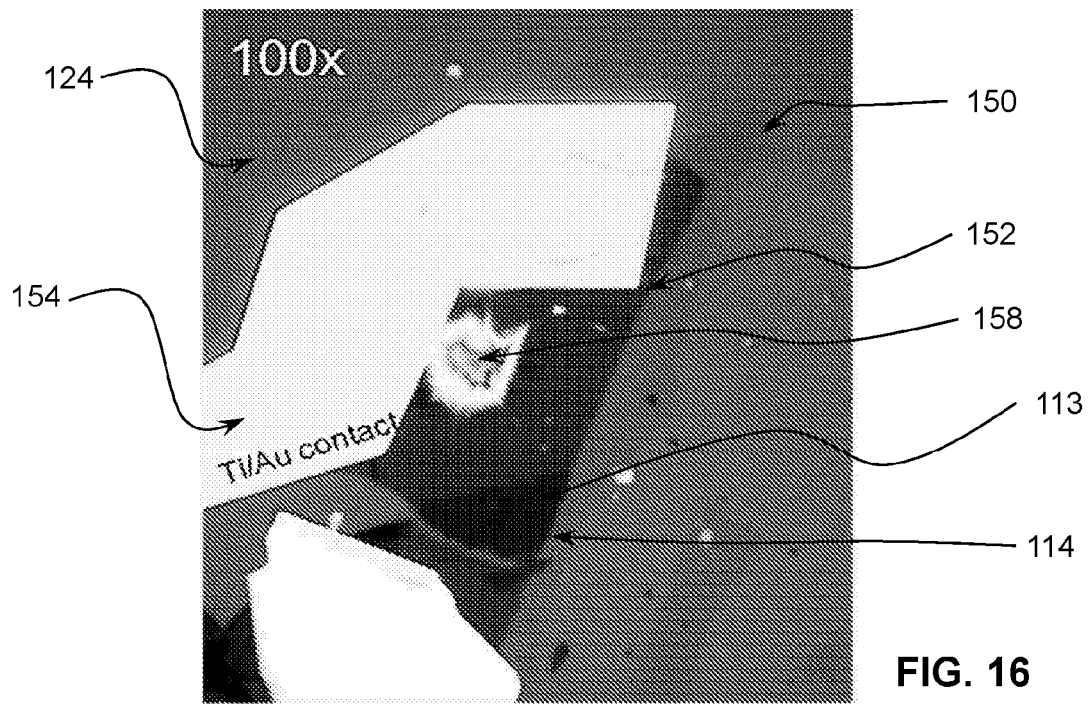
FIG. 16 is an optical microscope image of the charge tunable quantum emitter device of FIGS. 14 and 15.

FIGS. 14, 15 and 16 illustrate further examples of a quantum dot device according to the invention. In particular, the device of FIGS. 14, 15 and 16 is a charge-tunable quantum emitter device. FIG. 14 shows a cross-sectional view of the device, FIG. 15 shows a plane view of the same device, and FIG. 16 shows an optical microscope image of the device under 100 times magnification.

The device of FIGS. 14, 15 and 16 comprises an epitaxial layer 124 on a substrate 110. Arrangement of a nanocrystal 113 on the surface of the epitaxial layer 124 creates a protrusion. A layer of a two-dimensional material 114 is arranged on the nanocrystal. A further layer, the encapsulating layer 150, is formed over the layer of two-dimensional material 114. The encapsulating layer 150 encloses the layer of two-dimensional material 114 to provide a protective layer. A further single graphene layer 152 acts as an electrode and is arranged on the encapsulating layer 150, and a first metallic contact 154 is arranged on the single graphene layer 152. A second metallic contact 156 is formed on a back surface of the substrate 110.

The single graphene layer 152 acts as a surface gate electrode, to which a voltage can be applied via the metallic contact 154. Advantageously, the single graphene layer 152 is both transparent and flexible, and so allows light (for instance, emitted from the quantum dot in the layer of two-dimensional material 114) to be emitted from the surface of the device. In particular, use of the single graphene layer 152 permits measurement of the light emitted from the quantum dot, whilst also allowing application of a homogeneous bias over the whole of the device, making the whole device area functional.

As described in relation to previous examples, in the device of FIGS. 14, 15 and 16 strain is generated in the layer of two-dimensional material 114 in a region surrounding the nanocrystal 113 (the region of strain is shown as area 120 in FIG. 15, but is not to scale). The strain causes confinement of the band structure of the two-dimensional material in this region, and consequentially a quantum dot is formed. When a voltage is applied between the first and second metallic contacts, the quantum dot operates as a quantum emitter.

In the particular example of the device shown in FIG. 16, the substrate 110 is formed from highly n-doped silicon, with the epitaxial layer 124 formed from silicon dioxide. The layer of two-dimensional material 114 is an exfoliated flake comprising a single monolayer of a transition metal dichalcogenide (specifically, tungsten diselenide, $WSe_2$). The encapsulating layer 150 is itself an exfoliated flake of the two-dimensional material, in particular comprising around five monolayers of hexagonal boron nitride. The further layer 152 is formed by a single monolayer of graphene. Finally, the metallic contact 154 is formed of titanium gold alloy. In the image of FIG. 16 which is an optical image of a real device, the nanocrystals 113 are barely visible, due to their small size. Feature 158 is a dust particle, and does not form part of the device.

Figure 17:
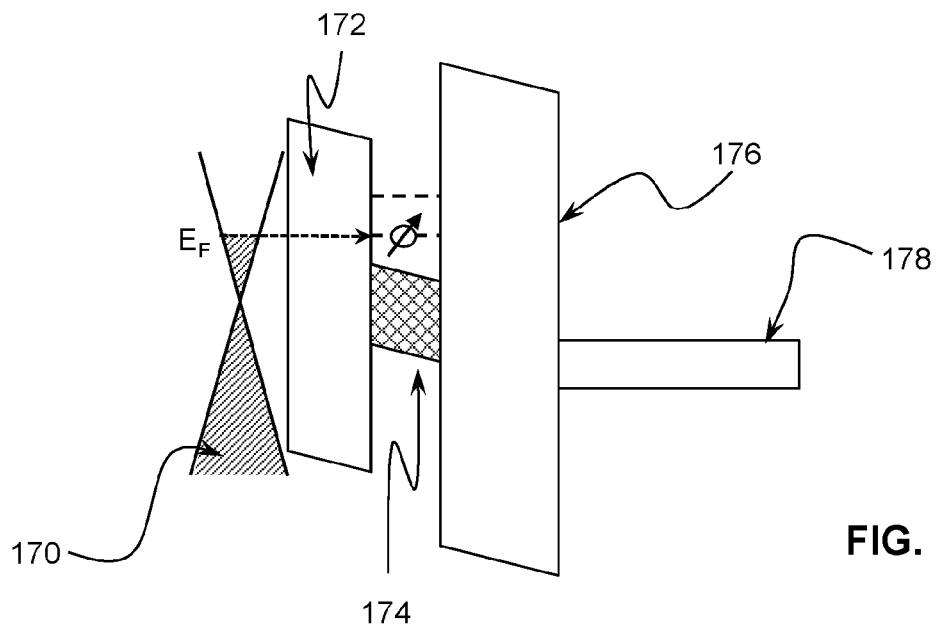
FIG. 17 is a schematic representation of the band structure of the charge tunable quantum emitter device of FIGS. 14 to 16.

As noted above, FIGS. 14, 15 and 16 illustrate a charge-tunable quantum emitter device. This can be understood with reference to the device band structure, represented in FIG. 17. The band structure of FIG. 17 includes a single graphene layer 170, which acts as an electrode, an encapsulating layer 172, a layer of two-dimensional material 174 in which a quantum dot is formed, an epitaxial layer 176 and a substrate 178. Considering the band structure of FIG. 17 with reference to the particular device of FIGS. 14, 15 and 16, the band gap of the tungsten diselenide two-dimensional material 174 is less than the band gap of both the adjoining, encapsulating layer of hexagonal boron nitride 172 and the adjoining epitaxial layer of silicon dioxide 176. Therefore, this band structure prevents an unwanted flow of current through the device upon application of a bias at the single graphene layer electrode 170. Note that, as shown in FIG. 17, the electrode formed of a single graphene layer has a zero band gap. Furthermore, encapsulating layer 172 directly adjoining the layer of two-dimensional material 174 acts as a tunnel barrier to the quantum dot in the layer of two-dimensional material 174.

A quantum dot is formed in the layer of two-dimensional material 174 as a result of strain caused by the presence of a protrusion. Specifically, the quantum confinement of excitons (i.e. the creation of the quantum dot) is caused by the strain in the (x, y) plane of the layer of two-dimensional material 174, and also by the intrinsic confinement in the z-direction as a result of the inherent properties of the two-dimensional material. The adjoining encapsulating layer 172 (for instance, of hexagon boron nitride) creates a tunnel barrier to the quantum dot, through which electrons (or holes) may pass into the quantum dot from the electrode layer 170.

As will be understood by the person skilled in the art, a quantum dot comprises discrete energy levels, which can be occupied by electrons (or holes). Under specific electrostatic configurations of a quantum dot device, electrons (or holes) may enter onto a quantum dot by tunnelling from a source or drain reservoir though a tunnel barrier. However, in electrostatic configurations where there is no tunnel coupling, a finite charge is confined on the dot. The electrons or (holes) have spin, so allowing electrons (or holes) confined within a quantum dot to be used as a qubit. Such qubits offer exciting future applications in quantum computing, for instance. Charge-tunable quantum emitter devices described herein may be particularly advantageous to be used as long lived stationary qubits.

Considering the band structure of FIG. 17, a voltage can be applied across the device (for example, by applying a bias between first and second contacts 154, 156 in FIG. 14, wherein the second contact 156 may be grounded). In FIG. 17, increasing the voltage across the device moves the Fermi level, $E_F$, of the electrode layer 170 compared to the discrete energy levels within the quantum dot. Tunnelling of electrons (or holes) may occur when the Fermi level, $E_F$, of the electrode layer 170 aligns with a discrete energy level within the quantum dot. Thus, when a first voltage is applied across the device, a first quantum dot energy level aligns with the Fermi level, $E_F$, of the electrode layer, and an electron may pass onto and occupy the first energy level within the dot. When a second, larger voltage is applied across the device, the Fermi level, $E_F$, of the electrode layer aligns with a second, higher energy level within the quantum dot, allowing an electron to pass on to the dot and occupy the second, higher energy level within the dot.

Figure 18:
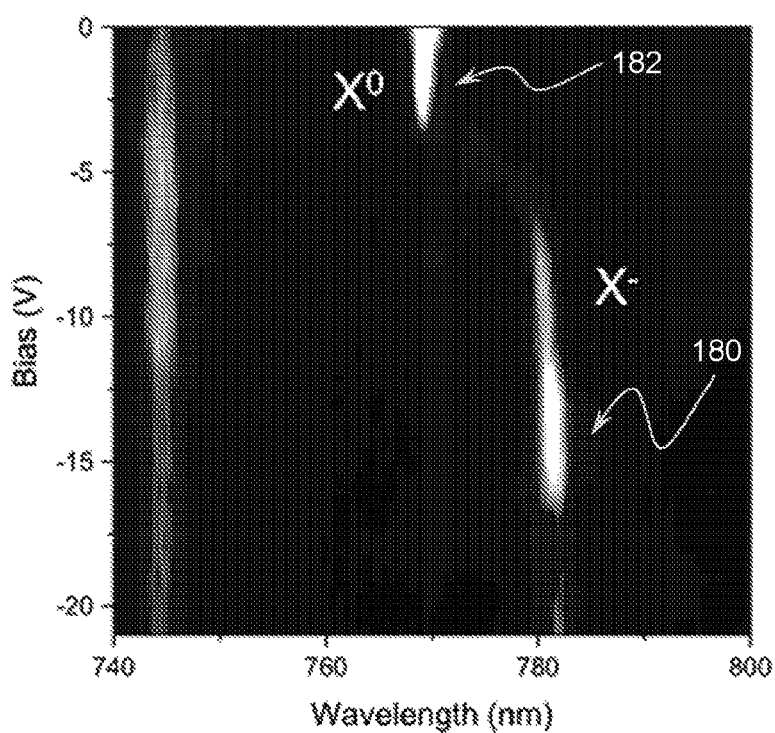
FIG. 18 is a quantum emission spectrum of the charge tunable quantum emitter device of FIGS. 14 to 17.

FIG. 18 shows a quantum emission spectrum exhibiting sharp steps in the wavelength of emission from the quantum emitter as the applied bias across the device is scanned. These steps are shown in FIG. 18 as bright areas 180, 182, which illustrate emission from the device at a given bias and having the given wavelength. In particular, it can be seen that two distinct wavelengths of light are emitted from the device at different, distinct applied bias.

The spectrum of FIG. 18 indicates tuning of the charge state of the quantum dot by controlling the applied voltage. In particular, the steps in the spectral emission result from relaxation between different occupied energy levels (or charge states) within the quantum dot. Specifically, the wavelength of emission increases as a result of relaxation of electrons (or holes) from higher energy levels within the quantum dot.

Figure 19:
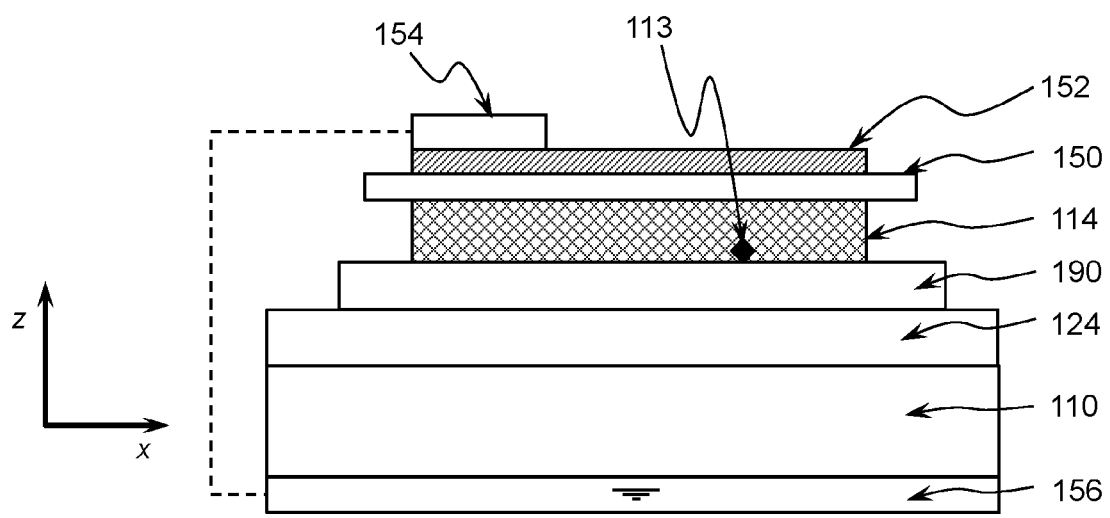
FIG. 19 is a cross-sectional view of a further example of a charge tuneable quantum emitter device.

Optionally, in a further, advantageous example based on the devices of FIGS. 14, 15, 16, an additional layer may be present. A device including the additional layer is illustrated in FIG. 19. The device of FIG. 19 shows the same layers as outlined in respect of FIG. 14, and like reference numerals are used for those common features. However, an additional layer 190 is also provided between the epitaxial layer 124 and the nanocrystal 113. The nanocrystal is then arranged on the additional layer 190 to form a protrusion, with the layer of two-dimensional material 114 arranged over the protrusion 113, the additional layer 190, the epitaxial layer 124 and the substrate 110, in a similar manner to that described above.

The additional layer 190 may have a number of benefits. In particular, the additional layer 190 may provide a flatter and cleaner surface on which to form the protrusion, with fewer charge traps or other characteristics than the epitaxial layer alone. This in turn can improve the electrical and optical characteristics of the device. The additional layer 190 can also help to better encapsulate the layer of two-dimensional material, together with the encapsulation layer 150.

Finally, by appropriate choice of material the bandgap of the additional layer 190 can be large so as to form a barrier to current through the device. For instance, use of an insulator material as the additional layer 190 prevents current flow between the two electrodes 154, 156. Therefore the additional layer 190 can be especially useful in the charge tuneable quantum emitter devices described herein. This is because the quantum dot can then be charged solely through the tunnel barrier formed by the relatively thin encapsulation layer 150, controlled by bias applied across the device, whilst the additional layer 190 helps to block a flow of current through the device.

In a specific example of the device of FIG. 19, the additional layer 190 can be a further layer of hexagonal boron nitride, arranged directly on the epitaxial layer 124, and upon which the protrusion is formed (for instance, by arrangement of a nanocrystal). In this example, the hexagonal boron nitride additional layer is a relatively thick layer, having a thickness of around 50-100 nm. This hexagonal boron layer protects the layer of two-dimensional material 114 in which a quantum dot is formed (for instance, a tungsten diselenide layer in FIG. 19) from direct contact with the epitaxial layer 124 (for instance, a silicon dioxide layer in FIG. 19). The silicon dioxide epitaxial layer 124 can be relatively 'dirty' and contain a number of charge traps which create electrical noise in the device. Advantageously, the additional layer of hexagonal boron nitride helps to reduce this electrical noise.

Moreover, the thick, additional layer 190 (for example, of hexagonal boron nitride) works together with the encapsulating layer 150 to enclose or encapsulate on all sides the layer of two-dimensional material 114 (for example, tungsten diselenide). In particular, hexagonal boron nitride is an atomically flat material, and so the thick, additional layer provides a flat surface on which to form the protrusion 113 and arrange the layer of two-dimensional material 114. This improves non-radiative recombination and reduces sources of uncontrolled strain in the two-dimensional material (in other words, sources of strain beyond that caused by the protrusion).

Although hexagonal boron nitride is discussed herein for use with the additional layer 190, it will be understood that other material can be used.

As discussed in detail above, a two-dimensional material is a class of materials that is distinct from a thin layer of a material having an inherently three dimensional crystalline structure. Throughout this specification, a two-dimensional material is intended to mean a material which has an inherently two-dimensional crystalline structure. For instance, a two-dimensional material may be able to be exfoliated down to a single monolayer. Two-dimensional materials have a number of inherent properties. In particular, in a two-dimensional material atoms are chemically bonded only within the plane of each monolayer or sheet, so that no chemical bonds are formed between monolayers or sheets. In an idealised, clean two-dimensional material, no dangling bonds are found in the monolayer, except at the outer edge or perimeter of the planar monolayer or sheet.

As noted in relation to the devices of FIGS. 11A to 18, functional heterostructures can be formed by stacking one or more monolayers of more than one type of two-dimensional material. For instance, a heterostructure is formed by the epitaxial layer, the additional layer, the layer of two-dimensional material, the encapsulating layer and the electrode layer described in relation to FIG. 19. These types of heterostructures enable new routes towards tunnel-coupled quantum devices, such as the charge tuneable quantum emitters described above. Some layers with the heterostructure are formed from one or more monolayers of two-dimensional material Nevertheless, although forming part of a heterostructure each type of two-dimensional material is within the class of two-dimensional materials having the distinct properties described above.

Many combinations, modifications, or alterations to the features of the above embodiments will be readily apparent to the skilled person and are intended to form part of the invention. Any of the features described specifically relating to one embodiment or example may be used in any other embodiment by making the appropriate changes.

As illustrated in relation to the figures, the sizes of layers or regions are exaggerated for illustrative purposes and are provided to illustrate the general structures of the present invention. It will be understood that when an element such as a layer, region or substrate is referred to as being "on" another element, it can be directly on the other element or other intervening elements or layers may also be present. Although certain elements in the described specific embodiments are shown as being directly on another layer, it will be understood that a number of the advantages describes in relation to those elements would still be offered even if intervening layers were present.

Further description and illustrative examples of the invention are provided in Annex A. Portions of Annex A has have published (in colour) as journal article Nature Communication, 8:15093 (2017), titled "Large-scale quantum-emitter arrays in atomically thin semiconductors".

ANNEX A

Large-Scale Quantum-Emitter Arrays in Atomically Thin Semiconductors

Carmen Palacios-Berraquero[†1], Dhiren M. Kara[†1], Alejandro R.-P. Montblanch[1], Matteo Barbone[1,2], Pawel Latawiec[3], Dubee Yoon[2], Anna K. Ott[2], Marko Loncar[3], Andrea C. Ferran[2+] and Mete Atature[1\]

[1]Cavendish Laboratory, University of Cambridge, J J Thomson Ave., Cambridge CB3 0HE, UK

[2]Cambridge Graphene Centre, University of Cambridge, Cambridge CB3 0FA, UK

[3]John A. Paulson School of Engineering and Applied Science, Harvard University, 29 Oxford Street, Cambridge Mass. 02138, USA

[†]These authors contributed equally to this work.

The flourishing field of two-dimensional (2D) nanophotonics[1-4] has generated much excitement in the quantum technologies community after the identification of quantum emitters (QEs) in layered materials (LMS)[5-10]. LMs offer many advantages as platforms for quantum circuits[4,11], such as integration within hybrid technologies[11], valley degree of freedom[12-14] and strong spin-orbit coupling[15]. QEs in LMs, however, suffer from uncontrolled occurrences, added to the uncertainty over their origin, which has been linked to defects[5-10] and strain gradients[16-18]. Here, we report a scalable method to create arrays of single-photon emitting QES in tungsten diselenide ($WSe_2$) and tungsten disulphide ($WS_2$) using a nanopatterned silica substrate. We obtain devices with QE numbers in the range of hundreds, limited only by the flake size, and a QE yield approaching unity. The overall quality of these deterministic QEs surpasses that of their randomly appearing counterparts, with spectral wanderings of ~0.1 meV—an order of magnitude lower than previous reports[5-9]. Our technique solves the scalability challenge for LM based quantum photonic devices.

In order to create large-scale QE arrays in LMs, we subject the active material to patterned structures fabricated on the substrate in order to create spatially localised physical disturbances to the otherwise flat LM flakes. To this end, we first pattern arrays of nanopillars of different heights, ranging from 60 to 190 nm, on silica substrates using electron beam lithography. FIG. 20a, shows a scanning electron microscope (SEM) image of one such substrate of 130-nm nanopillar height. We place layers of and $WSe_2$ on $WS_2$ on the nanopillars as follows. Bulk $WSe_2$ and $WS_2$ crystals are characterized prior to exfoliation as described in our previous work[19]. These are then exfoliated on a polydimethylsiloxane (PDMS) layer by micromechanical cleavage[20,21]. Single layer (1L) samples are identified first by optical contrast[22], and the selected 1L-$WSe_2$ and 1L-$WS_2$ flakes are then placed onto the patterned nanopillar substrate via an all-dry viscoelastic transfer technique due to their higher adhesion to $SiO_2$[23], as schematically shown in FIG. 20b. After exfoliation and transfer, the 1L-$WSe_2$ and 1L-$WS_2$ flakes are characterized by Raman spectroscopy[24,25], photoluminescence (PL)[26] and atomic force microscopy (AFM), confirming the transfer and that the process does not damage the samples (see Supplementary Section 1 for the corresponding spectra and discussion). FIG. 20c is an AFM scan of a 1L-$WSe_2$ flake over a single nanopillar. The bottom panel of FIG. 20c plots the height profile of the 1L-$WSe_2$ flake taken along the dashed pink line. This reveals how the flake (solid pink line) tents over the nanopillar. The blue-shaded area corresponds to the measured profile of a bare nanopillar. FIG. 20d is a dark field optical microscopy (DFM) image of part of a 43,000 µm² 1L-WSe₂ flake on a substrate patterned with a 4-µm-spaced nanopillar array with nominal height of 130 nm. The regularly spaced bright spots correspond to nanopillar sites. We see locations providing brighter scattering (two examples are encircled in pink) and others showing fainter intensity (two examples are encircled in blue). By correlating with AFM measurements we find that the former correspond to locations where the 1L-WSe₂ tents over the nanopillars and the latter correspond to locations where the flake is pierced by the nanopillars (see Supplementary Section 2). On average, we find that ⅔ of the sites are not pierced during the deposition step.

FIG. 21a is an integrated raster scan map of PL emission at ~10 K of six adjacent non-pierced nanopillar sites in the region enclosed by the green dashed line in FIG. 20d. The most prominent feature is the ~×10 increase in intensity at the location of every nanopillar. FIG. 21b reveals the source of this emission intensity enhancement: spectra taken at each nanopillar location display bright sub-nanometre linewidth emission peaks. FIG. 21c demonstrates the single-photon nature of this emission via photon-correlation measurements taken (from left to right) at the first, third and fourth nanopillar locations. 10-nm bandpass filters, indicated by the pink, green and blue highlighted areas in the panels of FIG. 21b, select the spectral windows for the photon-correlation measurements. We obtain $g^{(2)}(0)$ values of 0.0868±0.0645, 0.170±0.021 and 0.182±0.028, respectively, uncorrected for background emission or detector response. While these values already surpass those in previous reports[5-9], we expect the quality of the single-photon emission from the QEs to improve under resonant excitation[27]. Of the 53 unpierced nanopillar sites in this substrate we found sub-nm emission peaks in 51 of them giving ~96% yield in QE generation. Their emission wavelength ranges between 730 nm and 820 nm (see Supplementary Section 3 for statistics), equivalent to a redshift distributed between 50 and 280 meV from the unbound exciton emission energy at ~1.755 eV[28], as observed for the naturally occurring QEs in WSe₂[5-9]. The fine-structure splitting (200-730 µeV) and the emission linewidths as narrow as ~180 µeV (~0.08 nm) are also consistent with previous reports (see Supplementary Section 3) advocating that these deterministically created QEs are of the same nature as the randomly appearing ones.

To study the effect of nanopillar height, we carry out similar optical measurements of 1L-WSe₂ flakes deposited on nanopillars of height ~60 nm and ~190 nm. The spectra taken at the 60-nm nanopillars have multiple peaks of ~1-nm linewidth on average (see Supplementary Section 3 for example spectra). In contrast, FIG. 21d is a representative spectrum taken from the 190-nm nanopillars, displaying a better isolated, single sub-nm emission peak. The inset reveals a 722-µeV fine-structure splitting for this QE. We do not see clear nanopillar height dependence in the emission wavelength and fine-structure splitting (see Supplementary Section 3 for statistics). However, increasing the nanopillar height does reduce the spread in the number of peaks arising at each location. We verify this trend in FIG. 21e, a histogram of the probability that a given number of sub-nm emission peaks appear per nanopillar, for the different nanopillar heights (60, 130 and 190 nm in white, blue and purple, respectively). The likelihood of creating a single QE grows as nanopillar height is increased. For the 190-nm nanopillars, 50% of all nanopillar sites host a single QE with one emission peak, as indicated by the purple bars. Spectral wandering of the peaks as a function of time also displays a strong dependence on the nanopillar height. To quantify this dependence, we record the maximum range of emission wavelength wandering per QE over tens of seconds. The solid black circles in FIG. 21f correspond to the mean of these values for each group of QEs pertaining to each nanopillar height, for 17 different QEs in total, with the error bars displaying the variance of these distributions. We observe a reduction from a few meV for 60-nm height nanopillars to below 0.25 meV (average) for the tallest 190-nm nanopillars (see Supplementary Section 4), reaching as low as 0.1 meV. To the best of our knowledge, this is the lowest spectral wandering seen in LM QEs[5-9]. Hence, these deterministic QEs are comparable, and even superior, in spectral stability to their randomly appearing counterparts. The dependence of certain QE characteristics on nanopillar height, along with shifts in the delocalised neutral exciton peak ($X^0$) at room temperature[26] at the nanopillar locations (see Supplementary Section 5), suggest that a localised strain gradient induced by the nanopillars may be playing an active role in producing QEs, as well as determining their specific optical properties[16-18].

The method we present for QE creation is not restricted to a specific LM. We predict a similar effect on different LMs and test this by using 1L-WS₂. FIG. 22a shows an integrated PL intensity raster scan map taken at ~10 K of a 1L-WS₂ on a substrate with 170-nm-high nanopillars square array spaced by 3 µm. The inset shows a true-colour DFM image of the same flake, where the red areas (due to fluorescence) are 1L-WS₂. Once again, the brighter spots correspond to the unpierced nanopillar locations, as verified by AFM measurements, and show clear overlap with the bright fluorescence spots in the PL intensity image where, similar to WSe₂, intensity is increased (here by a factor ~4) at every one of the 22 non-pierced nanopillar sites in the flake. Panel 1 of FIG. 22b shows the typical 1L-WS₂ emission spectrum at ~10 K[19], measured from a flat region of the same flake away from the nanopillars. The $X^0$ and $X^-$ unbound excitons are labelled in the figure, while the broad red-shifted emission band arises from weakly localised or defect-related excitons in the monolayer at low temperatures[19], and is present in this material regardless of location. Panels 2 and 3 of FIG. 22b show representative PL emission spectra taken at nanopillars of heights ~170 and ~190 nm, respectively, where once again sub-nm spectral features arise. We also note that we observe fine-structure splitting for WS₂ in these QEs, which range from 300 to 810 µeV (see Supplementary Section 6), as represented in the panel insets corresponding to the spectral regions highlighted in red. We also measure the spectrum of several WS₂ QEs as a function of time (see Supplementary Section 6) and find all spectral wandering values below 0.5 meV over 1-2 minutes. FIG. 22c shows statistics on QE emission wavelength collected for over ~80 QEs for 1L-WS₂ on 170-nm (white bars) and 190-nm (red bars) nanopillars. The wavelength distribution of the sub-nm emission lines, typically in the 610-680 nm region (53-300 meV redshift from $X^0$)[19], is as narrow as ~20 nm for the 190-nm nanopillars. Most nanopillar sites on WS₂ show multiple sub-nm lines, suggesting the creation of several QEs at each site for these nanopillar heights. FIG. 22d plots a histogram of the number of sub-nm peaks appearing at each nanopillar for both nanopillar heights. The trend is similar to that seen to WSe₂, where higher nanopillars lead to a narrower spread in the number of peaks towards a higher likelihood of creating a single QE at each nanopillar site. We note that we obtain a 95% yield of QE creation in 1L-WS₂ on non-pierced nanopillars. Further, ~75% of these display two or less sub-nm emission peaks. In contrast, the 60-nm and the 130-nm-high nanopillars do not result in any QE occurrence (see Supplementary Section 7 for examples of these measurements). This strong dependence of QE creation on nanopillar height further points towards a potentially critical role played by local strain. Despite previous efforts to measure QEs in 1L-WS$_2$, there has only been one previous report of single-photon emission in this material[19]. These results suggest that the rarity of QEs in exfoliated WS$_2$ flakes on flat substrates might indeed be due to the lack of sufficient deformation, provided here by tall nanopillars.

We presented a simple method for the deterministic creation of scalable arrays of quantum-light emitters embedded in LMs emitting at different regions of the optical spectrum. The reliability of the technique will accelerate experimental studies of QEs in TMDs, which at present rely on their rather rare and random occurrence[5-9]. In the immediate future, a detailed study is necessary in order to achieve a better understanding of the specific role of nanopillar height and geometry in defining the characteristics of the quantum emission. We expect tunability of the optical emission by varying the shapes of the underlying nanostructures. In this respect, interesting possibilities to realise dynamical circuits using micro-electro-mechanical systems and piezoelectric tuning exist. Heterostructures may enable new routes towards tunnel-coupled quantum devices and the formation of QE molecules. Several approaches are being investigated for the production of wafer-scale samples[29,30], which could lead to rapid optimisation. While our approach is already compatible with standard silicon processing techniques, it is nevertheless not restricted to the specific properties of the substrate. In fact, even nanodiamonds of the appropriate dimensions, drop-casted onto silica substrates, are able to create QEs in 1L-WSe$_2$ (see Supplementary Section 8). The flexibility in the choice of substrate, in turn, provides an opportunity to create hybrid quantum devices where LM QEs can be coupled to quantum systems in other materials such as spins in diamond and silicon carbide.

Methods

Substrate Preparation: The silica nanopillar substrate is fabricated with a high-resolution direct-write lithographic process via spin-on-glass polymer hydrogen silsesquioxane (HSQ)[31]. First, a wafer with 2 μm thermal oxide is cleaved and then cleaned. HSQ resist (FOx-16, Dow-Corning) is diluted with methyl isobutyl ketone (MIBK) in different ratios and spun onto the substrate, giving variable thickness depending on the dilution. After baking at 90° C. for 5 minutes, the substrate is exposed in an electron beam lithography tool (Elionix F-125) and then developed in a 25% solution of tetramethyl ammonium hydroxide (TMAH) developer and rinsed in methanol. To convert the defined structures into pure SiO$_2$, we apply rapid thermal annealing at 1000° C. in an oxygen atmosphere[32], resulting in arrays of sharply-defined sub-100 nm silica nanopillars.

Optical Measurements: Room temperature Raman and PL measurements are carried out using a Horiba LabRam HR Evolution microspectometre equipped with a ×100 objective (numerical aperture 0.9) and a spot size <1 μm. The pixel-to-pixel spectral resolution for the Raman measurements is ~0.5 cm$^{-1}$. Bragg gratings (BraggGrate) are used to detect the ultralow frequency Raman peaks. The power is kept below 50 μW to prevent heating effects. The excitation wavelength used is 514.5 nm for WSe$_2$ and 457 nm for WS$_2$.

A variable-temperature helium flow cryostat (Oxford Instruments Microstat HiRes2) is used to perform low-temperature PL measurements. These PL measurements are performed using a home-built confocal microscope mounted on a three-axis stage (Physik Instrumente M-405DG) with a 5-cm travel range, 200-nm resolution for coarse alignment and a piezo scanning mirror (Physik Instrumente S-334) for high-resolution raster scans. PL is collected using a 1.7-mm working distance objective with a numerical aperture of 0.7 (Nikon S Plan Fluor ×60) and detected on a fibre-coupled single-photon-counting module (PerkinElmer: SPCM-AQRH). Photon correlations from a Hanbury Brown and Twiss interferometer are recorded with a time-to-digital converter (quTAU). A double grating spectrometer (Princeton Instruments) is used for acquiring spectra. For PL measurements, the excitation laser (532 nm, Thorlabs MCLS1) is suppressed with a long pass filter (550 nm Thorlabs FEL0550).

Acknowledgements

We acknowledge financial support from the Marie Sklodowska-Curie Actions Spin-NANO, Grant No. 676108, EU Graphene Flagship, ERC Grants Hetero2D and PHOENICS, EPSRC Grants EP/K01711X/1, EP/K017144/1, EP/N010345/1, EP/M507799/1, EPL016087/1, Quantum Technology Hub NQIT EP/M013243/1, the EPSRC Cambridge NanoDTC, Graphene Technology CDT, EP/G037221/1, and the STC Center for Integrated Quantum Materials (NSF Grant No. DMR-1231319). We would like to thank H. S. Knowles and P. Borisova for technical assistance.

REFERENCES

1. Bonaccorso, F., Sun, Z., Hasan, T. & Ferrari, A. C. Graphene photonics and optoelectronics. *Nat. Photonics* 4, 611-622 (2010).
2. Koppens, F. H. L. et al. Photodetectors based on graphene, other two-dimensional materials and hybrid systems. *Nat. Nanotechnol.* 9, 780-793 (2014).
3. Ferrari, A. C. Science and technology roadmap for graphene, related two-dimensional crystals, hybrid systems. *Nanoscale* 7, 4598-4810 (2014).
4. Xia, F., Wang, H., Xiao, D., Dubey, M. & Ramasubramaniam, A. Two-dimensional material nanophotonics. *Nat. Photonics* 8, 899-907 (2014).
5. Tonndorf, P. et al. Single-photon emission from localized excitons in an atomically thin semiconductor. *Optica* 2, 347 (2015).
6. Srivastava, A. et al. Optically active quantum dots in monolayer WSe$_2$. *Nat. Nanotechnol.* 10, 491-496 (2015).
7. He, Y.-M. et al. Single quantum emitters monolayer semiconductors. *Nat. Nanotechnol.* 10, 497-502 (2015).
8. Koperski, M. et al. Single photon emitters in exfoliated WSe$_2$ structures. *Nat. Nanotechnol.* 10, 503-506 (2015).
9. Chakraborty, C. Kinnischtzke, L., Goodfellow, K. M., Beams, R & Vamivakas, A. N. Voltage-controlled quantum light from an atomically thin semiconductor. *Nat. Nanotechnol.* 10, 507-511 (2015).
10. Tran, T. T., Bray, K., Ford, M. J., Toth, M. & Abaronovich, I. Quantum emission from hexagonal boron nitride monolayers. *Nat. Nanotechnol.* 11, 37-41 (2015).
11. Majumdar, A. et al. Hybrid 2D Material Nanophotonics: A Scalable Platform for Low-Power Nonlinear and Quantum Optics. *ACS Photonics* 2, 1160-1166 (2015).
12. Cao, T. et al. Valley-selective circular dichroism of monolayer molybdenum disulphide. *Nat. Commun.* 3, 887 (2012).
13. Zeng, H., Dai, J., Yao, W., Xiao, D. & Cui, X. Valley polarization in MoS$_2$ monolayers by optical pumping. *Nat. Nanotechnol.* 7, 490-493 (2012).

14. Mak, K. F., He, K., Shan, J. & Heinz, T. F. Control of valley polarization in monolayer $MoS_2$ by optical helicity. *Nat. Nanotechnol*, 7, 494-498 (2012).
15. Kormános, A., Zólyomi, V., Drummond, N. D. & Burkard, G. Spin-orbit coupling, quantum dots, and qubits in monolayer transition metal dichalcogenides. *Phys. Rev. X* 4, 1-16 (2014).
16. Kumar, S., Kaczmarczyk, A. & Gerardot, B. D. Strain-Induced Spatial and Spectral Isolation of Quantum Emitters in Mono- and Bilayer Wse2. *Nano Lett.* 15, 7567-7573 (2015).
17. Branny, A. et al. Discrete quantum dot like emitters in monolayer $MoSe_2$: Spatial mapping, magneto-optics, and charge tuning. *Appl. Phys. Lett.* 108, 142101 (2016).
18. Kern, J. et al. Nanoscale Positioning of Single-Photon Emitters in Atomically Thin $WSe_2$. *Adv. Mater.* (2016). doi:10.1002/adma.201600560
19. Palacios-Berraquero, C. et al. Atomically thin quantum light-emitting diodes. *Nat. Commun.* 7, 12978 doi: 10.1038/ncomms12978 (2016).
20. Novoselov, K. S. et al. Two-dimensional atomic crystals. *Proc. Natl. Acad. Sci. U.S.A.* 102, 10451-3 (2005).
21. Bonaccorso, F. et al. Production and processing of graphene and 2d crystals. Mater. Today 15, 564-589 (2012).
22. Casiraghi, C. et al. Rayleigh imaging of graphene and graphene layers. *Nano Lett.* 7, 2711-2717 (2007).
23. Castellanos-Gomez, A. et al. Deterministic transfer of two-dimensional materials by all-dry viscoelastic stamping. *2D Mater.* 1, 011002 (2014).
24. Terrones, H. et al. New first order Raman-active modes in few layered transition metal dichalcogenides. *Sci. Rep.* 4, 4215 (2014).
25. Zhao, W. et al. Lattice dynamics in mono- and few-layer sheets of $WS_2$ and $WSe_2$. *Nanoscale* 5, 9677-83 (2013).
26. Zhou, B. et al. Evolution of electronic structure in Atomically Thin Sheets of $WS_2$ and $WSe_2$. *ACS Nano* 7, 791-797 (2013).
27. Kumar, S. et al. Resonant laser spectroscopy of localized excitons in monolayer $WSe_2$, *Optica*, 3, 882 (2016).
28. Wang, G. et al. Valley dynamics probed through charged and neutral exciton emission in monolayer $WSe_2$. *Phys. Rev. B* 90, (2014).
29. Kang, K. et al. High-mobility three-atom-thick semiconducting films with wafer-scale homogeneity. *Nature* 520, 656-660 (2015).
30. Ling, X. et al. Parallel Stitching of 2D Materials. *Adv. Mater.* 28, 2322-2329 (2016).
31. Grigerescu, A. E. et al. Resists for sub-20-nm electron beam lithography with a focus on HSQ: state of the art. *Nanotechnology* 20, 292001 (2009).
32. Holzwarth, C. W., Barwicz, T. & Smith, H. I. Optimization of hydrogen silsesquioxane for photonic applications. *J. Vac. Sci. Technol. B Microelectron. Nanom. Struct.* 25, 2658 (2007).

Figure 20:
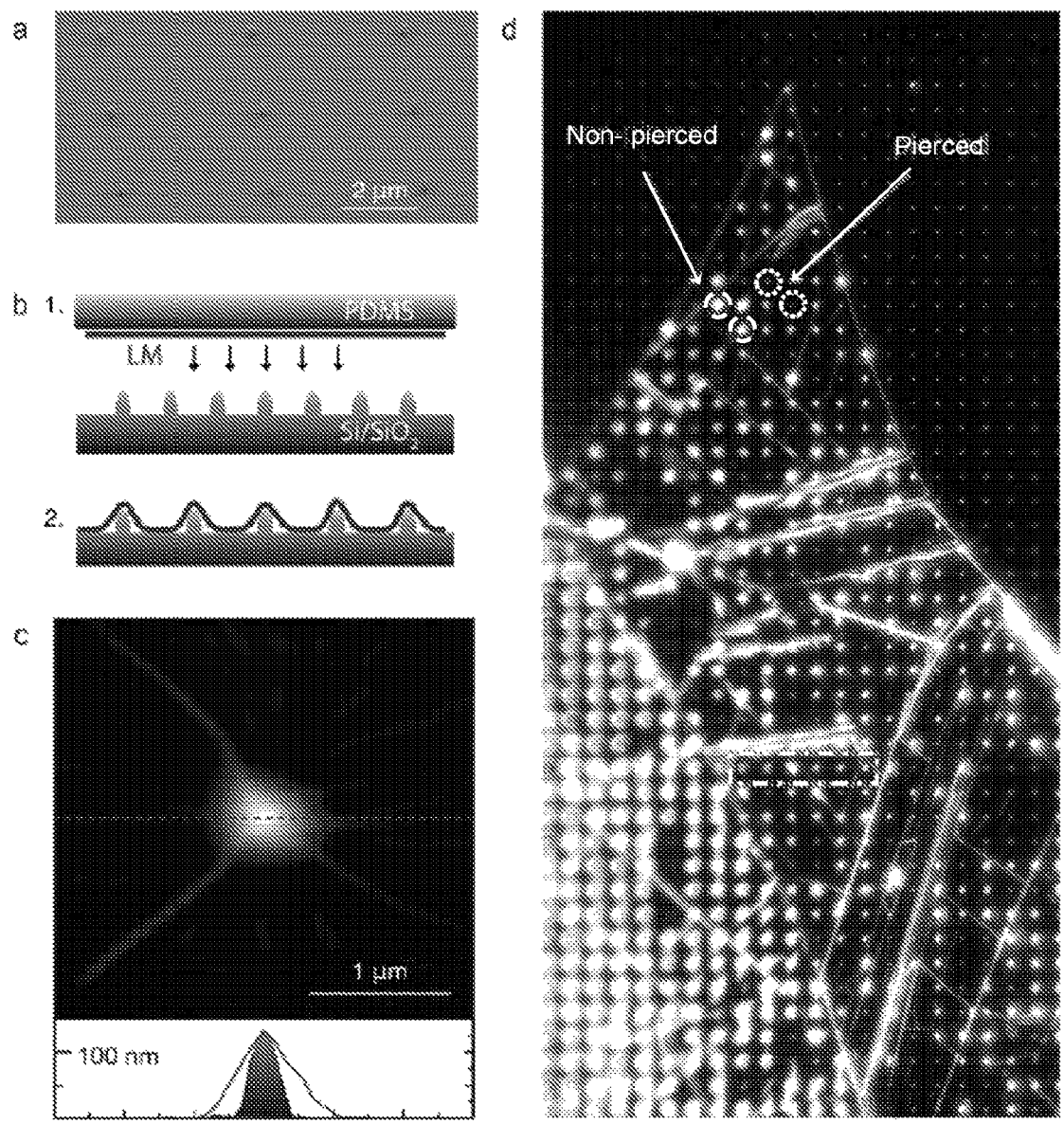
FIG. 20 shows examples of scalable quantum confinement arrays.

Further description of the FIGURES of Annex A are provided as follows:

FIG. 20: Scalable quantum confinement arrays: fabrication and characterisation. a, SEM image of nanopillar substrate, fabricated by electron beam lithography. The black scale bar is 2 µm. b., Illustration of the fabrication method: 1. Mechanical exfoliation of LM on PDMS and all-dry viscoelastic deposition on patterned substrate. 2. Deposited LM on patterned substrate. c, Top panel shows an AFM scan of 1L-$WSe_2$ on a nanopillar. Bottom panel shows the AFM height profile of a bare nanopillar (blue-shaded region) and of the flake deposited over it (pink line), measured along the dashed pink line cut in the top panel. d, Dark field optical microscopy image (real colour) of 1L-$WSe_2$ on nanopillar substrate (130 nm high, 4-µm separation). The full image corresponds to a 170-µm by 210-µm area. The green box highlights six adjacent nanopillars within the 1L-$WSe_2$ region, measured in FIG. 21 The blue circles indicate two pierced nanopillars, and the pink circles indicate two non-pierced nanopillars.

Figure 21:
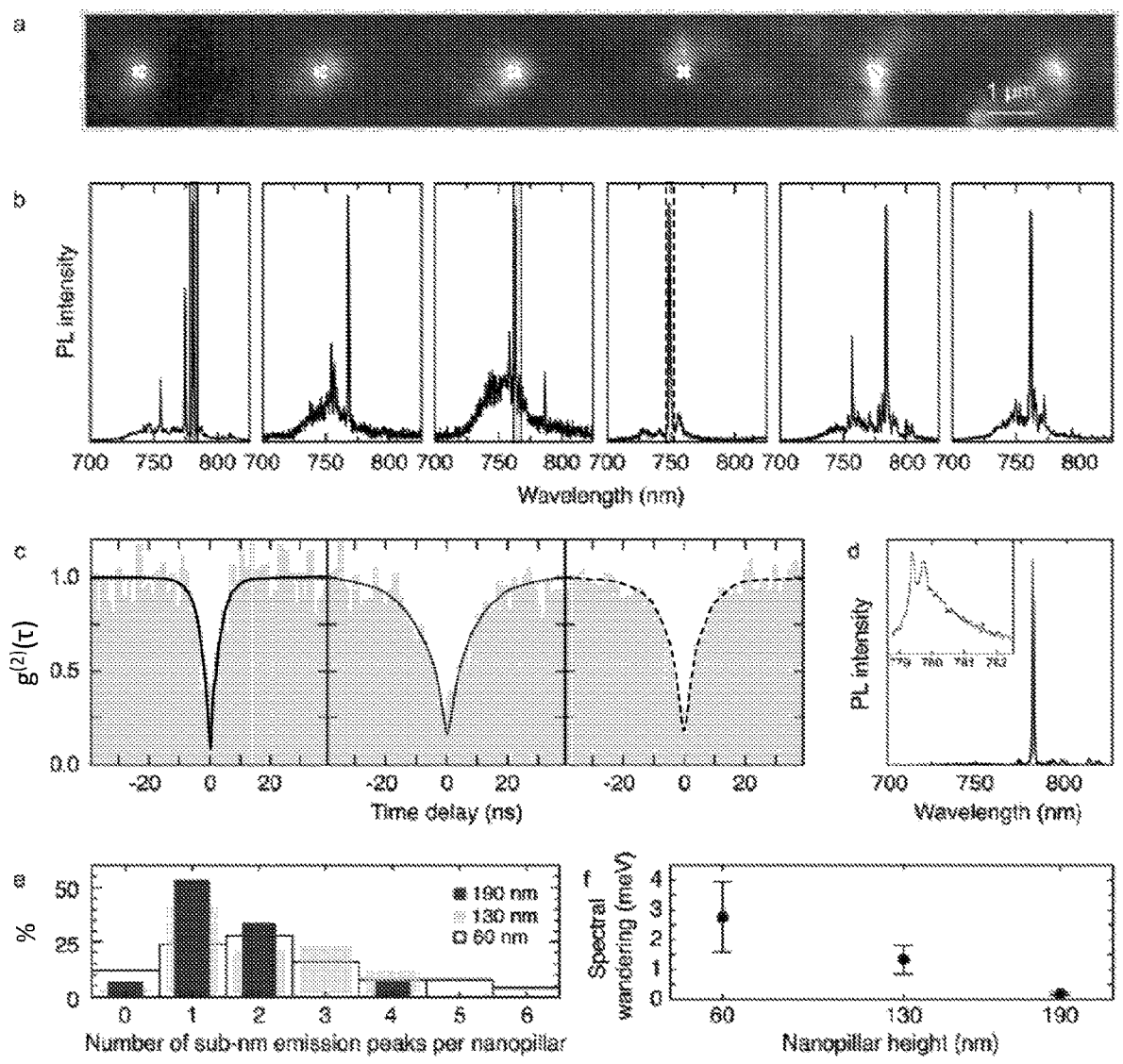
FIG. 21 shows plots of characteristics of example quantum emitter arrays in 1L-WSe$_2$.

FIG. 21: Creation of quantum emitter arrays in 1L-$WSe_2$. a, Integrated PL intensity raster scan of the region enclosed by the green rectangle in FIG. 20d, taken under 200-nW/µm², 532-nm laser excitation at 10 K. Green crosses mark the position of the six nanopillars beneath the 1L-$WSe_2$. Colour-scale bar maximum is 160 kcounts/s. b, PL spectra taken at each of the corresponding green crosses in a, from left to right respectively, showing the presence of narrow lines at each nanopillar location. c, Photon correlation measurements corresponding to the filtered spectral regions (10 nm wide) enclosed by the blue, green and pink rectangles, in panel b, with $g^{(2)}(0)=0.087\pm-0.065$, $0.17\pm0.02$ and $0.18\pm0.03$, and rise times of $8.81\pm0.80$ ns, $6.15\pm0.36$ ns and $3.08\pm0.41$ ns, respectively. d, Spectrum taken from a 1L-$WSe_2$ on a 190-nm nanopillar, showing lower background and a single sub-nm emission peak. Higher resolution spectrum in the inset reveals the fine-structure splitting of this QE peak. e, Probability distribution (in %) of the number of emission lines per nanopillar for samples using different nanopillar heights (60, 130 and 190 nm in white, blue and purple, respectively). A trend of higher probability of single QE emission peaks per nanopillar location with increasing height is evident, reaching 50% for 190-nm nanopillars. f, Increasing nanopillar height also leads to a reduction of spectral wandering. Solid black circles represent the mean value of spectral wandering of several QEs for a given nanopillar height, while the error bars represent the calculated variance of each distribution, both extracted from time-resolved high-resolution spectral measurements (see Supplementary Section 4).

Figure 22:
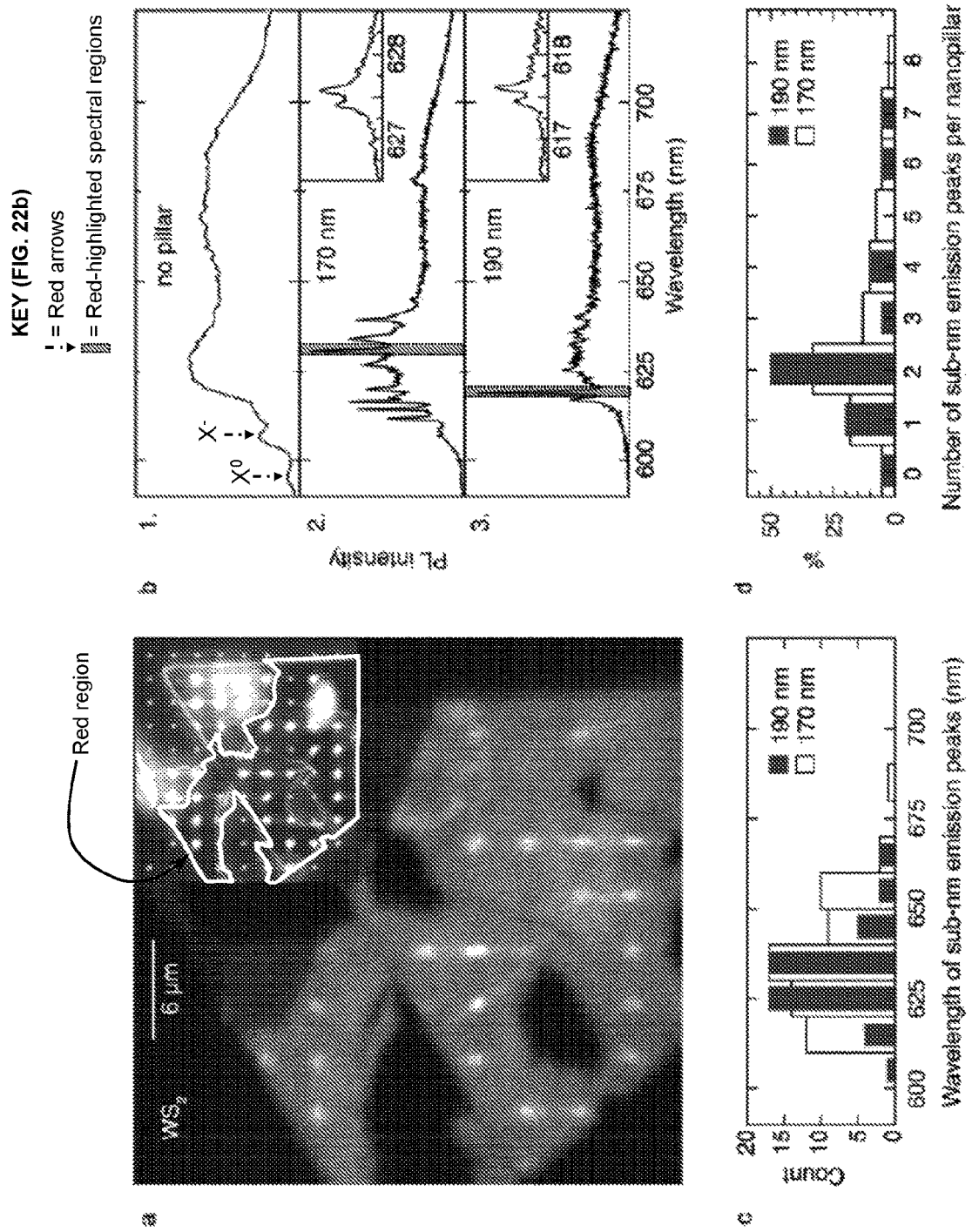
FIG. 22 shows plots of characteristics of example quantum emitter arrays in 1L-WS$_2$.

FIG. 22: Creation of quantum-emitter arrays in 1L-$WS_2$. a, Integrated PL intensity raster scan of a 1L-$WS_2$ flake deposited on top of a 3-µm spaced, 170-nm high nanopillar array, taken at 300-nW/µm², 532-nm laser excitation at 10 K. Colour-scale bar maximum is 18 kcounts/s. Inset: true-colour DFM image of the same area. The red region corresponds to the $WS_2$ monolayer. b, PL spectra of 1L-$WS_2$ at 10 K. Top panel 1 shows a spectrum taken from a flat region away from nanopillars. Red arrows indicate unbound monolayer neutral ($X^0$) and charged ($X^-$) excitons. Panels 2 and 3 show representative spectra of $WS_2$ on 170 and 190 nm nanopillars, respectively. Insets are high-resolution PL spectra of the red-highlighted spectral regions, showing the fine-structure splitting of the peaks. c, Distribution of the emission wavelengths measured for 1L-$WS_2$ QEs on 170 (black and white) and 190 nm (red) nanopillars. d, Distribution of the number of narrow emission lines observed per nanopillar for 1L-$WS_2$ QEs on 170 (black and white) and 190 nm (red) nanopillars.

Supplementary Information

This supplementary information presents additional data regarding comments made in the main text and experimental observations.

Table of Contents:
S1. Raman and PL material characterisation
S2. Piercing of flakes
S3. 1L-$WSe_2$ quantum emitter statistics
S4. 1L-$WSe_2$ spectral wandering measurements S5. Room temperature 1L-WSe$_2$ on nanopillar PL measurements
S6. 1L-WS$_2$ quantum emitter statistics
S7. 1L-WS$_2$ on 60 and 130 nm nanopillars
S8. QE creation in 1L-WSe$_2$ using nanodiamonds
S1. Raman and PL Material Characterisation Room temperature Raman and PL measurements are performed as discussed in the main text.

FIGS. 23a and 23b plot, respectively, the Raman and PL spectra of 1L-WS$_2$, as preliminarily identified by optical contrast, after transfer on the nanopillars. The Raman peaks at ~358 and ~419 cm$^{-1}$ correspond to the E' and A'$_1$ modes, respectively[1]. The separation between the two peaks is thickness-dependent[2], and increases with increasing number of layers[2]. Our value of ~61 cm$^{-1}$ indicates one-layer[2]. To further confirm this, we analyse its PL spectrum (FIG. 23b). A single peak at ~615 nm, corresponds to the neutral unbound exciton at the direct optical transition, a signature of 1L-WS$_2$[3]. We label this exciton X$^0$, following the notation used for TMDs by Ref. S4; elsewhere (e.g. in Ref. S3), the letter A is used, to distinguish it from a higher energy direct optical transition at ~520 nm (called "B") due to the spin-split valence band top.

FIGS. 23c,d (red lines) plot the Raman spectrum of 1L-WSe$_2$, as initially identified by optical contrast, after transfer on the nanopillars. For comparison we also measure in FIGS. 23c,d (bine lines) the spectrum of a 2L-WSe$_2$ flake on Si+285 nm SiO$_2$, as identified by optical contrast. FIG. 23c indicates that in the low frequency Raman region two additional peaks appear at ~17 cm$^{-1}$ and ~26 cm$^{-1}$ in 2L-WSe$_2$. The first peak, called C, is a shear mode caused by the relative motion of the layers, while the second peak is due to layer breathing modes[5,6] and can only appeal in multi-layers. In FIG. 23d, red line, the peak at ~251 cm$^{-1}$, with full-width at half maximum (FWHM) ~2 cm$^{-1}$, is assigned to the convoluted A'$_1$+E' modes[1,2], degenerate in 1L-WSe$_2$[1,2], while the peak at ~262 cm$^{-1}$ belongs to the 2LA(M) mode. Due to the A'$_1$ and E' degeneracy, we do not use the separation between peak positions as fingerprint of the number of layers. In 2L-WSe$_2$ (FIG. 23d, blue line), the A$_{1g}$ and E$_g^1$ modes are degenerate at the same position of the peak in the 1L, ~251 cm$^{-1}$, and the peak has the same FWHM, ~2 cm$^{-1}$. The position of the 2LA(M) mode instead blue shifts to ~259 cm$^{-1}$, consistent with an increasing number of layers[2]. We also note the appearance of a peak at ~309 cm$^{-1}$, corresponding to the A$_{1g}^2$ mode that emerges only in multilayer WSe$_2$[1,2]. In order to further confirm the number of layers, we analyse the PL spectrum of 1L-WSe$_2$ (FIG. 23e, red line). We identify two features, one at ~750 nm (FIG. 23e, green line), corresponding to the neutral unbound exciton X$^0$ of 1L-WSe$_2$[3,4] and a second at ~770 nm (FIG. 23e, pink line), corresponding to the negatively charged unbound exciton X$^-$ of 1L-WSe$_2$[4], as validated by its redshift of ~20 nm (the positively charged exciton would redshift ~10 nm from X$^0$ due to a smaller binding energy[4]). For reference, we compare the PL spectrum of 1L-WSe$_2$ to that of 2L-WSe$_2$ (FIG. 23e, blue line). The latter shows two components, at ~760 nm (orange line) and ~800 nm (purple line). The first corresponds to the direct optical transition, A[3], of 2L-WSe$_2$, while the second is due to its indirect optical transition, I[3].

S2. Piercing of Flakes

We use atomic force microscopy (AFM) scans to identify those flake sites that are either pierced or not pierced by the nanopillars. FIG. 24a shows one such scan, where nanopillar sites are labelled 1-3 corresponding to: 1) a bare nanopillar outside the flake area, 2) a nanopillar that has pierced the flake; and 3) a nanopillar that has not pierced the flake. FIG. 24b indicates that the naked and pierced nanopillars (1 and 2) have a very similar profile, whereas nanopillar site 3 has approximately twice the width, which we assign to the flake draping over if. We correlate the dark field microscopy (DFM) images with AFM scans. As mentioned in the main text, non-pierced pillars appeal as brighter spots in DFM due to a larger scattering area compared to the dimmer pierced sites.

S3. 1L-WSe$_2$ Quantum Emitter Statistics

We assess the effect of nanopillar height on the deterministic 1L-WSe$_2$ QEs by carrying out PL spectral measurements on 60, 130 and 190 nm nanopillars. The number of sub-nm peaks appearing per nanopillar and the measured spectral wandering show dependence on the nanopillar height, as displayed in FIG. 21e and FIG. 21f. As mentioned in the main text, the number of sub-nm peaks decreases for increasing height. FIG. 25a shows representative examples of PL spectra measured at 10 K for each nanopillar height. FIG. 25b plots the emission wavelength statistics collected for each nanopillar height, which are within the range of 730-820 nm. We carry out measurements on a total of over 80 nanopillar sites for the different nanopillar heights, observing no clear dependence of emission wavelength on nanopillar height, except a trend towards a narrower distribution of emission wavelength with increasing height. FIG. 25c shows fine structure splitting values measured for each nanopillar height. These lay within the lange 200-700 μeV. as discussed in the main text.

S4. 1L-WSe$_2$ Spectral Wandering Measurements

Figure 26:
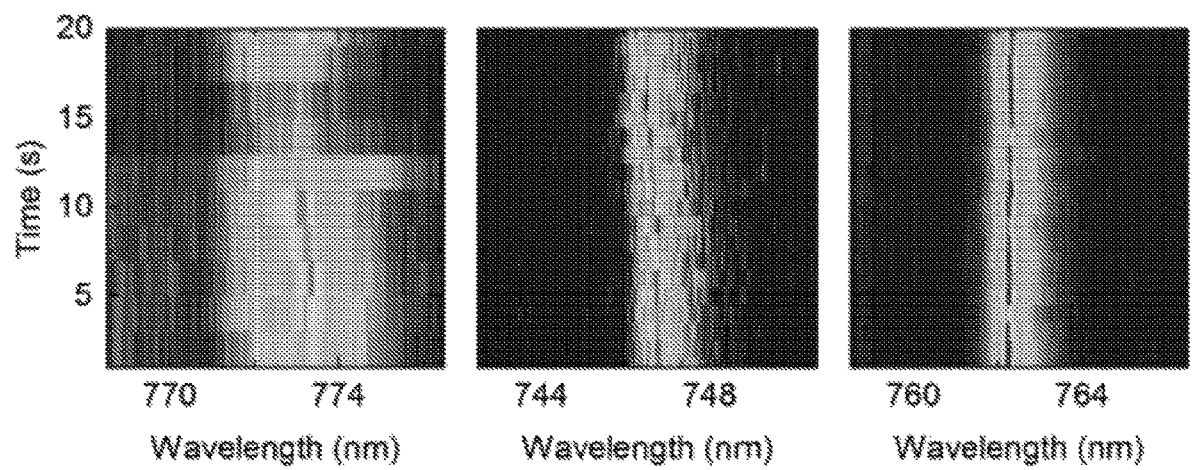
FIG. 26 shows plots to demonstrate the spectral wandering of 1L-WSe$_2$ quantum emitters as a function of nanopillar height.

Spectra of the sub-nm emission lines taken as a function of time show that QE spectral wandering decreases as the nanopillar height is increased. We show this in FIG. 21e of the main text. FIG. 26 plots examples of time resolved spectra for each nanopillar height from which we extract the spectral wandering values, measured using a high-resolution spectrometer grating (1800 gr/mm) over 20 s.

S5. Room Temperature 1L-WSe$_2$ Nanopillar PL Measurements

We observe a redshift of the X$^0$ emission peak at room temperature (RT) at the nanopillar sites, as well as an increase in APD counts over the nanopillar region. FIG. 27a shows a raster scan of integrated APD counts over one nanopillar site where several spectra have been taken across the dashed line. These spectra are shown in FIG. 27b, where a ~8 nm (15 meV) redshift can be seen. We measure redshifts from the X$^0$ peak ranging from 3 to 15 nm, with no clear nanopillar height dependence.

S6. 1L-WS$_2$ QE Statistics

We carry out PL experiments on WS$_2$ using 60, 130, 170 and 190 nm nanopillars. We find QEs for nanopillars of heights 170 nm and 190 nm. FIGS. 22c and 22d show the effect of increased nanopillar height on the QE characteristics: a reduction in the spread of emission wavelengths and a reduced distribution of number of sub-nm lines appearing per nanopillar. Representative spectra of each nanopillar height are shown in FIG. S6a, exemplifying the reduction in peak number. FIG. S6b shows spectral wandering for several QEs of both nanopillar heights, showing typically low values below 0.5 meV for 170 nm nanopillars. However, there are not enough statistics to distinguish a clear trend with nanopillar height. FIG. S6c shows statistics collected for the fine structure splitting values measured. The values measured lie within the range 200-900 μeV, overlapping those observed in WSe$_2$ QEs.

S7. 1L-WS$_2$ on 60 and 130-nm Nanopillars

Figure 29:
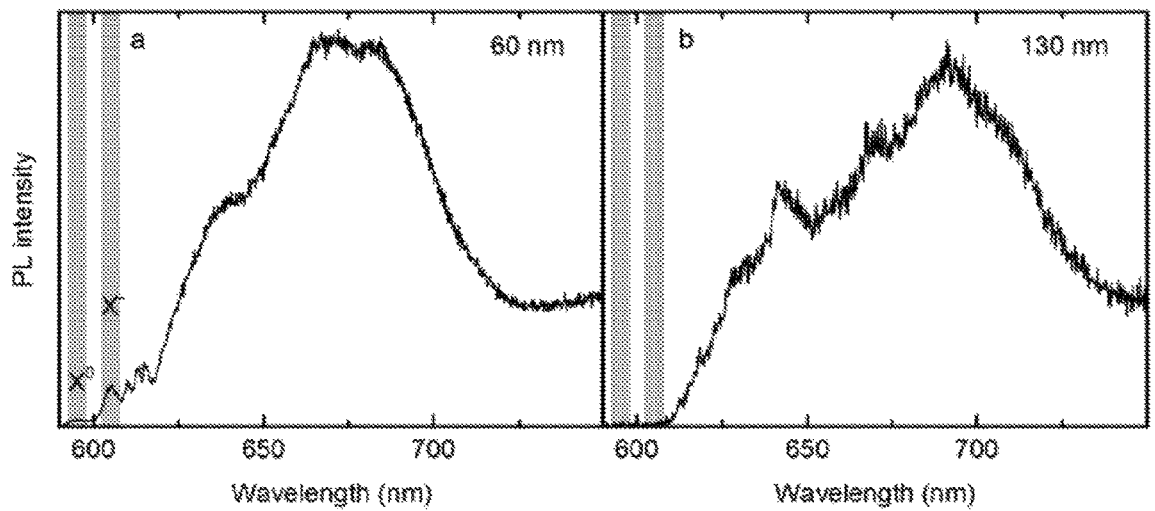
FIG. 29 shows plots of photoluminescence of 1L-WS$_2$ on short nanopillars, creating no quantum confinement.

We carry out PL measurements for 1L-WS$_2$ on 60 and 130 nm nanopillars at 10 K. As discussed in the main text, we detect QEs in 1L-WSe$_2$ on these substrates. However, we find no sub-nm lines for 1L-WS$_2$ for these pillar heights. FIG. 29 shows example spectra for each height, taken at 10 K using the same (532 nm) laser excitation. The X$^0$ and X$^-$ bands are marked in grey for comparison. The broad red-shifted background seen in these scans is a usual feature that appears in 1L-WS$_2$ at low temperature, due to weakly localised emission bands[7].

S8. QE Creation in 1L-WSe$_2$ Using Nanodiamonds

We deposit nanodiamonds milled from bulk HPHT diamond (NaBond), of average diameter 100 nm onto SiO$_2$/Si substrates. We do this via a standard drop-casting technique, whereby we suspend the nanodiamonds in ethanol and deposit a drop onto the substrate using a pipette. The drop is left on the substrate for 1 minute and then washed with de-ionised water, leaving behind only those nanodiamonds stuck to the surface of the substrate. We then place 1L-WSe$_2$ flakes on them using the same viscoelastic technique as reported in the main text. These create similar protrusions of deformations in the flake as the nanopillars, but of varying sizes owing to the size and shape dispersion of the nanodiamonds. FIG. 30a is an AFM scan of a 1L-WSe$_2$ flake on nanodiamonds. We take a height profile (shown in FIG. 30b) across the dashed line, where a nanodiamond is present under the flake. FIG. 30c shows an integrated PL raster scan of the same sample taken at 10 K. The flake is highlighted by the white lines. There is an increase in PL intensity at the nanodiamonds site, similar to the effect seen with the nanopillars. FIG. 30d shows a spectrum taken at this location, at 10 K and under 532 nm laser excitation, showing a sub-nm peak. About 20 such nanodiamonds-induced QEs were measured.

Figure 23:
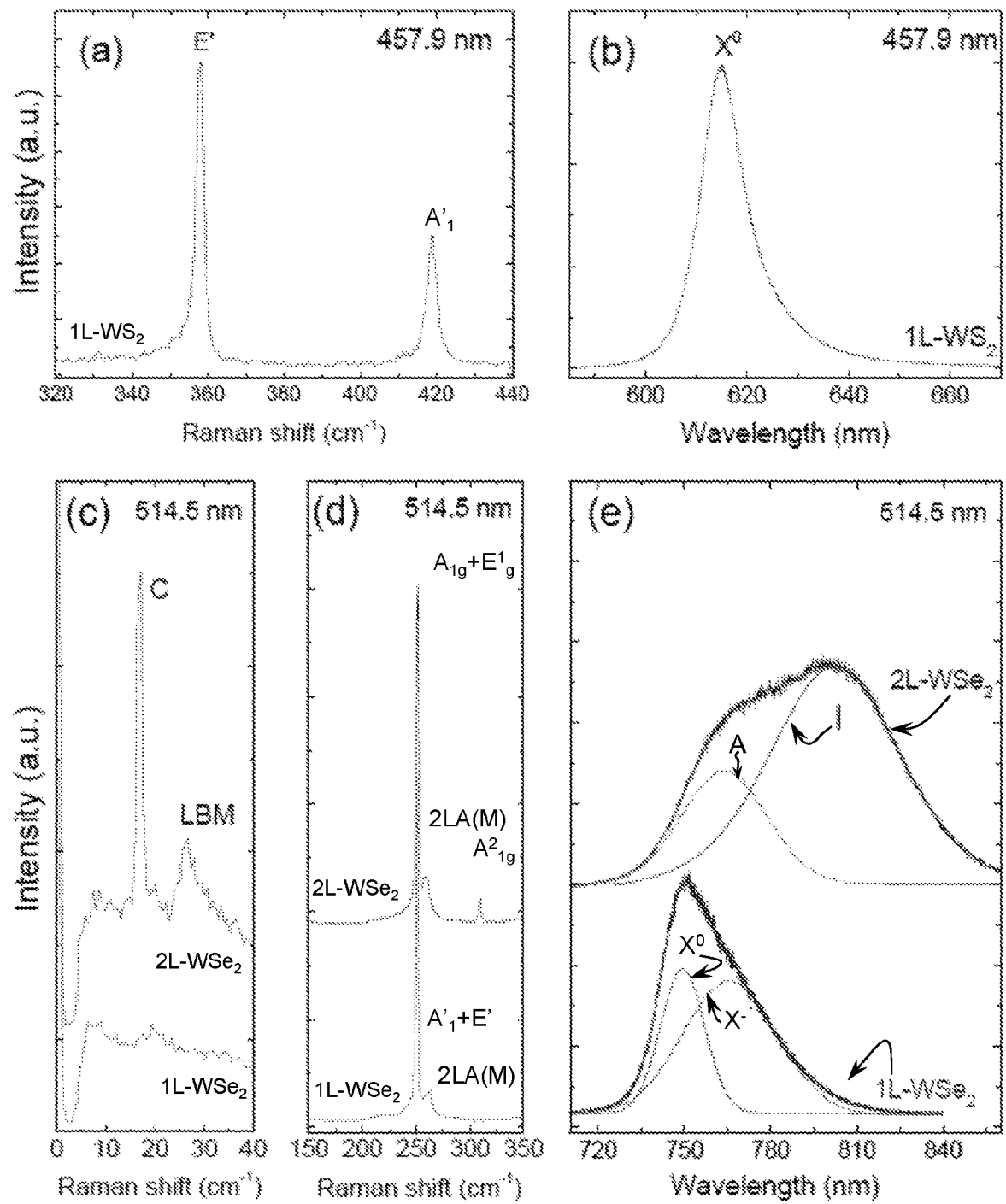
FIG. 23 shows plots demonstrating room temperature optical characterization of 1L-WS$_2$, 1L-WSe$_2$ and 2LWSe$_2$.

Further description of the FIGURES of the Supplementary Information are provided as follows:

FIG. 23: Room temperature optical characterization of 1L-WS$_2$, 1L-WSe$_2$ and 2L-WSe$_2$. (a) Raman and (b) PL spectra of 1L-WS$_2$ (black lines) after transfer on the patterned substrates; (c), (d) Raman and (e) PL spectra of 1L-WSe$_2$ (red lines) after transfer on the patterned substrates and of a reference sample of 2L-WSe$_2$ on Si/SiO$_2$ (blue line). The excitation wavelength is 514.5 nm for WSe$_2$ and 457 nm for WS$_2$.

Figure 24:
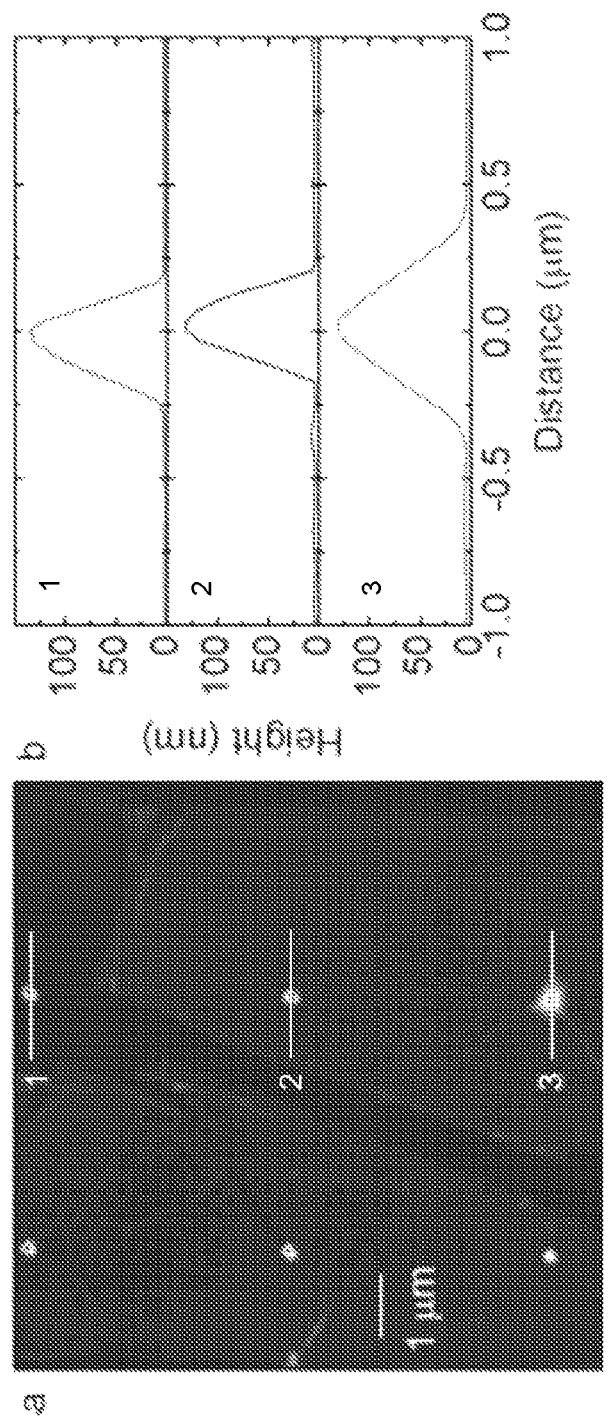
FIG. 24 shows AFM characterisation of nanopillar sites.

FIG. 24: AFM characterisation of nanopillar sites. a, AFM scan of a 1L-WSe$_2$ on 130-nm nanopillars. Colour scale maximum is 135 nm. Nanopillars are labelled: 1 (outside the flake, bare), 2 (under the flake, pierced) and 3 (under the flake, non-pierced). b, Height profiles across the lines over nanopillars 1 (pink), 2 (blue) and 3 (green). The full-width half-maximum measured for the nanopillars with no flake on top (1 and 2) are ~250 nm, while that of site 3 is ~500 nm, larger by as much as a factor ×2 due to the tenting of the flake over the nanopillar.

Figure 25:
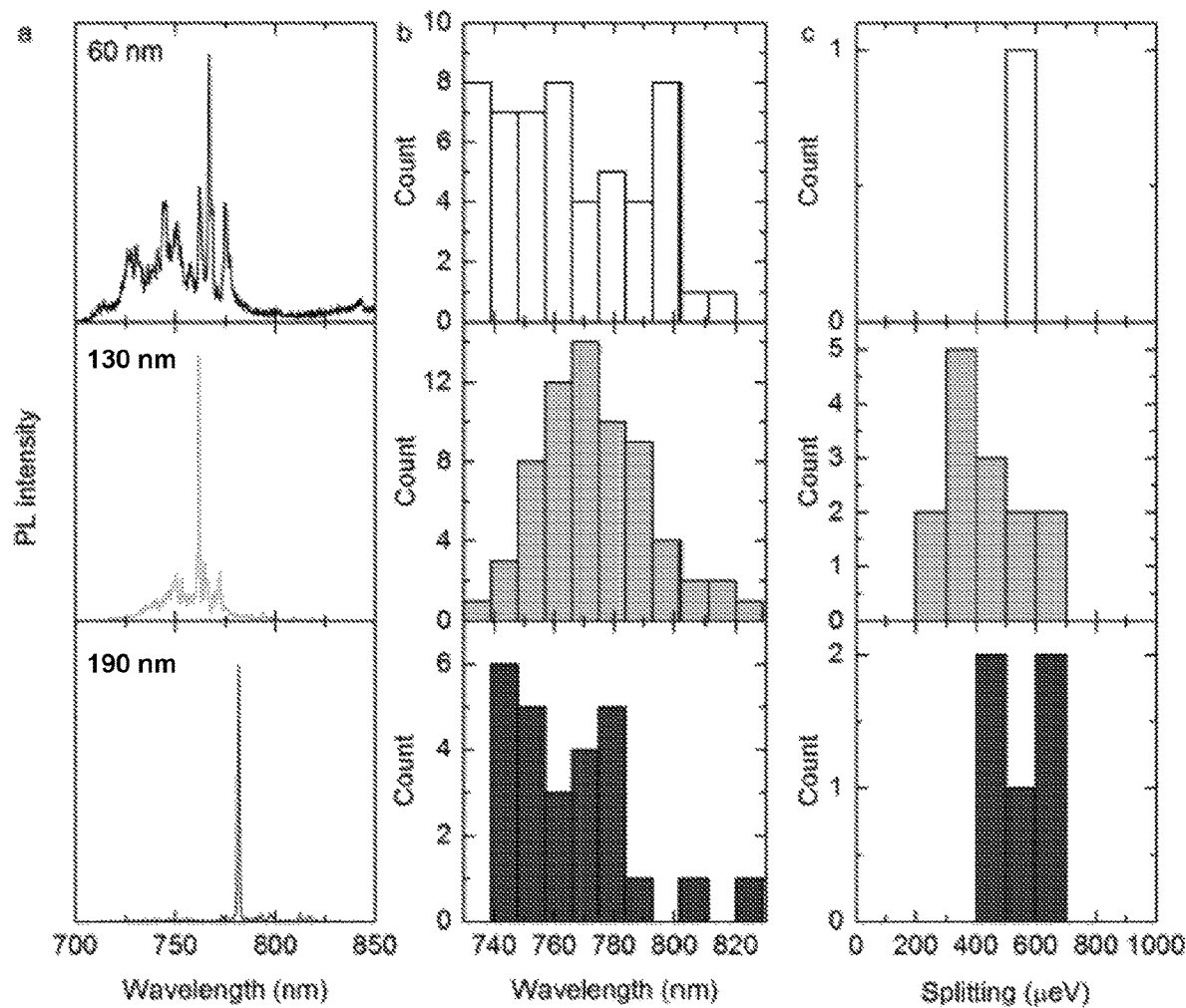
FIG. 25 shows the effect of nanopillar height on 1L-WSe$_2$ quantum emitters.

FIG. 25: Effect of nanopillar height on 1L-WSe$_2$ QEs. Statistics for QEs measured on nanopillars of heights 60 nm (black), 130 nm (cyan) and 190 nm (purple) a, Example PL spectra for the different nanopillar heights taken at 10 K. b, Histograms showing emission wavelength of all sub-nm lines studied. c, Fine structure splitting values of the 1L-WSe$_2$ QEs. We measure only one data point for the 60 nm nanopillars due to the QEs having linewidths in the range of 1 meV, generally greater than the fine structure splitting.

FIG. 26: Spectral wandering of 1L-WSe$_3$ QEs as a function of nanopillar height. High-resolution spectra at 10 K of QEs on different nanopillar heights taken over 20 s and showing a spectral window of 8 nm in each panel. The time resolution for each panel is 2, 1 and 1 s, respectively. Colour scale maxima are 45, 10 and 70 cts/s, respectively. Spectral wandering is reduced from ~1 to ~0.1 meV when going from 60 to 190-nm nanopillars.

Figure 27:
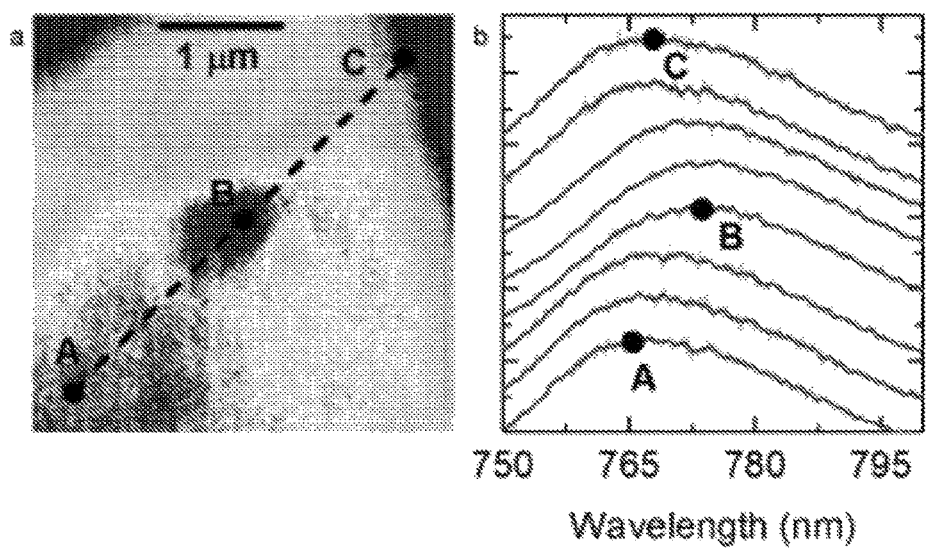
FIG. 27 shows a plot of photoluminescence of 1L-WSe$_2$ on 130 nm nanopillar; substrate.

FIG. 27: RT PL map of 1L-WSe$_3$ on 130 nm nanopillar substrate. a, Integrated PL raster scan of one nanopillar site at RT, showing an increase in PL intensity at the nanopillar site (marked as B). Colour scale maximum is 590 kcounts/sec. The dashed line indicates where the spectra shown in the right panel are taken, with the first (A), central (B) and final (C) positions marked. b, RT spectra taken along the dashed line in a, showing an X$^0$ redshift of ~8 nm (15 meV).

Figure 28:
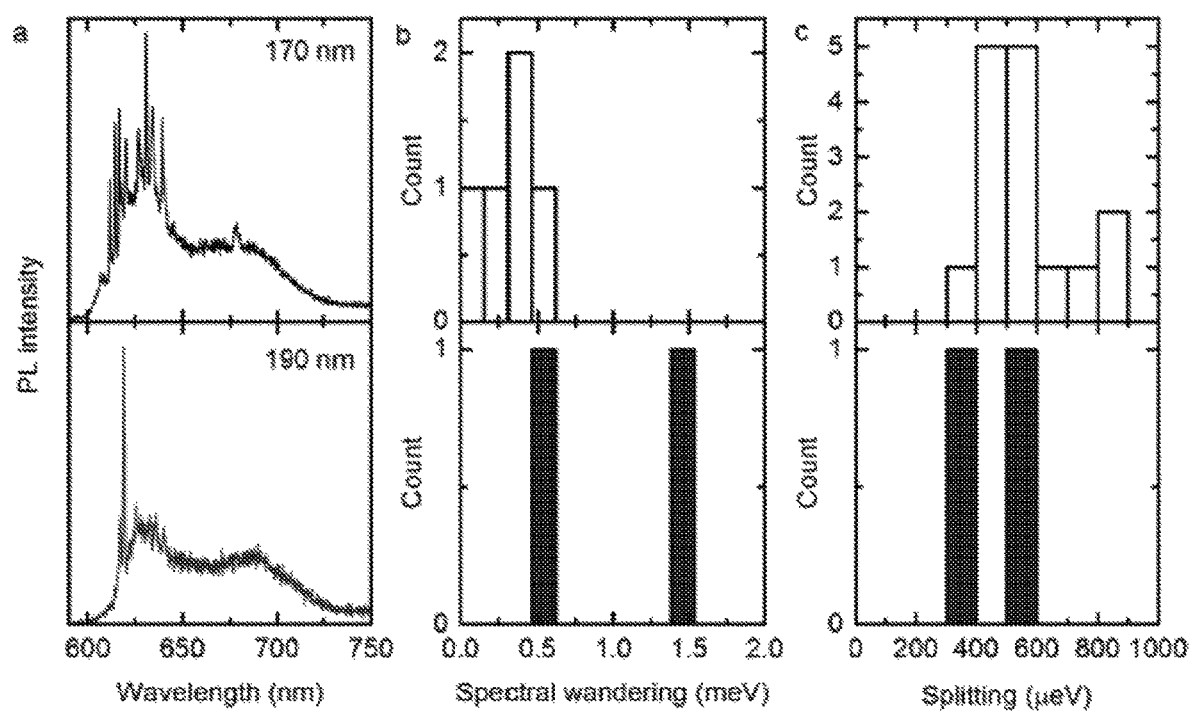
FIG. 28 shows the effect of nanopillar height on 1L-WS$_2$ quantum emitters.

FIG. 28: Effect of nanopillar height on 1L-WS$_2$ QEs. PL Measurements taken at 10K. Data is shown in black for 170-nm nanopillars, and in purple for 190-nm nanopillars. a, Representative spectra taken at each nanopillar height, showing a reduction in the number of sub-nm lines with nanopillar height. b, Spectral wandering measurements taken as a function of nanopillar height, showing low spectral wandering but no clear trend as a function of height. c, Fine structure splitting values, previously unreported for QEs, and lying in the same range as those values observed for WSe$_2$ QEs.

FIG. 29: 1L-WS$_2$ on short nanopillars creating no quantum confinement. Spectra taken at nanopillar sites on 1L-WS$_2$, at 10 K on a, 60-nm and b, 130-nm nanopillars. No sub-nm peaks are observed. The broad shoulders correspond to the weakly localised emission observed in WS$_2$ at low temperatures, in regions both over nanopillars and in flats areas.

Figure 30:
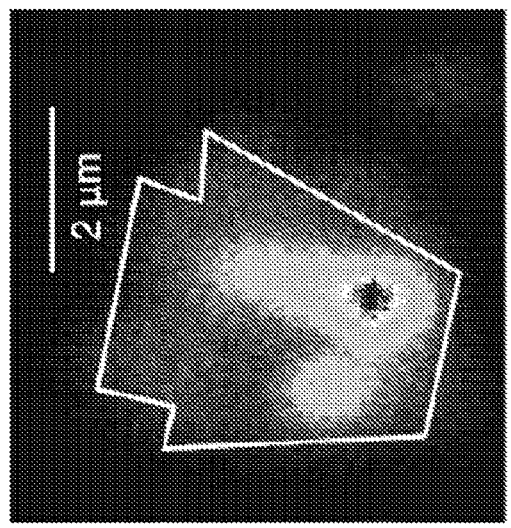
FIG. 30 shows nanodiamond substrates for quantum emitter creation.
Figure 30:
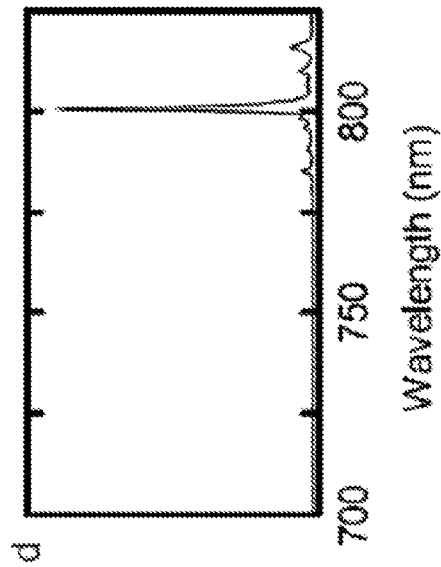
Figure 30:
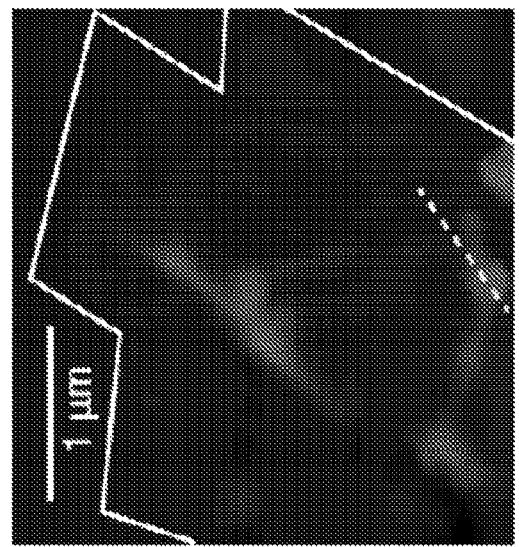
Figure 30:
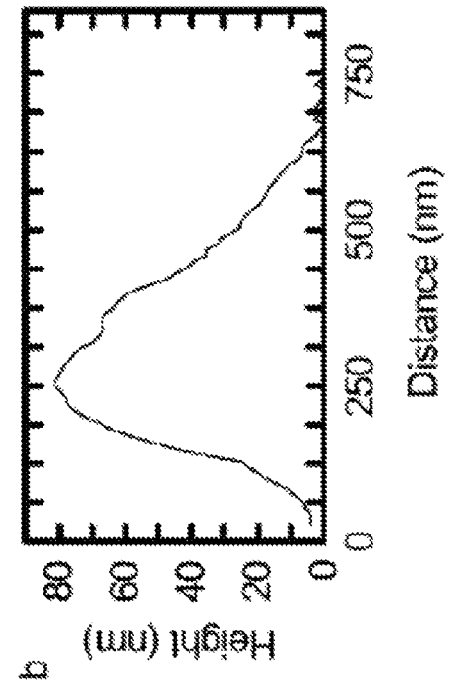

FIG. 30: Nanodiamond substrates for QE creation. a, AFM scan showing 1L-WSe$_2$ on a silica substrate with drop-casted nanodiamonds. The elevated regions of the flake are caused by nanodiamonds below. b, Height profile at the nanodiamond site taken along the white dashed line in a. c, Raster scan of integrated PL at 10 K of the same 1L-WSe$_2$ as shown in a. Colour scale maximum is 43 kcounts/s, and corresponds to the nanodiamond site in b. d, PL emission at 10 K from the same nanodiamond region as shown in a and c.

SUPPLEMENTARY REFERENCES

1. Terrones, H. et al. New first order Raman-active modes in few layered transition metal dichalcogenides. *Sci. Rep* 4, 4215 (2014).
2. Zhao, W. et al. Lattice dynamics in mono- and few-layer sheets of WS2 and WSe2. *Nanoscale* 5, 9677-83 (2013).
3. Zhou, B. et al. Evolution of electronic structure in Atomically Thin Sheets of WS2 and WSe2. *ACS Nano* 7, 791-797 (2013).
4. Jones, A. M. et al. Optical generation of excitonic valley coherence in monolayer WSe2. *Nat. Nanotechnol.* 8, 634-638 (2013).
5. Zhang, X. et al. Raman spectroscopy of shear and layer breathing modes in multilayer MoS 2. *Phys. Rev. B* 87, 115413 (2013).
6. Wu, J.-B. et al. Interface Coupling in Twisted Multilayer Graphene by Resonant Raman Spectroscopy of Layer Breathing Modes. *ACS Nano* 9, 7440-7449 (2015).
7. Palacios-Berraquero, C. et al. Atomically thin quantum light-emitting diodes. *Nat. Commun.* 7, 12978 doi: 10.1038/ncomms12978 (2016).

The invention claimed is:

1. A quantum-confined device, comprising:
   a substrate having at least one protrusion arranged thereupon; and
   a layer of a two-dimensional material,
   wherein the layer of the two-dimensional material is arranged on the substrate and the at least one protrusion, the at least one protrusion causing localised strain in the layer of the two-dimensional material to form a quantum dot or a quantum wire at a region of localised strain.

2. The device of claim 1, wherein the layer of the two-dimensional material is an exfoliated flake of the two-dimensional material or is a grown or deposited thin film of the two-dimensional material.

3. The device of claim 1, wherein the at least one protrusion has a length and a width in a plane parallel to the substrate, wherein the length and the width have a ratio of less than two, and the region of localised strain forms a quantum dot.

4. The device of claim 3, wherein the at least one protrusion comprises at least one of a column, a pillar, a pyramid or a cone, and wherein the at least one protrusion has a cross-sectional shape in the plane parallel to the substrate from at least one of the following group: circular, rectangular, square, hexagonal, polygonal.

5. The device of claim 1, wherein the at least one protrusion comprises at least one ridge, and the region of localised strain forms a quantum wire.

6. The device of claim 1, wherein a height of the at least one protrusion is less than 1 µm.

7. The device of any of claim 1, wherein the at least one protrusion arranged on the substrate comprises an arrangement of at least one nanocrystal on the surface of the substrate.

8. The device of any of claim 1, wherein the at least one protrusion arranged on the substrate comprises at least one protrusion formed by patterning on a surface of the substrate.

9. The device of claim 1, further comprising an epitaxial layer formed on the substrate, the at least one protrusion arranged on the epitaxial layer.

10. The device of claim 9, wherein the at least one protrusion comprises an arrangement of at least one nanocrystal on the surface of the epitaxial layer or comprises at least one protrusion patterned in the epitaxial layer.

11. The device of claim 1, wherein the at least one protrusion comprises an array of protrusions forming an array of quantum dots and/or an array of quantum wires.

12. The device of claim 1, wherein the device forms a quantum dot based light emitter or a quantum emitter.

13. The device of claim 12, wherein the emitter is a single photon source.

14. The device of claim 1, wherein each monolayer of the two-dimensional material has an inherently two-dimensional crystalline structure.

15. The device of claim 1, wherein the layer of the two-dimensional material is formed from at least one monolayer of a two-dimensional material, each monolayer of the two-dimensional material having a two-dimensional crystalline structure in which atoms are chemically bonded only within a plane of each monolayer or sheet.

16. A quantum emitter device, comprising:
    a substrate having at least one protrusion arranged thereupon; and
    a layer of a two-dimensional material,
    wherein the layer of the two-dimensional material is arranged on the substrate and the at least one protrusion, the at least one protrusion causing localised strain in the layer of the two-dimensional material to form a quantum emitter at regions of localised strain.

17. A method of manufacturing a quantum-confined device, comprising:
    providing a substrate;
    forming at least one protrusion on the substrate;
    arranging on the substrate and the at least one protrusion a layer of a two-dimensional material, the at least one protrusion causing localised strain in the layer of the two-dimensional material to form a quantum dot or a quantum wire at the region of localised strain.

18. The method of claim 17, further comprising exfoliating a flake of the two-dimensional semiconductor material, and wherein arranging the layer of the two-dimensional semiconductor material comprises arranging the exfoliated flake on the substrate and the at least one protrusion.

19. The method of claim 17, wherein arranging the layer of the two-dimensional semiconductor material comprises growing or depositing a thin film of the two-dimensional material.

20. The method of claim 17, wherein forming the at least one protrusion comprises arranging at least one nanocrystal on the surface of the substrate, or comprises forming an etched pattern in the surface at the substrate.

* * * * *

UNITED STATES PATENT AND TRADEMARK OFFICE
CERTIFICATE OF CORRECTION

Page 1 of 1

PATENT NO. : 10,700,238 B2
APPLICATION NO. : 16/318269
DATED : June 30, 2020
INVENTOR(S) : Mete Atature et al.

It is certified that error appears in the above-identified patent and that said Letters Patent is hereby corrected as shown below:

On the Title Page

Item (30), Foreign Application Priority Data:
Please delete the incorrect priority date of GB1612419 "Jul. 18, 2017" and insert --Jul. 18, 2016--.

Signed and Sealed this
Sixth Day of October, 2020

Andrei Iancu
*Director of the United States Patent and Trademark Office*